(12) United States Patent
Ikram et al.

(10) Patent No.: US 7,853,154 B2
(45) Date of Patent: Dec. 14, 2010

(54) BIAS CIRCUIT FOR BURST-MODE/TDM SYSTEMS WITH POWER SAVE FEATURE

(75) Inventors: Quazi Ikram, Irvine, CA (US);
Cristiano Bazzani, Irvine, CA (US);
Daniel Draper, Portland, OR (US);
Maurice M. Reintjes, Beaverton, OR (US)

(73) Assignee: Mindspeed Technologies, Inc., Newport Beach, CA (US)

( * ) Notice: Subject to any disclaimer, the term of this patent is extended or adjusted under 35 U.S.C. 154(b) by 879 days.

(21) Appl. No.: 11/653,110

(22) Filed: Jan. 12, 2007

(65) Prior Publication Data
US 2007/0286609 A1    Dec. 13, 2007

Related U.S. Application Data

(60) Provisional application No. 60/758,745, filed on Jan. 13, 2006.

(51) Int. Cl.
*H04B 10/04* (2006.01)
*H01S 3/00* (2006.01)

(52) U.S. Cl. .............. 398/192; 398/182; 372/38.02; 372/38.07

(58) Field of Classification Search ............. 398/182, 398/192; 372/38.02, 38.07
See application file for complete search history.

(56) References Cited

U.S. PATENT DOCUMENTS

| | | | |
|---|---|---|---|
| 4,534,064 A | 8/1985 | Giacometti et al. | |
| 4,709,416 A * | 11/1987 | Patterson | ............. 398/197 |
| 5,019,769 A | 5/1991 | Levinson | |
| 5,383,046 A | 1/1995 | Tomofuji et al. | |
| 5,383,208 A | 1/1995 | Queniat et al. | |
| 5,394,416 A | 2/1995 | Ries | |
| 5,396,059 A | 3/1995 | Yeates | |
| 5,594,748 A | 1/1997 | Jabr | |
| 5,812,572 A | 9/1998 | King et al. | |
| 5,844,928 A | 12/1998 | Shastri et al. | |
| 5,900,959 A | 5/1999 | Noda et al. | |
| 5,956,168 A | 9/1999 | Levinson et al. | |
| 6,108,113 A | 8/2000 | Fee | |
| 6,111,687 A | 8/2000 | Tammela | |
| 6,282,017 B1 | 8/2001 | Kinoshita | |
| 6,333,895 B1 * | 12/2001 | Hamamoto et al. | ....... 365/233.1 |
| 6,366,373 B1 | 4/2002 | MacKinnon et al. | |
| 6,452,719 B2 | 9/2002 | Kinoshita | |
| 6,494,370 B1 | 12/2002 | Sanchez | |
| 6,556,601 B2 | 4/2003 | Nagata | |
| 6,661,940 B2 | 12/2003 | Kim | |
| 6,707,600 B1 | 3/2004 | Dijaili et al. | |

(Continued)

*Primary Examiner*—Nathan M Curs
(74) *Attorney, Agent, or Firm*—Weide & Miller, Ltd.

(57) ABSTRACT

An optic signal transmit system and biasing method and apparatus and system is disclosed to reduce power consumption during non-transmit periods. An optic signal generator receives a bias signal and an outgoing signal. A burst/transmit enable signal enables the transmit system into transmit mode, such as during a transmit window in a time multiplexed environment such as PON networks. A bias circuit biases the driver and/or optic signal generator. To realize power savings, the bias circuit includes one or more stages which are selectively enabled to adequately bias the driver and optic signal generator during transmit windows but disabled during periods when the system is not transmitting. The bias circuit may comprise a current mirror with a reference device, a fixed device, and switched device, which is selectively included in the circuit by a bias switch. The bias switch is responsive to a burst/transmit enable signal or a signal related thereto.

18 Claims, 31 Drawing Sheets

U.S. PATENT DOCUMENTS

| | | |
|---|---|---|
| 6,740,864 B1 | 5/2004 | Dries |
| 6,801,555 B1 | 10/2004 | DiJaili et al. |
| 6,837,625 B2 | 1/2005 | Schott et al. |
| 6,852,966 B1 | 2/2005 | Douma et al. |
| 6,868,104 B2 | 3/2005 | Stewart et al. |
| 6,888,123 B2 | 5/2005 | Douma et al. |
| 6,941,077 B2 | 9/2005 | Aronson et al. |
| 6,952,531 B2 | 10/2005 | Aronson et al. |
| 6,956,643 B2 | 10/2005 | Farr et al. |
| 6,957,021 B2 | 10/2005 | Aronson et al. |
| 6,967,320 B2 | 11/2005 | Chieng et al. |
| 7,005,901 B1 * | 2/2006 | Jiang et al. ................ 327/130 |
| 7,031,574 B2 | 4/2006 | Huang et al. |
| 7,039,082 B2 | 5/2006 | Stewart et al. |
| 7,050,720 B2 | 5/2006 | Aronson et al. |
| 7,058,310 B2 | 6/2006 | Aronson et al. |
| 7,066,746 B1 | 6/2006 | Togami et al. |
| 7,079,775 B2 | 7/2006 | Aronson et al. |
| 2004/0047635 A1 | 3/2004 | Aronson et al. |
| 2004/0136727 A1 | 7/2004 | Androni et al. |
| 2005/0215090 A1 | 9/2005 | Harwood |
| 2006/0239308 A1 * | 10/2006 | Husain et al. .......... 372/29.013 |

* cited by examiner

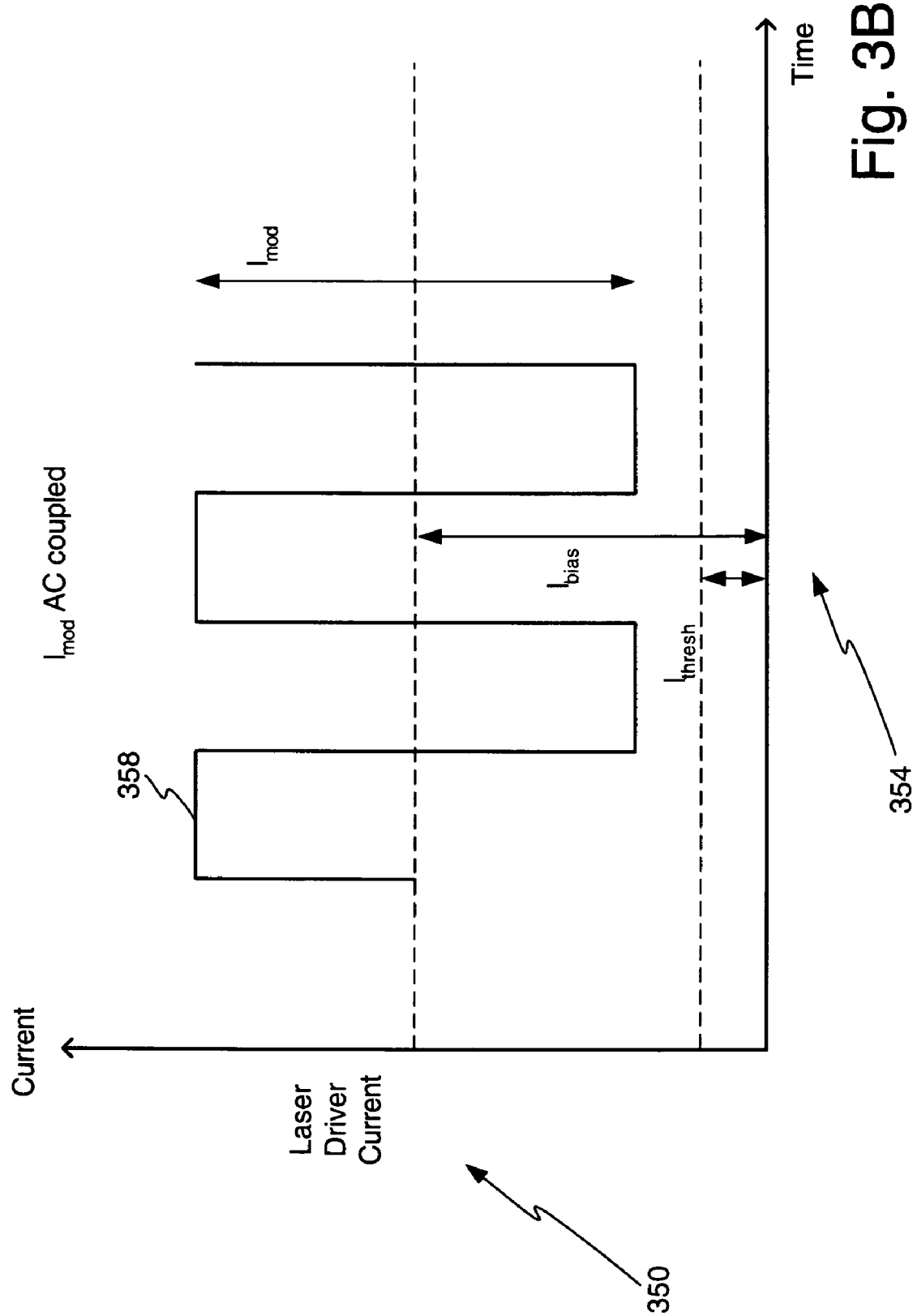

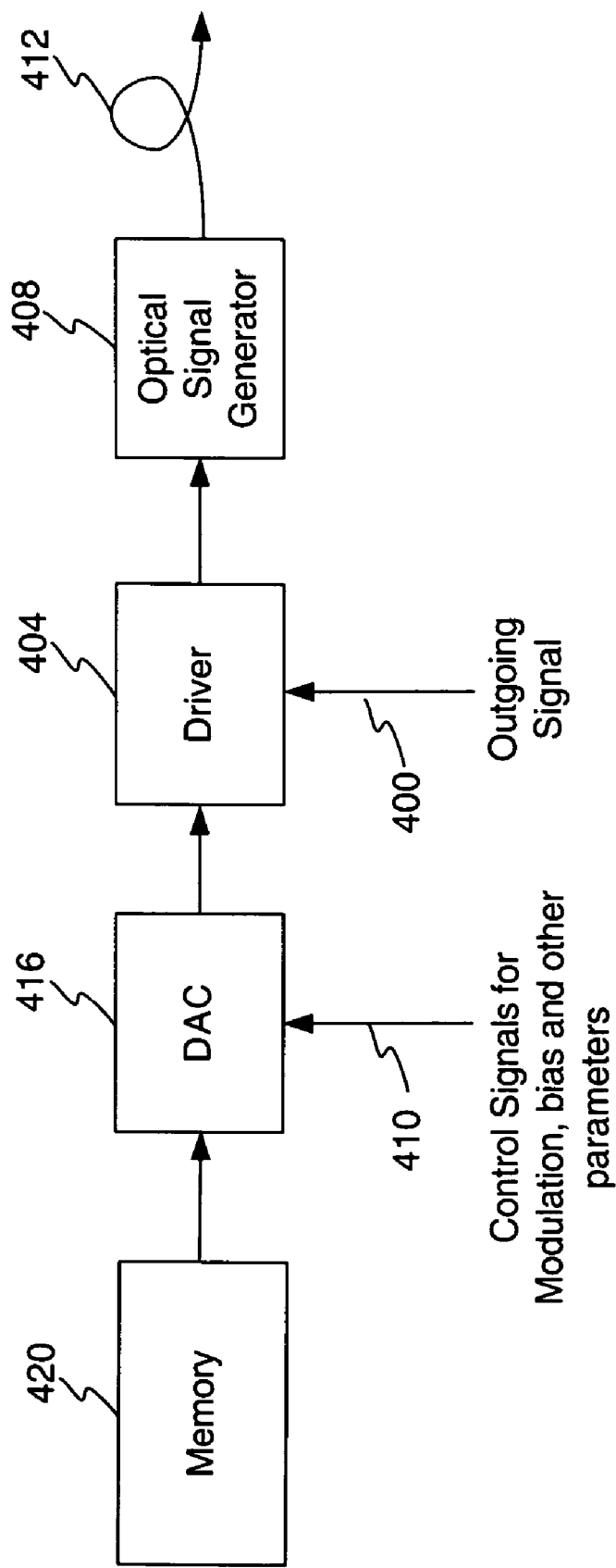

BIAS CIRCUIT FOR BURST-MODE/TDM SYSTEMS WITH POWER SAVE FEATURE

PRIORITY CLAIM

This application claims priority to Provisional Patent Application No. 60/785,745 entitled Bias Circuit for Burst-Mode/TDM Systems Laser Driver with Power-Save During Burst-Off and Improved Burst-Off Current Control which was filed Jan. 13, 2006.

FIELD OF THE INVENTION

The invention relates to optical signal generator output control and, in particular, to a method and apparatus for controlling optical signal generator output based on environmental or other factors.

RELATED ART

Many modern electronic devices and systems utilize optical signals to achieve desired operation. Examples of such devices include fiber optic communication systems, optical media read and write devices in computer and home entertainment systems, such as CD players and DVD players, and other devices that utilize a laser, photodiode, or other optical device.

As can be appreciated, these devices require highly precise operation and, with each generation of a product, a higher level of accuracy may be required to meet increasing demands in speed, storage capability, or data rate. Adding to the operational requirements, the environments in which such devices are required to operate are also subject to great variation. Optic devices, such as a laser transmitter or photodiodes have moved out of the laboratory and into everyday environments. Examples include optical communication systems, which may operate in remote locations or small and crowded equipment rooms and computer rooms, optical media readers found in automobiles and home environments, as well as optical systems in remote industrial applications which are remote and difficult to reach.

The varying environmental aspects of these varying locations present numerous hurdles for accurate device operation. One such hurdle is that device operation may be affected by temperature variation. Thus, as the environmental temperature changes, so do device operational parameters. Thus, the temperature change may cause the device to not meet specification and result in errors, reduced payload data throughput, or both. In some instances, the device may become inoperable. As can be appreciated, this is a serious drawback to device operation.

Other factors may affect the device operation in a similar manner. One such factor is the age of the device or the age of the components in the device. Over time, component behavior may vary and this variance my result in operation that does not meet specification.

The method and apparatus disclosed herein overcomes these drawbacks of the prior art and provides additional advantages as will be appreciated after reading the specification which follows in connection with the figures.

SUMMARY

To overcome the drawbacks of the prior art, a method and apparatus is disclosed for optic signal power control to maintain a desired or optimum optic signal power level. During start-up, a default or target power value from memory may be utilized to bias or otherwise control operation of an optic signal generator or driver. It is further contemplated that the photodetector current or optic signal generator current may be monitored, such as in a closed loop feedback system to control the power level of the optic signal. In one configuration, one or more peak values of the actual optic signal, or a portion thereof, are detected and processed to generate the compensation signal.

In one embodiment an optic signal control system for use with an optic module is provided that comprises a memory configured to store a bias target value and a modulation target value. A driver is configured to process an outgoing signal based on the bias target value and the modulation target value to generate a drive signal. Also part of this system is an optic signal generator configured to receive the drive signal and generate an optic signal representative of the outgoing signal based on the bias target value and the modulation target value. A monitor is configured to monitor one or more aspects of the optic module and generate monitor output signal while a controller is configured to receive the monitor output signal and generate a bias control signal, or a modulation control signal, both, or neither. These signals may modify the bias target value and the modulation target value.

This system may, further comprise at least one junction configured to combine the bias target value with the bias control signal and at least one junction configured to combine the modulation target value with the modulation control signal. One aspect that may be monitored is the temperature. In addition, the controller may be configured to maintain a bias level and a modulation level of the optic signal at a constant level over time. As a benefit to this system, the controller may comprise one or more controllers capable of independently adjusting both bias level and modulation level of the drive signal to maintain or optimize the optic signal.

Also disclosed is a method for controlling and an optic module to maintain a desired optic signal intensity. This method may comprise monitoring one or more parameters of the optic module or optic signal and responsive to the monitoring, generating a bias control signal, a modulation control signal, or both. Thereafter, optionally modifying a default bias value based on the bias control signal to create a processed bias signal and optionally modifying a default modulation value based on the modulation control signal to create a processed modulation signal. Then providing the processed bias signal and the processed modulation signal to a driver and processing an outgoing signal with the driver based on the processed bias signal and the processed modulation signal to thereby account for changes in the one or more parameters.

This method may also comprise monitoring temperature, time of operation of the optic module, the optic signal to detect a bias level, a modulation level, or both of the optic signal. In one embodiment the default modulation value and the default bias value is stored in a memory in the optic module. This method may further comprise generating a driver output signal generating an optic signal representative of the outgoing signal based on the driver output signal. It is further contemplated that either or both of the processed modulation signal and processed bias signal may be dynamically changed during operation. Thus, in one embodiment modifying a default bias value and modifying the default modulation value occurs if the monitoring reveals that one or more aspects of an optic signal has changed.

Also disclosed and contemplated herein is a transceiver configured to control and maintain one or more aspects of a transmitted optic signal. In one embodiment, this transceiver comprises an optical receiver comprising an optical detector and one or more amplifiers configured to convert an optical signal into an amplified electrical received signal. Also part of the transceiver is an optic transmitter comprising an optic signal generator configured to convert an electrical signal to an optical signal, wherein one or more parameters of the optical signal are determined by one or more control values. In this embodiment, a driver is configured to provide one or more drive signals to the optic signal generator, the one or more drive signals based on one or more control values. A memory and control system may also be provided. The memory may be configured to store one or more default control values such that, the one or more default control values are selected to control the power level of the optic signal. The control system may be configured to monitor one or more aspects of the optic module or the optic signal generated by the optic signal generator, and generate one or more of a bias control signal and a modulation control signal to thereby modify the one or more default control values to thereby create the one or more control values.

It is contemplated that the control system may be configured to simultaneously change the bias control signal and the modulation control signal. The one or more control values may comprise a bias control value and a modulation control value. The control system monitors may be configured to monitor one or more of the following: Temperature, time of operation for the optic transmitter, optic signal bias level, optic signal modulation level, optic signal average power level, optic signal peak level, and driver current. In embodiment the system further comprises a first summing junction configured to combine a default bias value with the bias control signal and a second summing junction to combine a default modulation level with the modulation control signal. In addition, the control system may further comprise a comparator configured to compare a default monitor value, stored in the memory, to a monitored value, to determine if a monitored value has changed.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the accompanying claims.

BRIEF DESCRIPTION OF THE DRAWINGS

The components in the figures are not necessarily to scale, emphasis is instead placed upon illustrating the principles of the invention. In the figures, like reference numerals designate corresponding parts throughout the different views.

FIG. 3B illustrates an example plot of AC coupled driver current.

FIG. 4 illustrates a block diagram of an example embodiment of an open loop power control system.

DETAILED DESCRIPTION

The method and apparatus disclosed herein overcomes the drawbacks of the prior art and provides additional advantages, features, and benefits. In general, an optical communication system is described herein as an example environment for the method and apparatus described herein. Although described in connection with an optical communication system, other environments that would benefit from the methods and apparatus described herein, such as, but are not limited to, optical media drives, laser surgery equipment, laser welding, free-space optical links and any other environment that utilizes an optical device.

Figure 1:
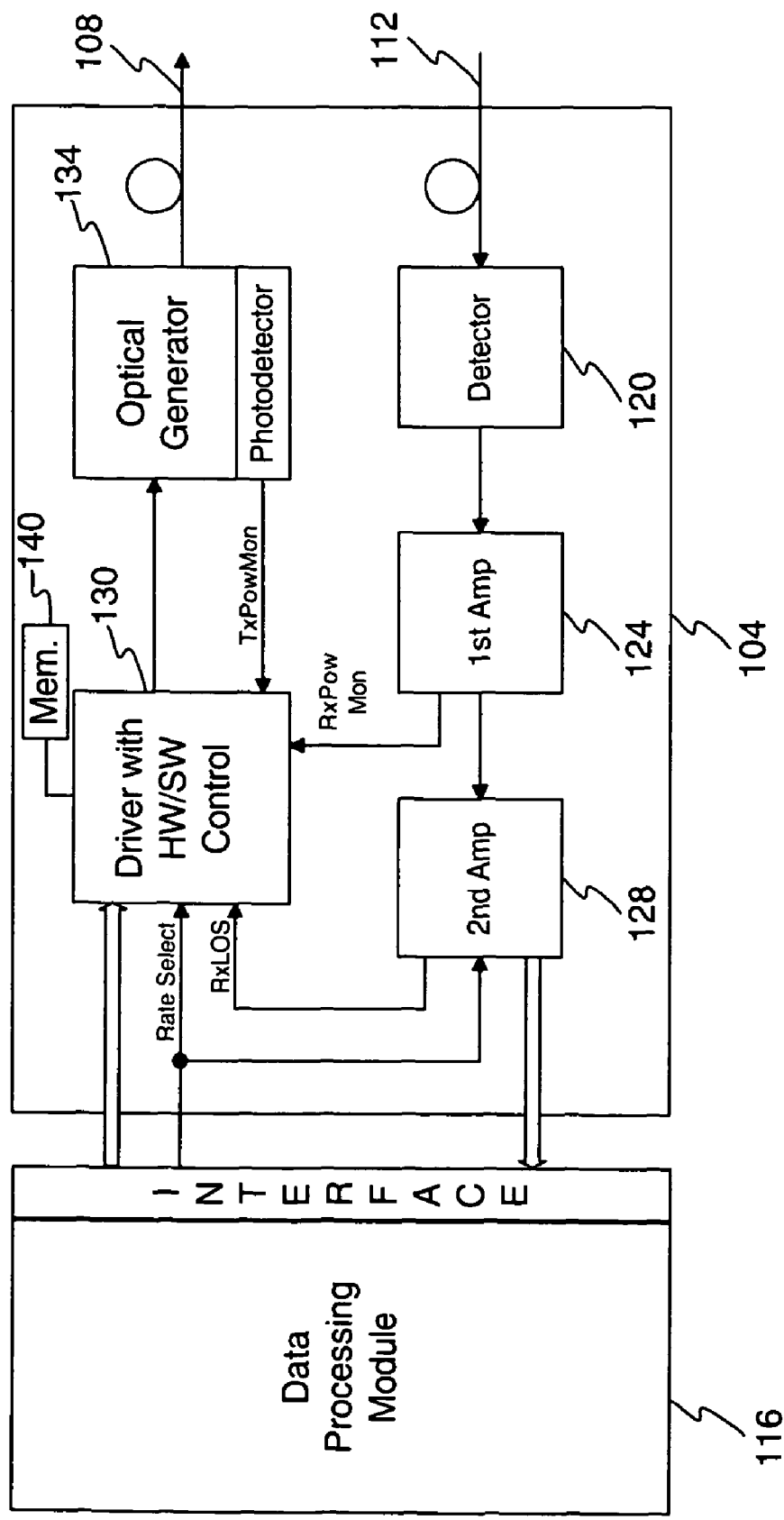
FIG. 1 illustrates a block diagram of an exemplary control module for an optical communication system.

Turning now to FIG. 1, a block diagram of an example module for an optical communication system is shown. The configuration shown in this Figure, and the other Figures provided herein, is but one possible configuration and, as such, it is contemplated that one of ordinary skill in the art may arrive at a different embodiment, configuration, or method of operation without departing from the scope of the claims. As shown, a transceiver with laser control 104 connects to one or more optic fibers, namely, an RX fiber 112 and a TX fiber 108. It is contemplated that the module 104 may comprise a single or multi-fiber module, and/or one which may have one or more wavelengths operating at the same time. The transceiver 104 also connects to a data processing module 116 having an interface. In this example embodiment, the processing module or interface 116 is configured to process the data prior to or after passing through the transceiver 104. When configured as a processing module 116, the module may be configured to frame/unframe, scramble/descramble, encode/decode, and/or to serialize/de-serialize data going through the interface. In addition, processing module 116 may at the same time decode LFSC (Low Frequency Side Channel) data. The interface may be configured to receive data from or provide data to one or more downstream processing modules or software layers.

In this example embodiment, the transceiver 104 comprises a detector 120 configured with an output that connects to a first amplifier 124, which in turn is configured with an output that connects to a second amplifier 128. The output of the second amplifier 128 connects to the processing module or interface 116.

In this example embodiment, the detector 120 comprises any type of optical detector configured to detect and convert an optical signal into an electrical signal. The first amplifier 124 may comprise a trans-impedance amplifier configured to convert a current magnitude to a variable voltage signal. The second amplifier 128 may comprise a limiting amplifier configured to accurately amplify the signal from the first amplifier, and frequently generates an industry-wide acknowledged level, for example: PECL, ECL, CML, PCML, LVDS and so forth 104.

With regard to the transmitter aspects of the transceiver 104, a Driver with HW/SW control 130 receives an input from the processing module 116 intended for transmission on the optical fiber 108. The Driver with HW/SW control 130 may perform one or more operations as described herein or analyze the signal while passing the signal to the optical signal generator 134. In this case, terms HW and SW in HW/SW control implies the use of either software or firmware. The optical signal generator may comprise any device configured to generate an optical signal. The Driver with HW/SW control 130 may optionally connect to one or more external or internal memory modules 140.

The Driver with HW/SW control 130 is configured in conjunction with the other components of a communication system, to perform numerous tasks to overcome the drawbacks of the prior art. In one embodiment, the Driver with HW/SW control 130 may be configured to monitor the power level or other aspects of the optical output signal and based on this monitoring, create a control signal that maintains optimal or desired power level output for the optic signal generated by the optic signal generator. In one embodiment, the Driver with HW/SW control 130 may be configured to process a timer or counter signal that relates the age or operational life of the generator 134 to the control signal value. In one embodiment, the Driver with HW/SW control 130 may be configured to monitor the extinction ratio or a low frequency signal channel signal and based on this monitoring modify the control signal. In one embodiment, the Driver with HW/SW control 130 may be configured to process a temperature value signal that relates the temperature of the generator 134 to the control signal value.

Figure 2:
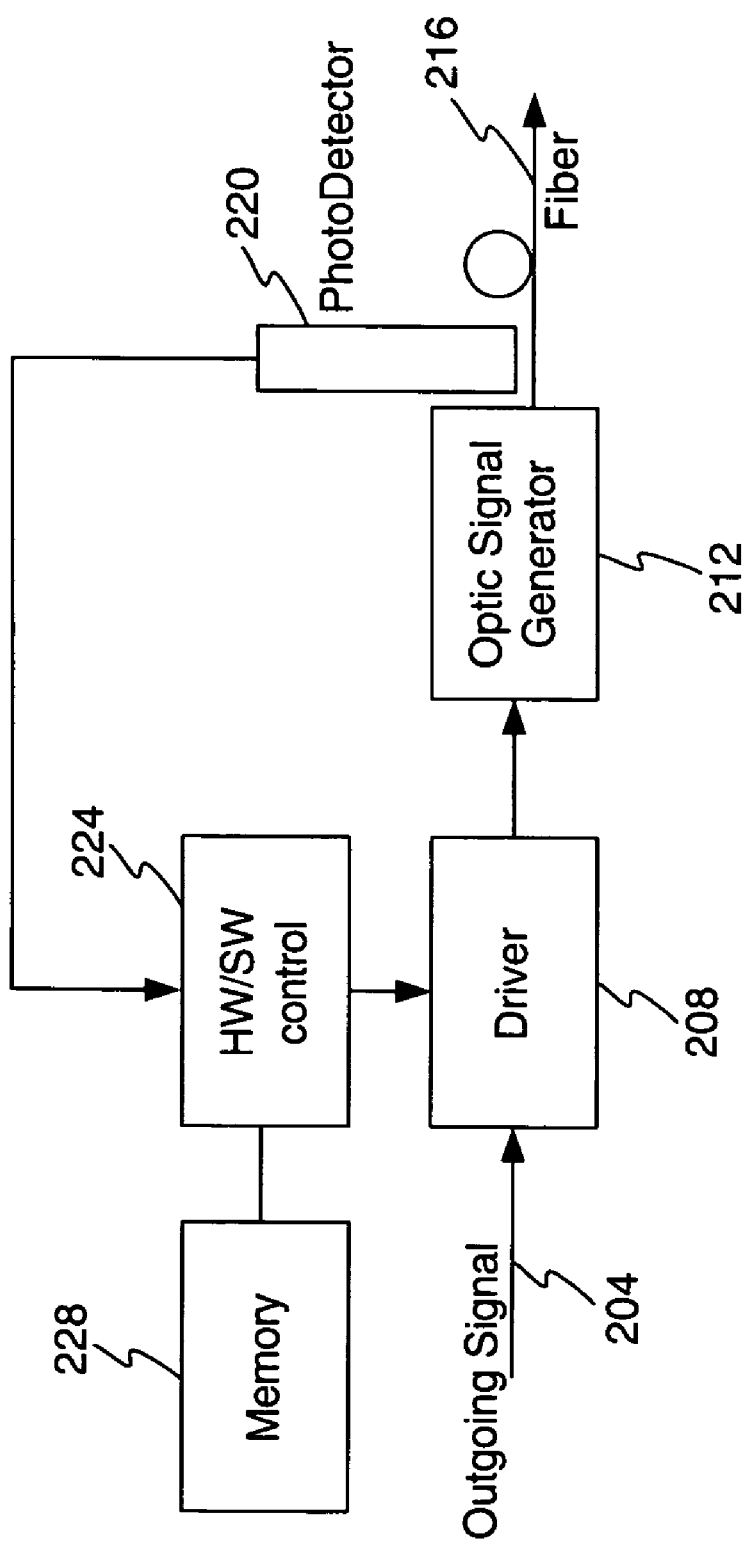
FIG. 2 illustrates a block diagram of an example embodiment of an optical signal power monitor and control system.

FIG. 2 illustrates a block diagram of an example embodiment of an optical signal power monitor and control system. As shown, an input 204 to the system provides an outgoing signal to an optical driver 208, which may comprise one or more devices configured to accurately drive an optic signal generator 212 as shown. The driver may comprise one or more amplifiers, current sources, voltage sources, peak detectors, comparators, as well as state machines used to control some or all of the aforementioned or any other device capable of processing or amplifying an outgoing signal into a signal capable of driving an optical signal generator 212. The optic signal generator 212 may comprise any type device capable of generating an optic signal in response to an electrical input. The optic signal generator 212 may comprise, but is not limited to, a laser, light-emitting diode, vertical-cavity-surface-emitting laser, or any electronic light emitting device. The output of the optic signal generator 212 is provided to one or more optic channels, such as an optic fiber 216.

A detector 220 is configured as part of the output structure or in some way associated with the optic signal generator 212 and/or fiber 216. The detector 220 is configured to detect the power level of the optic signal generated or output from the generator 212, the signal on the fiber 216, or both. The detector 212 may comprise, but is not limited to, a backscatter detector, CdS photocell, PIN photo detector, avalanche photo detector, or any other optical device that changes resistance or developed current with exposure to visible, infrared, or ultraviolet light.

The output of the detector 220, which comprises an electrical signal that is in some way representative of the optic signal, is provided to a HW/SW control 224, which may comprise hardware, software, or firmware control, control logic, comparator, or any other structure. The HW/SW control 224 processes or analyzes the signal, and in response to the processing or analyzing, generates a feedback or control signal. In this embodiment, the feedback or control signal is provided to the driver 208 to thereby optionally control the driver to adjust the power level or other aspects of the input to the generator 212. In this manner, the power level of the optic signal, on the fiber 216, is monitored, controlled, and maintained at an optimal state.

This method of operation and this apparatus overcomes the drawbacks of the prior art by accounting for any changes in the power of the optic signal regardless of the reason for the change. Unwanted changes in output power in the optic signal, regardless of the reason or cause, are undesirable and result in increased jitter and/or error rates, lower payload bit rates or both. In some instances, such changes in output power, if not monitored and mitigated, may disrupt communication system operation. This method and apparatus has the advantage over systems that estimate the power level of the optical signal or monitor the electrical signal because this method and apparatus monitors the actual power level of the optic signal. As a result, a more accurate reading is obtained, instead of an estimation, thereby resulting in a highly accurate and dynamic control loop that adapts, in real time, to changes in environment or device operation. It is further contemplated that monitoring functions may be implemented in the controller 224 to monitor impending failure or indicate future problems. This may be reported prior to device failure, thereby increasing circuit up time.

Figure 3A:
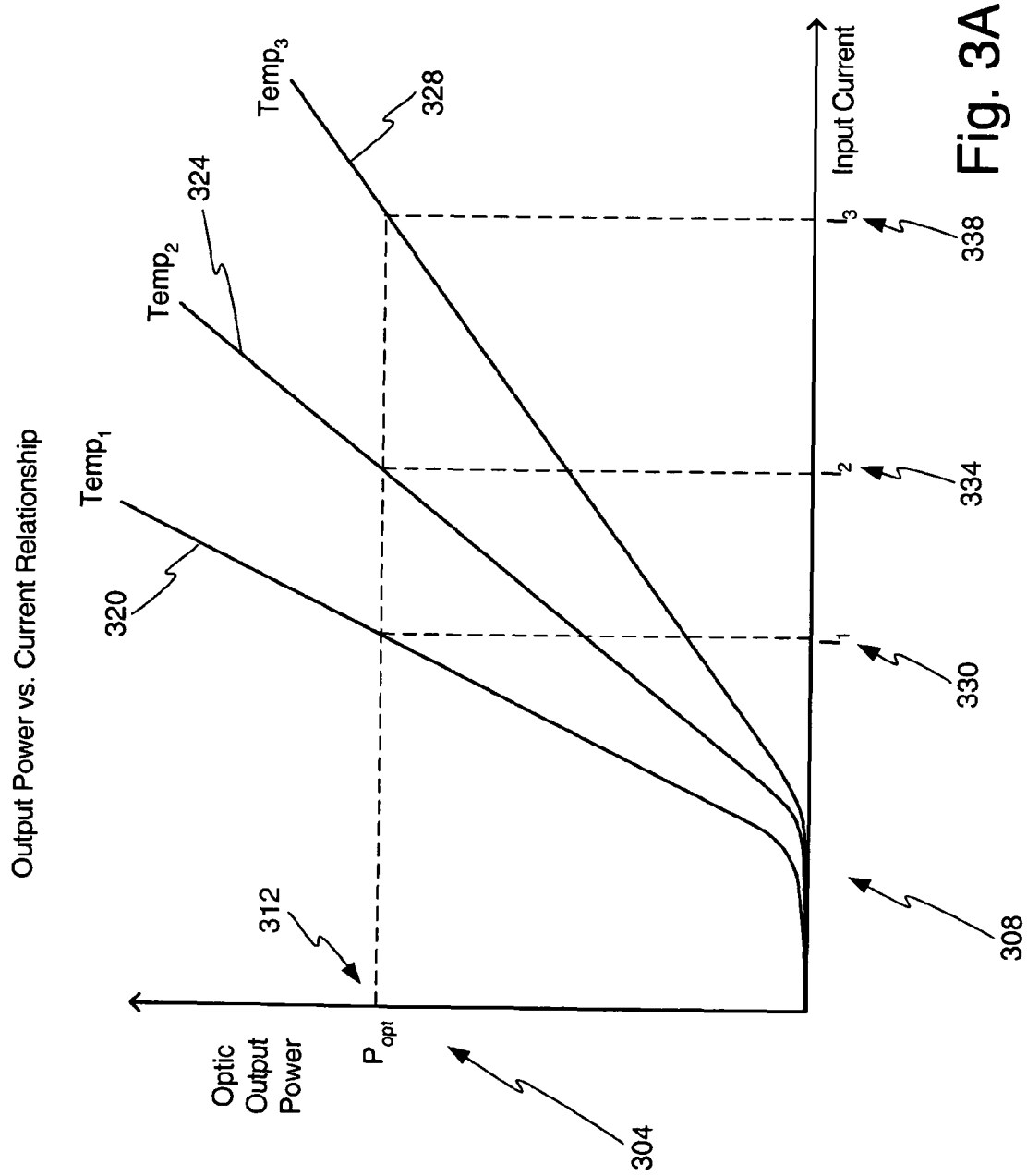
FIG. 3A illustrates an example plot of slope efficiencies for various temperatures for an exemplary optical generator.

FIG. 3A illustrates an example plot of output power of a laser or optical power generator device for various temperatures for an exemplary optical generator. These plots are provided for the purpose of discussion and as examples, and as such, the claims that follow should not be limited in any way by these plots. As shown, the vertical axis 304 represents optic signal output power while the horizontal axis 308 represents input current to the optic signal generator. Three plots 320, 324, 328 are shown. $Temp_1$ plot 320 represents the output power characteristics at a first temperature, while plots 324, and 328 represent output power characteristics at a second temperature $Temp_2$ and third temperature $Temp_3$ respectively. Output power characteristics include changes to threshold current and/or slope efficiency.

In one embodiment, the optimal optic signal power level is defined at power level 312. As can be appreciated from FIG. 3A, for the optimal power level 312 at the first temperature, the signal generator requires an input current $I_1$ 330 to generate this optic signal power level. At the second temperature $Temp_2$, shown by the plot of input current to optic signal output power, the optimal optic power level is achieved with an input current $I_2$ 334, which is different than current $I_1$ associated with $Temp_1$. Moreover, at the third temperature $Temp_3$, an input current $I_3$ is required to establish the optimal optic signal power 312. Thus, as the threshold current and/or slope efficiency changes, due to temperature variation, aging, or other unanticipated factors, so too does the required input current 308 to achieve an optimal optic signal power level 312. Consequently, input current, such as the output of device 208, as shown in FIG. 2, should also change. The method and apparatus is able to adapt to such changes in temperature, or any other reason, thereby maintaining optimal output power for the optic signal.

FIG. 3B illustrates a plot of an exemplary current driver signal with exemplary control current designations imposed thereon, when the laser driver current designated $I_{mod}$ is AC coupled to the optic signal generator. The term AC coupled is defined to mean that the $I_{mod}$ current is added to the $I_{bias}$ current, after removing the DC component of $I_{mod}$, in order to generate the total optical driver current. The vertical axis 350 represents optical driver current from the laser driver 208, as shown in FIG. 2, into the optical signal generator 212, as shown in FIG. 2, while the horizontal axis 354 represents time. A time varying optic signal 358 is shown as a reference. Controlling aspects of the optic signal 358 are currents $I_{thresh}$, $I_{bias}$, and $I_{mod}$. $I_{thresh}$ represents the turn on threshold current for the optic signal generator. $I_{bias}$ represents the bias current for the signal and controls the off level or DC level for the optic signal generator. $I_{mod}$ represents the modulation current for the optic signal and controls the variance between the peak minimum and maximum values for the optic signal. By controlling one or more of these values, the optic signal is likewise controlled or varied. One or more of these values may also be controlled to control the extinction ratio, which is defined as the ratio of two optical power levels, where the numerator of the ratio is the high level, and the denominator of the ratio is the low level. Extinction ratio is typically expressed in dB, but can also be expressed simply as a numerical ratio.

Figure 3C:
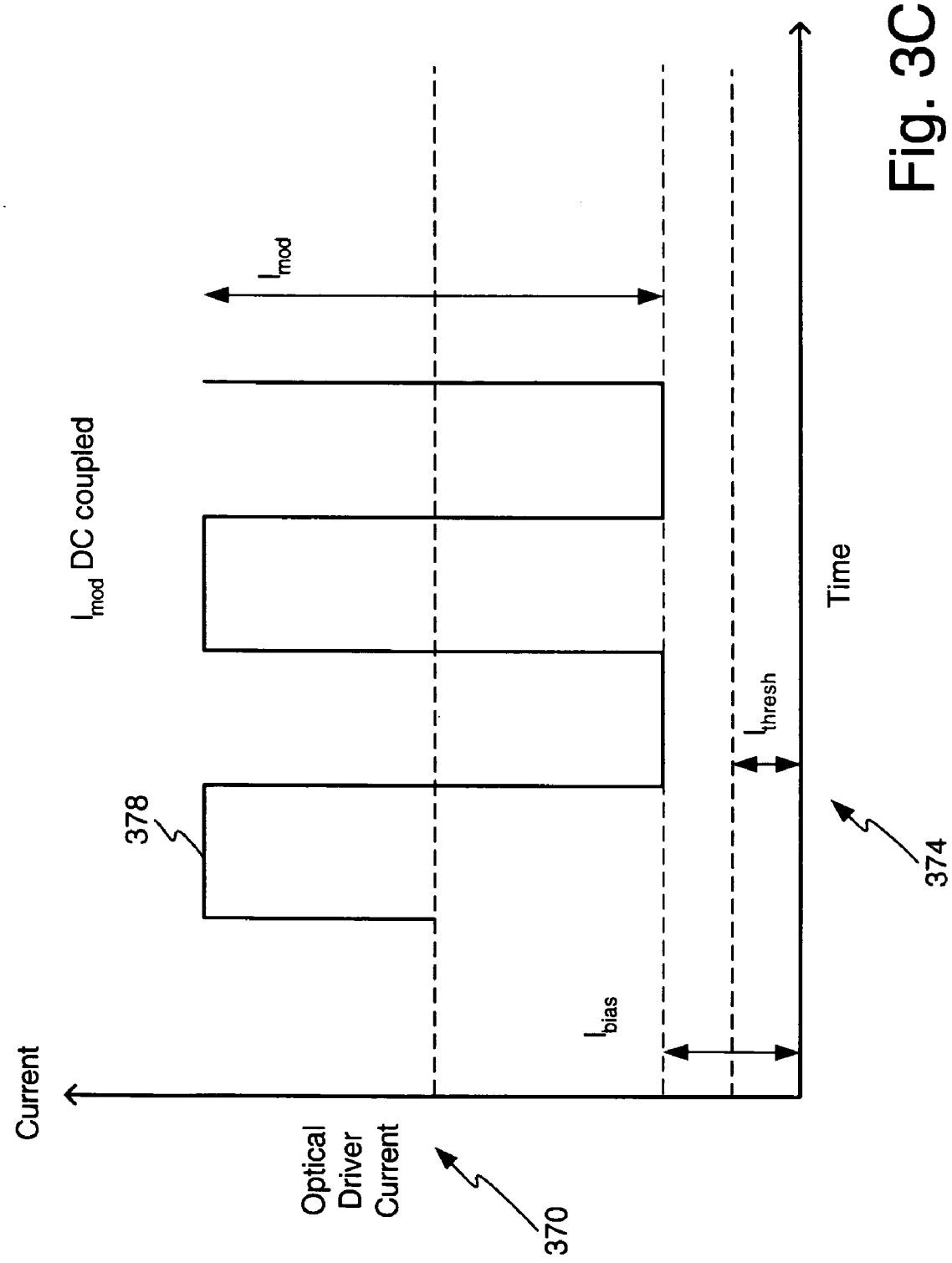
FIG. 3C illustrates an example plot of DC coupled driver current.

FIG. 3C illustrates an exemplary plot of a current driver signal when the laser driver currents designated $I_{mod}$ and $I_{bias}$ are DC coupled. The term DC coupled is defined to mean that the $I_{mod}$ current is added to the $I_{bias}$ current, without removing the DC component of $I_{mod}$, in order to generate the total optical driver current. As shown, the vertical axis 370 represents optical driver current while the horizontal axis 374 represents time. In this example plot, $I_{mod}$ current 378 is shown in reference to $I_{bias}$, $I_{thresh}$, and $I_{mod}$.

FIG. 4 illustrates a block diagram of an example embodiment of an open loop power control system. This is but one example embodiment of an open loop power control system and, as such, other embodiments may be created without departing from the scope of the claims that follow. As shown, an input 400 carries an outgoing signal to a driver 404 configured to amplify or modify the outgoing signal in a manner suitable to power the optic signal generator 408. The optic signal generator 408 generates an optic signal, based on or representing the outgoing signal. The optic signal generator 408 outputs the optic signal on an optic fiber 412. As described above, the driver 404 and generator 408 may comprise any device capable of performing as described herein.

A memory 420 connects to a digital to analog converter 416, the output of which comprises one or more signals that are provided to driver 404. In operation, the memory 420 stores digital values which are output and converted to analog values, which in turn control one or more aspects of operation for the driver 404. It is contemplated that the aspects of the driver that may be controlled include, but are not limited to, the modulation current, the bias current, pulse width, edge characteristics, rise and fall time, and/or other aspects of the driver 404. In one embodiment, the values stored in the memory 420 may be referred to as control values or control signals because such signals or values in some way control one or more aspects of the driver or the driver output. It is contemplated that in some cases, there could be a control value to control the generator temperature via something like a thermoelectric cooler. However, in general, the control values themselves may be provided to another controller or driver device and not directly to generator 408. In one embodiment an input 410 connects to the ADC 416 to provide control signals for modulation, bias, or control of one or more other parameters.

As can be appreciated, the biasing level and/or modulation level may be controlled based on a memory value that is selected to control or drive the generator 408 in a desired manner. In addition, more than one control value may be utilized. For example, differing control values may be selected based on different factors, such as, but not limited to, time of day, age of components, components in use, temperature, system parameters, distance to receiving optic module and optic signal generator characteristics. As a result, the changes to any one or more factors may be accounted for by modifying the value in memory or utilizing a different value from memory.

It is also contemplated that the changes to the driver 404 or optic signal generator 408 may be accounted for by changes to the one or more control values stored in memory. For example, for a different particular brand or lot of optic signal generator 408, a particular drive signal that is required to achieve optimum or an otherwise desired optical signal power level, extinction ratio, or any other desired parameter may vary. By changing the memory values to control operation of the driver 404, use of different components, such as a different type generator, may be accommodated without circuit redesigns. Instead, the memory value may be changed to account for the different circuitry or device.

Figure 5:
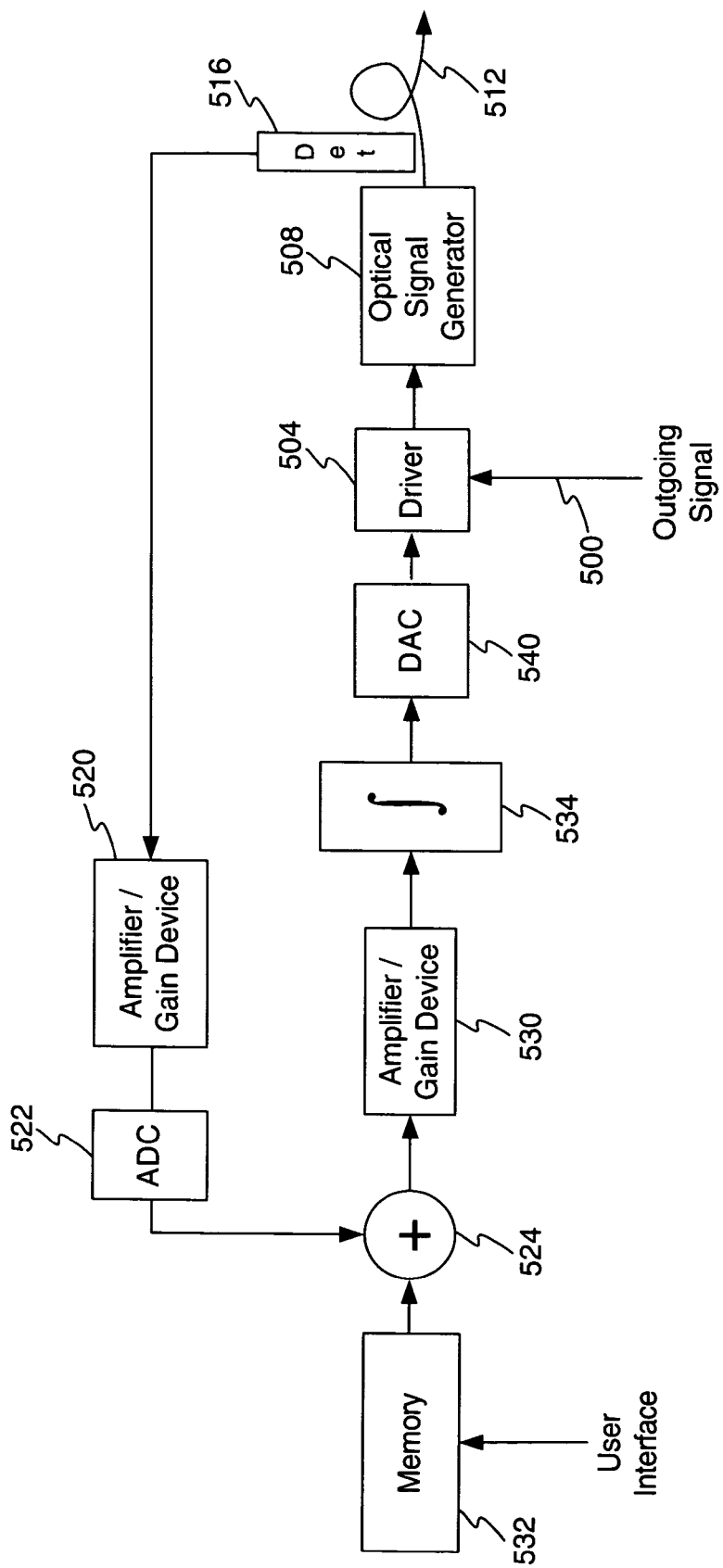
FIG. 5 illustrates an example embodiment of a closed loop power monitor to maintain optimal optic power.

FIG. 5 illustrates an example embodiment of a closed loop power monitor to maintain optimal optic power. As with all figures of the document, this figure is provided for purposes of discussion and, as such, the claims that follow are not limited to this particular embodiment. As shown, an input 500 configured to carry an outgoing signal is provided to a driver 504 configured to generate or modify the outgoing signal into a format suitable for powering or activating an optical signal generator 508 as shown.

The output of the generator 508 comprises an optical signal having parameters, such as power level and extinction ratio, controlled by the input from the driver 504 and the performance of the generator 508. The optic signal is provided to an optic fiber 512 for transmission to a remote station or other communication device, which may be co-located or remote. A detector 516 monitors one or more aspects of the optic signal, such as, but not limited to, power level or extinction ratio of the optic signal and converts the one or more aspects to an electrical signal, which in turn is provided to an amplifier 520 or some form of gain device. In addition, it is also contemplated that the detector 516 may detect the signal itself and generate an electrical representation of the optic signal on the fiber 512. The detector 516 may comprise a backscatter type detector, a PIN photo detector, avalanche photo detector, CdS photocell, any other optical device that changes resistance or develops current with exposure to light, or any other type of optic detector.

The amplifier or gain device 520 may comprise any device capable of modifying the power signal from the detector 516 for additional subsequent processing. The output of the detector 516 or amplifier 520 may be referred to herein as a feedback signal. The output from the amplifier 520 feeds into an analog to digital converter for conversion to a digital format and then to a summing junction or subtractor 524 configured to combine the feedback signal with one or more targets or control values or signals stored in the memory 532. The one or more target or control values or signals may comprise any of one or more values that are a starting point or default control values for the driver 504, such as to control bias current, modulation current, extinction ratio, power level or any other parameter of the driver, generator 508, or optic signal. The target value from the memory 430 is discussed below in more detail in connection with the operation of the embodiment shown in FIG. 5.

The one or more outputs of the junction(s) 524 are provided to an amplifier 530 or other type of gain device. It is contemplated that one or more junctions may be utilized to process one or more signals. It is further contemplated that the feedback signal may be converted to a digital signal by the analog to digital converter 522 or remain in the analog domain.

The amplifier 530 is configured to optionally modify the output(s) of the junction 524, such as by increasing or decreasing the magnitude of the signal, to a desired level. The junction 524 and the amplifier 530 may operate or be combined to generate an error signal, which may vary to either positive or negative. The output of the amplifier 530 connects to an integrator 534 or any other device configured to sum or combine the output from the junction 524 to generate a composite or integrated signal. The integrator 534 may comprise, but is not limited to, the following types of devices: accumulator, resistive/capacitive integrator, feedback loop, or nth order IIR filter. It is also possible to have a close loop system with the integrator bypassed and therefore have proportional signal control, or with an integrator signal+a proportional signal control, or with the proportional signal+integrator signal+higher order signal(s) control. The integrator 534 should be considered an optional device. In this embodiment, the integrator 534 may comprise a resistor/capacitor type integrator.

In this embodiment, the one or more outputs of the integrator 534 comprises one or more digital signals and, hence, a digital to analog converter (DAC) 540 which converts the digital signal to an analog format. As an advantage to the system described herein, at least a portion or all of the control loop is implemented in the digital domain thereby providing additional control, accuracy, and adaptability as compared to an analog solution. It should be noted that the one or more aspects may be implemented in the analog domain, or additional elements may be implemented as digital devices.

In operation at start-up, the feedback signal is zero and, as such, the memory 532 outputs the target value to the junction 524. As described above, the junction 524 combines or subtracts the feedback signal from the target value to thereby supplement the target value. At this stage, the feedback signal may be zero and, thus, the target value (i.e. one or more target values) is forwarded through the integrator 534 to the driver 504 to thereby control one or more aspects of operation of the driver. In this manner, the driver 504 is controlled by the one or more target values or signals to generate an optimum optic signal or an optic signal with the desired parameters to represent the outgoing signal.

During operation, the detector 516 detects the optic signal and generates an electrical feedback signal representative thereof, or representative of one or more aspects of the optic signal. The feedback signal and the target signal may comprise one or more signals and may be referred to herein as a value or a signal. The one or more feedback signals are amplified, converted to a digital value, and combined, either through addition or subtraction with the target value to supplement the target value(s). It is contemplated that over time the behavior of the generator 508 or other component may change and that this change may be undesirable as it may result in an optic signal that is other than optimal or does not meet specification. Consequently, the detector 516 will detect this change in the optic signal and the system through the feedback loop will supplement, either through addition or subtraction, the target value that was stored in memory 532 or a register. This modifies the target values, which may also be referred to as a control signal, which in turn affects the output from the driver 504 to account for or correct the behavior of the generator 508. The optic signal may deviate from optimal for other reasons, such as, but not limited to, temperature changes, or device behavior changes over time.

Regardless of the reason for the change in the power level of the optic signal, the detection method described herein detects such change because it advantageously monitors the actual optic signal and generates a feedback signal configured to return the optic signal to an optimal or desired state. Over time the feedback signal tracks the optic signal and continually corrects unwanted variations. This embodiment also has the advantage of allowing for user interface or input, such as modifications to the target value stored in memory via a user interface in conjunction with an open loop or closed loop digital format based on the optic signal control system. In addition, the feedback signal or any other aspect of the control loop may be monitored by one or more HW/SW control structures based elements to detect optic signal characteristics or feedback signal levels that may indicate an impending system failure or other condition.

Figure 6:
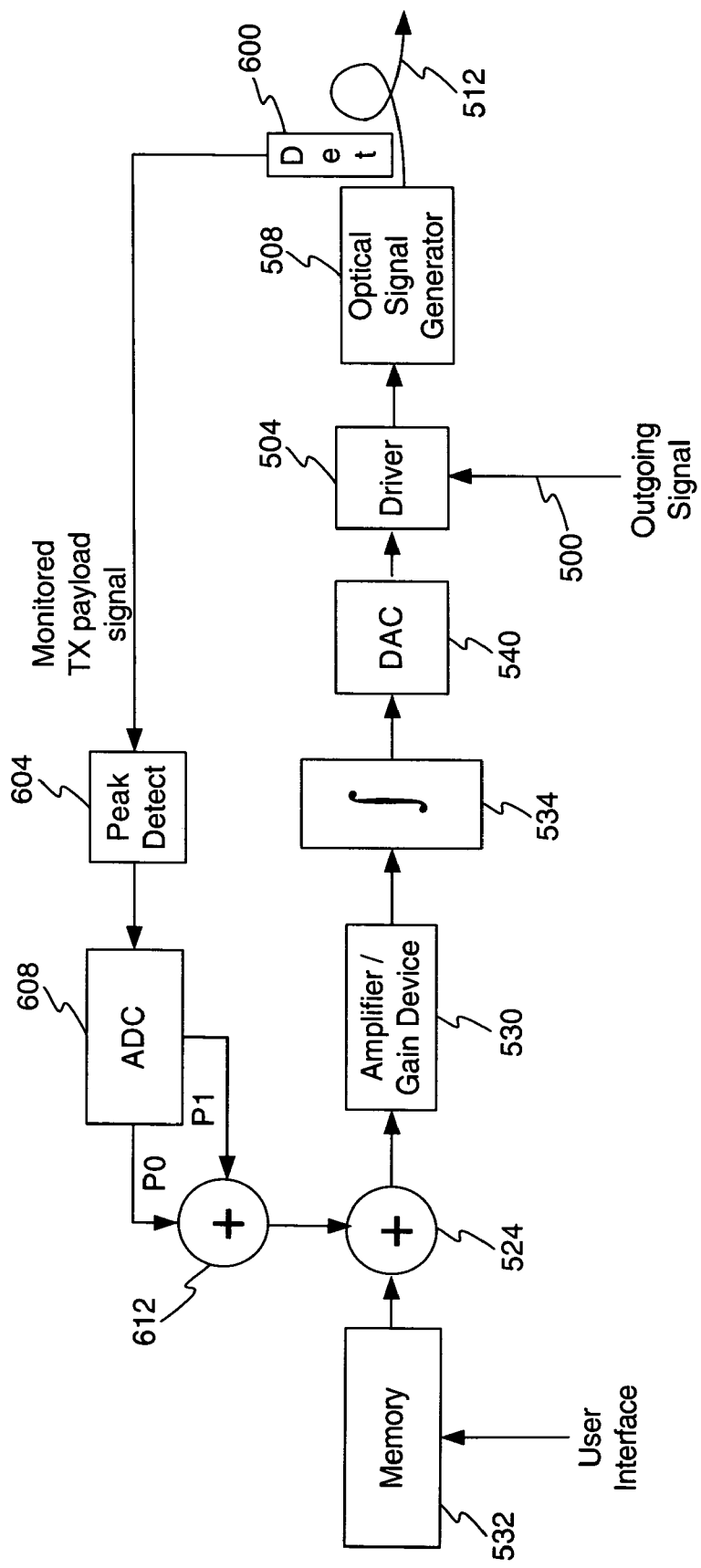
FIG. 6 illustrates a block diagram of an example embodiment of a closed loop power control system with data signal monitoring.

FIG. 6 illustrates a block diagram of an example embodiment of a closed loop power control system with data signal monitoring. As shown, this embodiment shares one or more similarities with the embodiment of FIG. 5 and, as such, similar items are identified with identical reference numerals. In this embodiment, the data signal, also referred to as the payload signal, is provided to a peak detector 604 in addition to other receiver systems, not shown, which process the signal. The data signal may be detected by a detector 600 or any other device or from an output from the optical signal generator 508. The signal is then provided to an analog to digital converter 608. The analog to digital converter 608 converts the feedback signal to a digital format, assuming the signal is not already provided in a digital format. The analog to digital converter 608 is configured to convert the $P_0$ and $P_1$ values for the received signal. In this embodiment, the values $P_0$ and $P_1$ are proportional, and represent, or may be processed to represent the extinction ratio. In one embodiment, the extinction ratio is defined as the fraction of the optical power of the marks (ones) to the optical power of the spaces (zeros) in decibels. The $P_1$ and $P_0$ may be defined as the power of the marks and spaces respectively. In one embodiment, it is desired to maintain the extinction ratio constant to avoid degradation or drift of the optic signal, which could lead to increased bit error rates.

Factors other than $P_0$ and $P_1$ may be detected in other embodiments. By detecting $P_0$ and $P_1$, the modulation level may be detected. It is also contemplated that average power or any other aspect of the optic signal's power level may be detected. The one or more peak values are provided by the peak detector 608 to a junction 612, which, in this embodiment, determines the difference between the two or more peak values. This difference value, which may be modified in any manner by the junction 612, such as scaled, amplified, or decremented, or integrated, is provided to junction 524 as a feedback signal or compensation signal. This feedback or compensation signal may be used to modify one or more aspects of the optic signal transmitted from the generator 508.

In operation, an outgoing signal is provided to the driver 504 for conversion to an optical signal by the optical signal generator 508. The generator 508 generates an optical signal representative of the outgoing signal and one or more aspects of operation of the generator or of the optic signal is controlled by the control signal input from the DAC 540. The control signal is stored in the memory 532, which may be updated via the user interface. A compensation or correction signal, if necessary, from the feedback loop is combined with the control signal in the junction 524. The compensation signal is generated by monitoring the peak values, such as the modulation or $P_0$ and $P_1$, of the outgoing optical signal and generating the compensation or correction signal in junction 612. The compensation or correction signal may also be referred to as an error signal. The resulting control signal, which may be modified by the compensation or correction signal (i.e. feedback signal) is amplified in device 530, optionally integrated or summed in element 534 and converted to an analog format in converter 540.

If one or more parameters, such as the extinction ratio of the optic signal changes, such change is detected via the feedback loop (600, 604, 608, 612) and a compensation signal generated that when combined with the control signal or target signal from the memory 532 causes the optic signal to return to the optimal or desired power level. In this manner, the optic signal is monitored and maintained at an optimum level there by insuring a high bit rate, low error rate, and stable communication. This embodiment utilizes one or more peak detectors 608 to detect one or more aspects of the transmitted signal. Although in this embodiment, the values $P_0$ and $P_1$, which may be considered peak values, are monitored, in other embodiments, other factors, parameters, or peak values may be monitored to determine if the optic signal is within specification.

Figure 7:
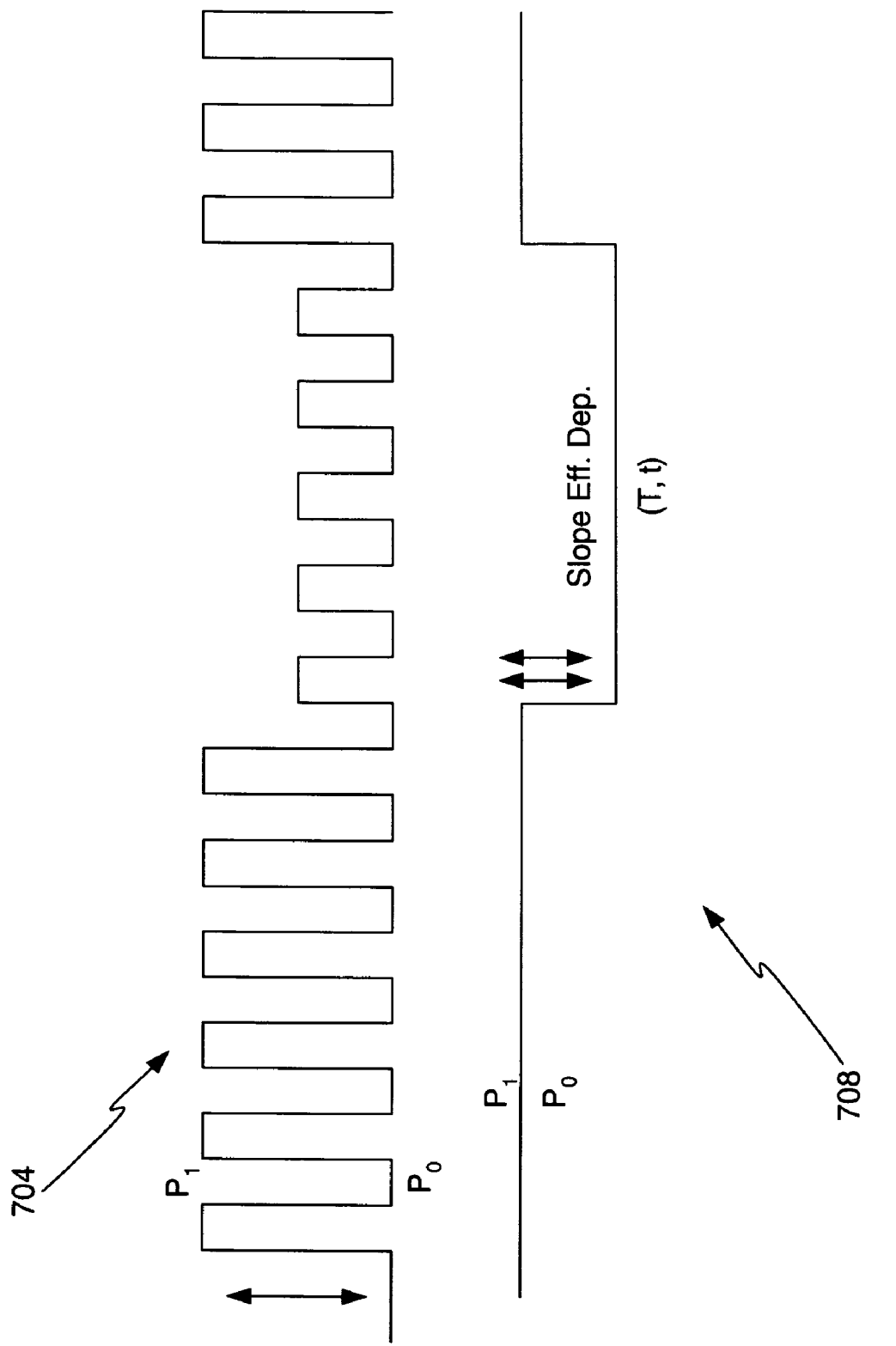
FIG. 7 illustrates an example plot of a data signal with an associated low frequency side channel (LFSC).

FIG. 7 illustrates an example plot of a data signal with associated low frequency side channel (LFSC). In one embodiment, the optic communication system may utilize a LFSC modulated onto or with the payload or data signal. As shown, plot 704 comprises a data signal while plot 708 comprises a LFSC signal that may be imposed or modulated onto the data signal 704. In one embodiment, the value for $P_{0d}$ and $P_{1d}$ for the data signal may be determined by monitoring the $P_{0LFSC}$ and $P_{1LFSC}$ for the LFSC signal where $P_{0d}$, $P_{1d}$, $P_{0LFSC}$ and $P_{1LFSC}$ are defined as signal levels proportional to the optical power in the spaces (zeros) of the data, marks (ones) of the data, spaces (zeros) in the LFSC data, and marks (ones) in the LFSC data respectively. Monitoring the LFSC signal provides the advantages of simplifying the peak detector circuitry and allows for communications via a link which is not dependent on payload data.

Figure 8:
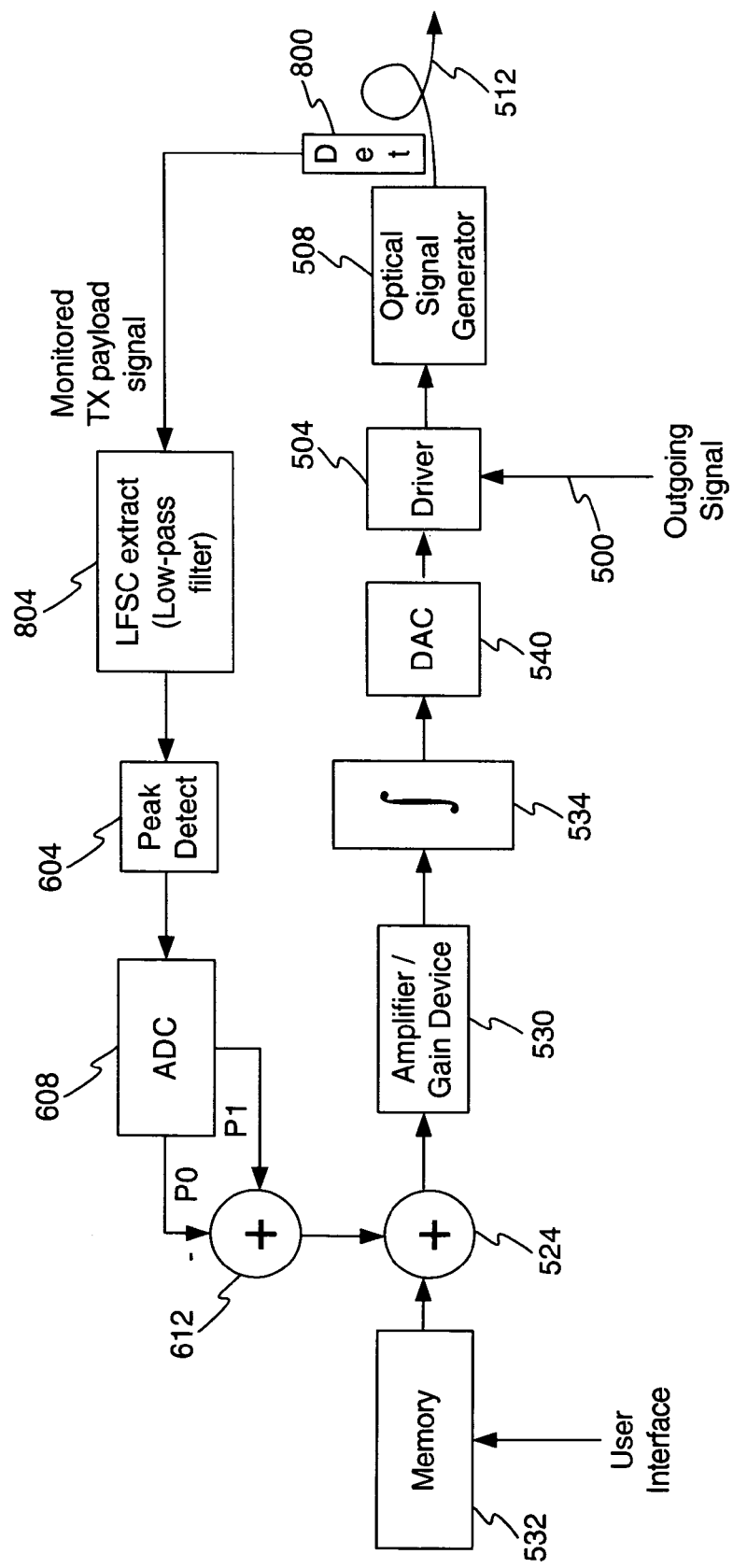
FIG. 8 illustrates a block diagram of an example embodiment of a signal power control system configured to monitor a LFSC signal.

FIG. 8 illustrates a block diagram of an example embodiment of a signal power control system configured to monitor a LFSC signal. As shown, this embodiment shares one or more similarities with the embodiment of FIG. 6 and, as such, similar items are identified with identical reference numerals. In this embodiment, the data signal, also referred to as the payload signal, i.e. outgoing signal, is provided to the driver 504 as is described above. The payload signal is created into an optic signal by the generator 508 and the optic signal provided to the fiber 512 may be detected by a detector 800 or any other device. The detection may also occur within the generator 508 or be a dedicated optic output from the generator. The detector 800 may be configured to detect the optic signal, which may comprise the data signal and the LFSC signal. The detector output is provided to a filter 804 or other processing apparatus configured to extract the LFSC signal. Thereafter, the LFSC signal is provided to a peak detector 604. The LFSC signal is then processed by an analog to digital converter 608 in a manner similar to that described above to isolate information regarding the modulation, extinction ratio, or other aspect of the optic signal. In the embodiment of FIG. 8, the signals $P_0$ and $P_1$ of the LFSC signal are isolated and provided to the junction 612 to generate a compensation or correction signal. In this embodiment, the extinction ratio of the LFSC signal may be considered as being related to the extinction ratio of the payload signal. This signal is in turn provided to the junction 524 where it may optionally adjust or supplement the driver control signal stored in memory 532.

Figure 9:
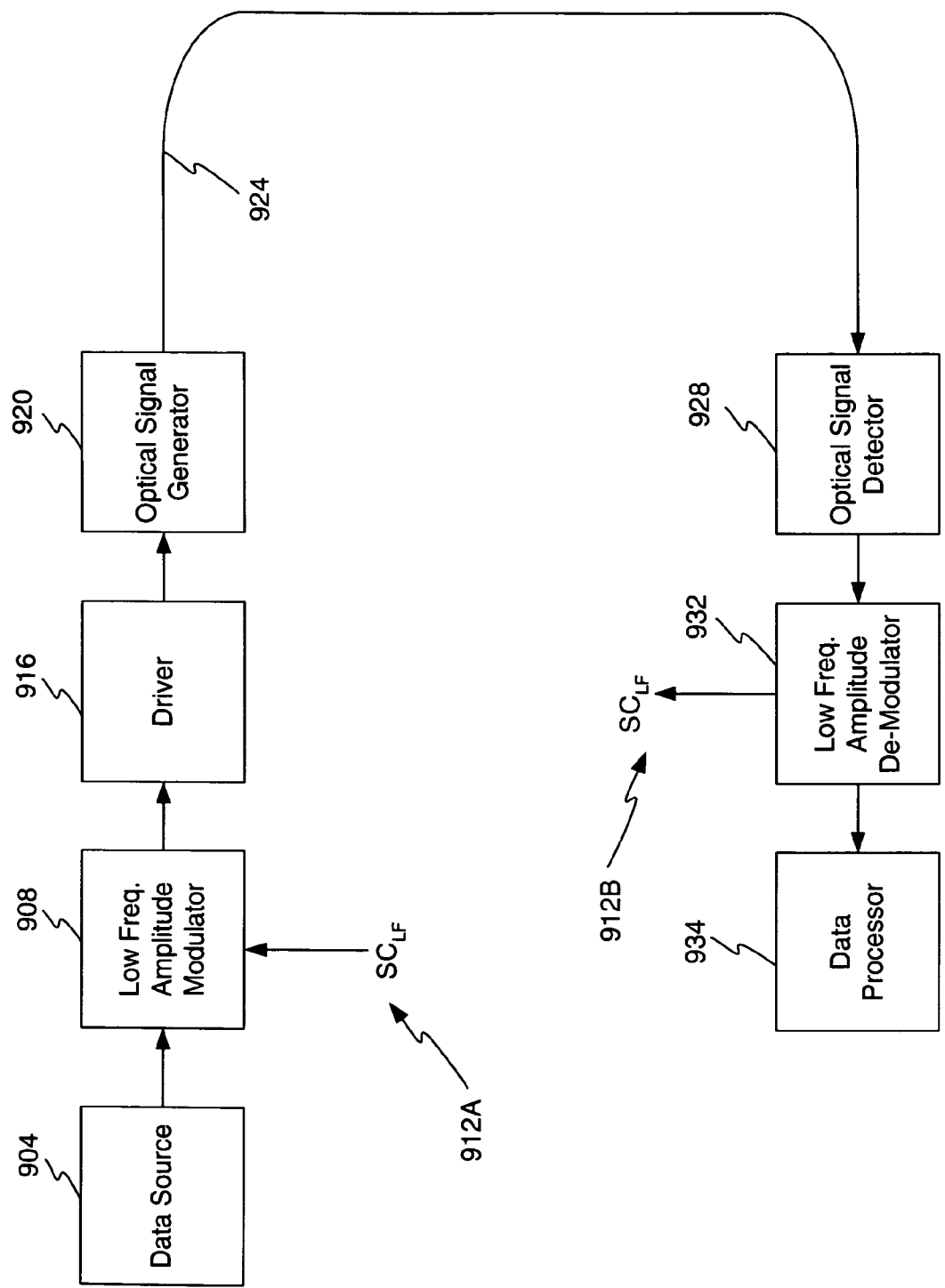
FIG. 9 illustrates a block diagram of an example embodiment of an optical communication system having an amplitude modulated low-frequency side channel configured to convey system data.

FIG. 9 illustrates a block diagram of an example embodiment of an optical communication system configured with an amplitude modulated low-frequency side channel configured to convey system data. In other embodiments, other methods of modulation may be utilized. As shown, a data source 904 provides network data for communication over the optical network. The data source 904 may comprise any source of network data including, but not limited to, a computer network, communication device router, switch, transceiver, hub, bridge, repeater, or any other source of data. The output of the data source 904 feeds into a low frequency amplitude modulator 908 which is configured to amplitude modulate data from a low frequency side channel 912A ($SC_{LF}$) onto the network data that is received from the data source 904. In one embodiment, the low frequency amplitude modulator 908 modulates the network data from the data source 904 responsive to the data on the side channel ($SC_{LF}$) and the data on the side channel may comprise system data, such as to control or monitor the communication system.

The output of the low frequency amplitude modulator 908 connects to a driver 916 that is configured to convert the amplitude modulated data source to a signal capable of driving an optical signal generator 920. It is contemplated that any type driver system or circuit 916 may be utilized. Likewise, the optical signal generator 920, which connects to one or more optical conductors 924, may comprise any device or system capable of generating one or more optical signals. Such devices include, but are not limited to, continuously modulated optical sources, such as, light-emitting diodes (LED) and various types of lasers, or they might be continuously emitting optical sources modulated by an external device, such as, electro absorptive modulator (EAM) or Lithium Niobate Modulator.

It is further contemplated that the system data in the form of the $SC_{LF}$ may be provided to the driver 916 to control operation of the one or more driver signals that are provided to the optical signal generator.

Because the network data from the data source 904 is amplitude modulated by the system data or secondary data on the low frequency side channel 912A, the fiber optic conductor(s) 924 concurrently carries the network data and the system data. Transmission of the system data in this manner does not disturb transmission or reception of the network data. It is contemplated that the intensity of the optical signal may be modified sufficiently so that the intensity changes may be detected to recover the system data, but not so significantly that the network data may not be recovered or that the data rate for the network data is reduced.

At a receiving station or at the detector, the combined signal is provided to an optical signal detector 928, which is configured to convert the optical signals to a corresponding electrical signal for subsequent processing. An amplifier (not shown in FIG. 9) may optionally be configured as part of the optical signal detector 928 or may reside after the detector 928 to amplify the received electrical signal.

The electrical signal is then provided to a low frequency amplitude demodulator 932 that is configured to detect the low frequency variations in the received signal to thereby isolate the system data on the low frequency side channel 912B. The system data recovery may also occur within an amplifier of the receiver. Because the system data controls the amplitude modulation of the network data, the system data may be recovered by monitoring one or more aspects of the received signal. After processing by the low frequency amplitude demodulator 932, the network data is forwarded to the data processor 934 which may be configured to process or otherwise utilize the network data. It is contemplated that the signal passed to the processor 934 may comprise the received signal. The amplitude modulation of the signal is such that it does not interfere with subsequent processing of the network data. In other embodiments, other forms of amplitude modulation may require processing of the network data by the data processor 934 in such a way to enable recovery of the received network data. These operations are described below in more detail.

The embodiment shown in FIG. 9 is but one possible example embodiment of a communication system utilizing amplitude modulation of a high frequency signal to encode or include additional data that, in this embodiment, comprises a low frequency side channel of system data. This enables transmission between stations to include system data including, but not limited to, data regarding the operation or performance of the optical signal generator, driver, the error rate, the transmit power, the extinction ratio, received signal, operating environment, or any other system parameters. Processing or monitoring of this data allows for inter-station communication to thereby adjust transmission or reception parameters of operation to either improve operation or monitor for potential failures or degradation. This low frequency signal channel may also be monitored by the detector to evaluate the power level of the outgoing optic signal.

Figure 10:
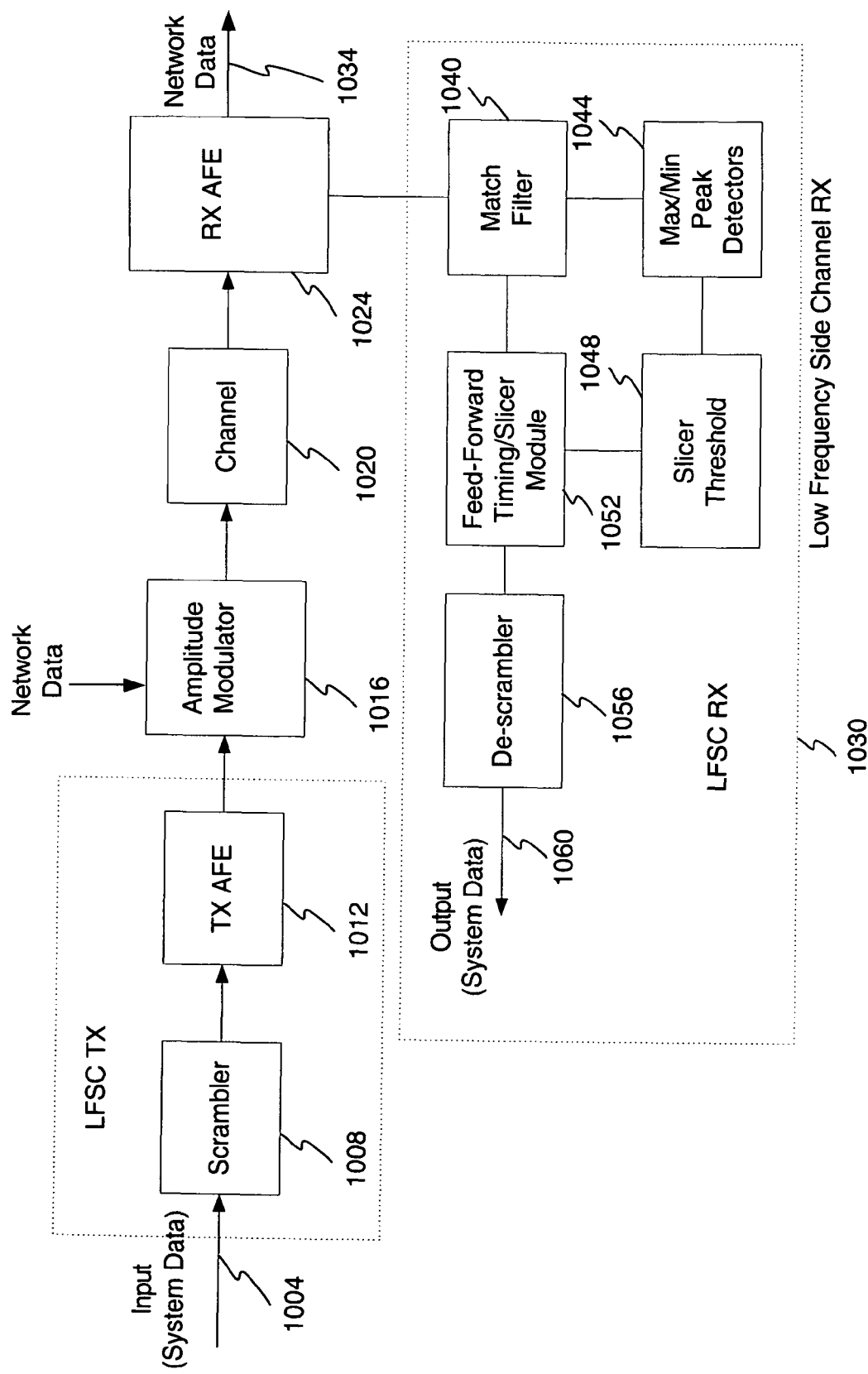
FIG. 10 illustrates a block diagram of an example embodiment of a transmitter-receiver pair configured to amplitude modulate network data to include system data.

FIG. 10 illustrates a block diagram of an example embodiment of a transmitter-receiver pair configured to amplitude modulate network data to include system data. The system of FIG. 10 may be utilized to incorporate low frequency side channel data with the data signal and this side channel data may be monitored to detect the optic signal power level. As would be understood by one of ordinary skill in the art, components in addition to those shown would likely be included to enable operation of such a communication system. In addition, the components shown in FIG. 10 comprise the components relevant to the present invention and those helpful to gain an understanding of the invention.

In the embodiment shown in FIG. 10, an input 1004 provides system data to a scrambler 1008. The scrambler 1008, which is known by those of ordinary skill in the art, processes the system data to inhibit undesirably long strings of logic value zeros or logic value ones which may otherwise disrupt system operation. The output of the scrambler 1008 feeds into a transmitter analog front end (AFE) 1012 which is configured to convert the digital network data to an analog format suitable for transmission over one or more channels, such as channel 1020. As is understood by those of ordinary skill in the art, digital data may be transmitted over a channel in an analog format.

The output of the analog front end (AFE) 1012 feeds into an amplitude modulator 1016 and is also configured as a signal generator. In one embodiment it is possible for the amplitude modulator to reside inside the AFE and the AFE could be an optical power generator or a current driver/optical power generator pair. In this embodiment, the amplitude modulator 1016 also receives system data as an input. The amplitude modulator 1016 is designed to concurrently transmit the system data and the network data over the channel 1020. Amplitude modulation of the system data onto the network data does not affect the communication system's ability to receive and detect the network data at a receiver.

In the embodiment shown in FIG. 10, the system data controls the amplitude modulation of the network data whereby depending upon the logic level of the system data, one or more aspects of the network data may be modified thereby causing the network data, when transmitted over the channel 1020 to convey not only the network data but also the system data.

In the embodiment of FIG. 10, it is contemplated that any type modification to the network data may occur that utilizes amplitude modulation techniques. For example, it is contemplated that the system data may control the bias level of the network data, the upper boundary intensity levels of the network data, the lower boundary intensity levels of the network data, the overall power level or bias level of the network data, or any combination of these factors. The various methods of operation of the amplitude modulator 1016 are described below in more detail.

The output of the amplitude modulator comprises an amplitude modulated version of the network data, which is provided to the channel 1020. It is contemplated that the channel 1020 may comprise any type communication channel and the channel may comprise one or more optical channels or additional electrical type conductors. It is also contemplated that the channel may comprise free space. Furthermore, channel drivers and optical signal generators may be located between the amplitude modulator 1016 and the channel 1020, although it is contemplated that the driver and signal generator may be part of the apparatus performing the amplitude modulation of the network data. As such, the amplitude modulator may also then be configured as the driver and signal generator.

Turning now to the receiver side of the transmitter-receiver pair, a receiver analog front end 1024 processes the received amplitude modulated network data as would be understood by one of ordinary skill in the art. The network data, which may also include the amplitude modulation effects, is provided on output 1034 for subsequent processing. Amplitude modulation does not interfere with subsequent processing of the network data because the degree of amplitude modulation occurring on the network data is not significant enough to interfere with subsequent processing but is significant enough to be detected by the low frequency side channel receiver 1030, which also receives the amplitude modulated network data as shown.

The low frequency side channel receiver comprises a match filter 1040 configured to receive and selectively filter a particular frequency band of the output from the analog front end 1024. The match filter 1040 also connects to a feed-forward timing module 1052 and a min/max peak detector 1044. The min/max peak detector 1044 also connects to a slicer threshold 1048, which in turn connects to the feed-forward timing/slicer module 1052 as shown. The output of the feed-forward timing/slicer module 1052 feeds into a de-scrambler 1056 configured to reverse the effects of the scrambler in the transmitter. The system data is shown on output 1060 after having been recovered by the low frequency side channel receiver.

In operation, the match filter 1040 comprises a filter that is tailored to have a frequency response of a particular frequency or frequency band. In this embodiment, the RX AFE 1024 separates the low frequency system data from the network data. By detecting the amplitude modulation of the network data, the system data may be recovered. The min/max peak detectors 1044 monitor one or more aspects of the recovered system signal. In this embodiment, the min/max peak detectors 1044 monitor the maximum and minimum values of the system data to thereby detect the proper levels for the slicer threshold. The feed-forward timing/slicer module 1052 and slicer threshold 1048 operate to thereby generate the output signal provided to the de-scrambler 1056. In other embodiments, other configurations for and methods of operation of the low frequency side channel receiver 1030 may be utilized. As discussed below in more detail there are numerous methods by which the system data may be utilized to modulate the network data and, as such, the configuration and operation of the low frequency side channel receiver is dependent upon the particular method of amplitude modulation utilized. For example, it is contemplated that max/min peak detectors inside the RX AFE 1024 may comprise a power monitor configured to monitor the average power or bias level of the modulated network data and based on this average power or bias level the system data may be recovered.

It should be noted that the low frequency side channel data is at a frequency rate which is below the network data. In one embodiment, the frequency of the system data is 100 times slower than the frequency of the network data. Thus, for every data sample of system data, there may be 100 or more samples of network data. In one example embodiment, the system data is provided at a rate of 1000-10,000 Hertz while the network data may be at 1 GHz or higher frequency. In one embodiment, the network data is at a rate that is greater than 10 times the data rate of the system data. As can be appreciated, there will be numerous samples of network data for each system data sample and, because of the use of the scrambler 1008, the system data will include numerous logic zero values and numerous logic one values. In such an embodiment, regardless of the particular amplitude modulation scheme utilized, the system data can be recovered.

Figure 11:
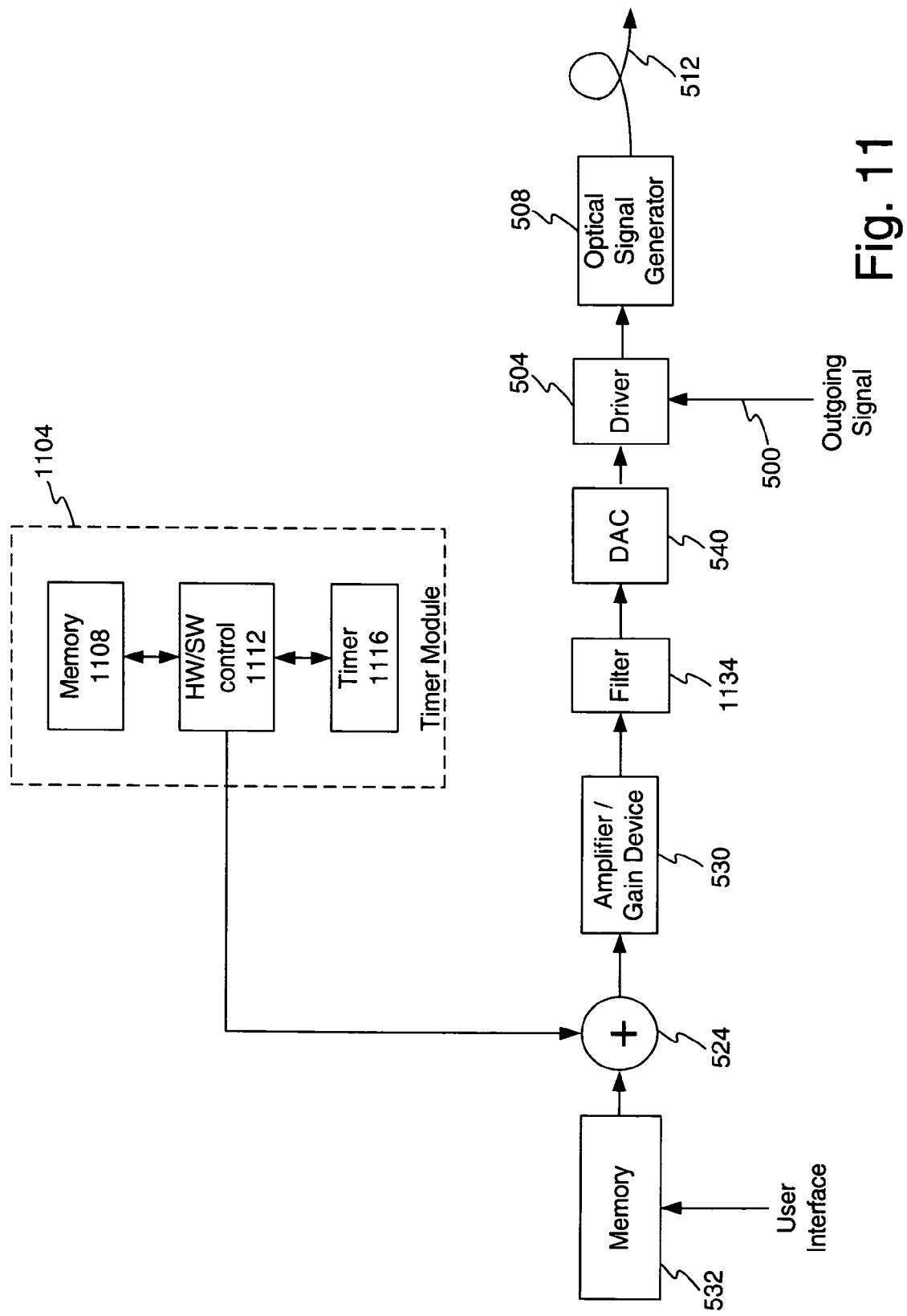
FIG. 11 illustrates a block diagram of an example embodiment of an optic signal power control system with a timer control system.

FIG. 11 illustrates a block diagram of an example embodiment of an optic signal power control system with a timer module. As shown, this embodiment shares one or more similarities with the embodiment of FIG. 5 and other embodiments, and as such, similar items are identified with identical reference numerals. Elements that are described above are not described again.

In this embodiment, the driver control structure described above receives a compensation or correction signal from a timing module 1104. In this example embodiment, the timing module 1104 comprises a memory 1108, a HW/SW control 1112 and a timer 1116. As shown, the timer 1116 comprises any element or device capable of tracking the in-service time, operational time, or age of the generator 508 or other components or systems. Any type device, such as, but not limited to, a timer, counter, clock, crystal, or periodic waveform generator may be utilized as the timer 1116.

The output of the timer 1116 comprises a signal representing the in-service time of the generator 508 or some other indicator of the generator's age, which may be an in-service time or an age value regardless of time that the generator has actually been in use. The HW/SW control 1112 operates in connection with the memory to analyze the time value from the timer 1116. In one embodiment, the HW/SW control 1112 utilizes the timer value as the compensation or correction value. In one embodiment, the HW/SW control 1112 processes the timer value into the compensation or correction value. In one embodiment, the HW/SW control 1112 utilizes the timer value as a look-up value to perform a look-up in memory 1108 to thereby retrieve a compensation or correction value stored in the memory. It is contemplated that in one embodiment, the HW/SW control 1112 may compare the timer value to a threshold time value, which may be stored in memory 1108 and if the time value is less than the threshold, then no compensation or correction signal is output, or a zero value is output.

The compensation or correction value is output to the junction 524 to modify the one or more control values from the memory 532. One or more compensation or correction values may be output from the timer module 1104. The other aspects of the system shown in FIG. 11 operate as described above. However, because this is an open-loop control system, the integrator 534 has been replaced with a filter 1134.

As described above, optic signal generator output power verses input current swing characteristics, such as, for example, the slope efficiency, is a function of temperature and device lifetime, i.e. the age of the generator. The temperature dependence of the slope efficiency may be intrinsic to the type of optic signal generator. Typically, the slope efficiency of the output power versus input current curve decreases as the temperature increases. Moreover, the slope can have a wide process variation range. If the slope efficiency changes, such as, in response to temperature changes, then the optical signal generation may generate a signal that has a different extinction ratio, which is related to slope efficiency, and which may be out of specification. In addition, different generators may also have different slope efficiencies, which may cause the optic signal power level to be at other than an optimum level. As a result, it may be desired to account for changes in temperature or performance differences between devices or circuits. By way of background, the extinction ratio is defined as the fraction of the optical power of the marks (ones) to the optical power of the spaces (zeros) in decibels. In one embodiment, it is desired to maintain the extinction ratio constant to avoid degradation or drift of the optic signal, which could lead to increased bit error rates.

Figure 12:
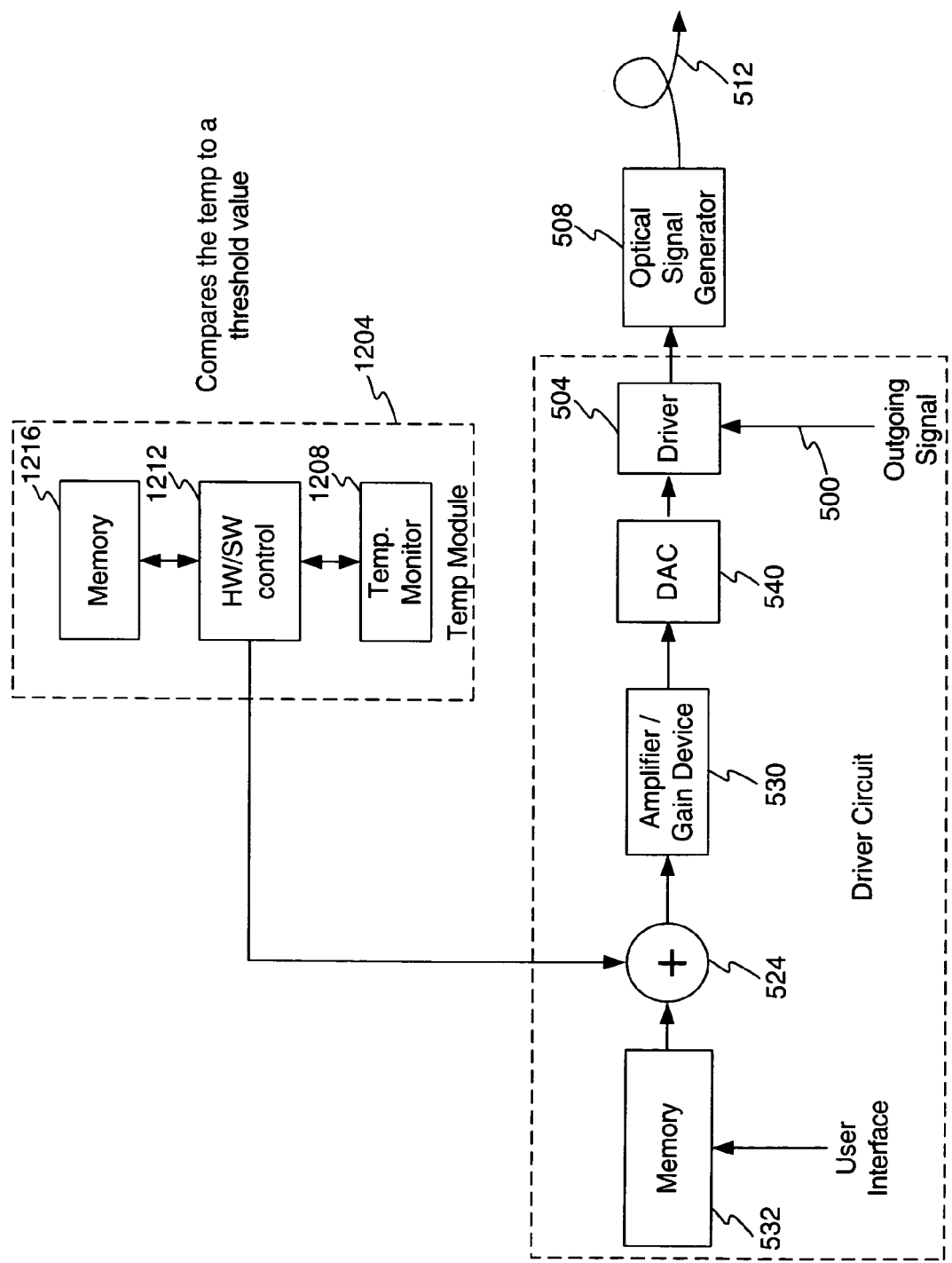
FIG. 12 illustrates a block diagram of an example embodiment of an optic signal power control system with a temperature module.

In one embodiment, the drawbacks and problems of the prior art may be overcome by utilizing a temperature module. FIG. 12 illustrates a block diagram of an example embodiment of an optic signal power control system with temperature monitor. As compared to FIG. 5, similar or identical elements are labeled with identical reference numbers. In this example embodiment, a temperature module 1204 comprises a temperature module 1208, a HW/SW control module 1212, and memory 1216. Other embodiments may adopt other configurations.

The temperature monitor 1208 comprises a device configured to output a signal, either digital or analog, representative of the temperature. The monitor 1208 may be external to the integrated circuit or configured as part of or built into the power control integrated circuit. Any type temperature monitor 1208 may be utilized and it may be calibrated, if necessary, in any manner.

The memory 1216 is configured to store one or more temperature threshold values. The temperature threshold values ($T_{thresh}$) may comprise one or more values representing a temperature value at which further increases in temperature will affect signal generator operation. Thus, it is contemplated that in one embodiment, for temperatures above the threshold value, the optical signal generator may behave differently, due to a different slope efficiency, and thus, compensation may be desired or necessary. Reference to FIG. 3A may be helpful in understanding this principle. The process, which may be employed by the embodiment of FIG. 12, is described in more detail below in connection with FIG. 13.

The output of the temperature monitor and the memory 1216 are provided to the HW/SW control module 1212. In one embodiment, the HW/SW control module 1212 is configured to compare the threshold value to the temperature monitor, and based on the comparison, output a temperature module output to the driver circuitry as shown. The temperature module output may comprise any type control signal or error signal. In one embodiment, the output of the temperature module 1204 comprises the threshold value or a zero value if the temperature is below the threshold temperature or a compensation value if the temperature is above the threshold temperature.

In addition, it is contemplated that the HW/SW control module 1212 may comprise logic and one or more comparators to perform a comparison between the threshold value and the temperature monitor value of the actual temperature.

The one or more outputs of the temperature module 1204 feeds into the junction 524 to thereby supplement or decrement the driver control values output from memory 532. It is also contemplated that the temperature module 1204 may output a zero value. Operation of the remaining elements may occur in a manner generally similar to that described above.

In this particular embodiment, however, the system is configured as a first order type system and, as such, higher order terms in temperature are not utilized (such as $T^2, T^3, \ldots T^N$). In other embodiments, the system may utilize second order or higher order temperature terms. (This is not a closed loop system so the integrator could make the system unstable as it will never have zero as an input. Higher order here refers to the use of higher order non linear terms of the independent variable temperature)

It is further contemplated that in one configuration or method of operation, the memory 1216 and HW/SW control module 1212, or any processor or controller, may be configured to store and process one or more equations or calculations and using these equations or calculations and the temperature monitor input, the system may arrive at desired or optimal compensation value to be provided as the temperature module output. By way of example, and not limitation, one or more equation coefficients may be stored in the memory 1216. The equations may comprise first through Nth order polynomials in temperature or temperature monitor value, where N comprises any positive whole number. In one embodiment, the following equation coefficients may be utilized, in conjunction with the detected temperature value from the temperature monitor and its higher order terms to calculate a compensation value to be output from the module 1204.

$C_T(T) \approx C_1 T + C_2 T^2 + \ldots + C_N T^N$. Where $C_T(T)$ is the compensation signal going to the junction 524, the coefficients $C_N$ for any integer N are stored in memory and T is the temperature value from the temperature monitor.

The coefficients $C_N$ may be arrived at utilizing least mean squared method, optimization methods, or any other type analysis. It is further contemplated that the coefficients may be arrived at using product data sheets, such as a data sheet for a particular signal generation device, or from in lab analysis and testing. In this manner, the system may be quickly and accurately tailored to any optic signal generator 508 or driver circuit, which may also suffer a performance change as the temperature changes.

The embodiment shown in FIG. 12 is an example embodiment and, as such, it is contemplated that one of ordinary skill in the art may arrive at different variations or arrangements without departing from the scope of the claims that follow. For example, the memory 1216 and memory 532 may be combined into a single memory module or separated into two or more elements as shown. In addition, the memory 1216 may be considered optional.

Figure 13:
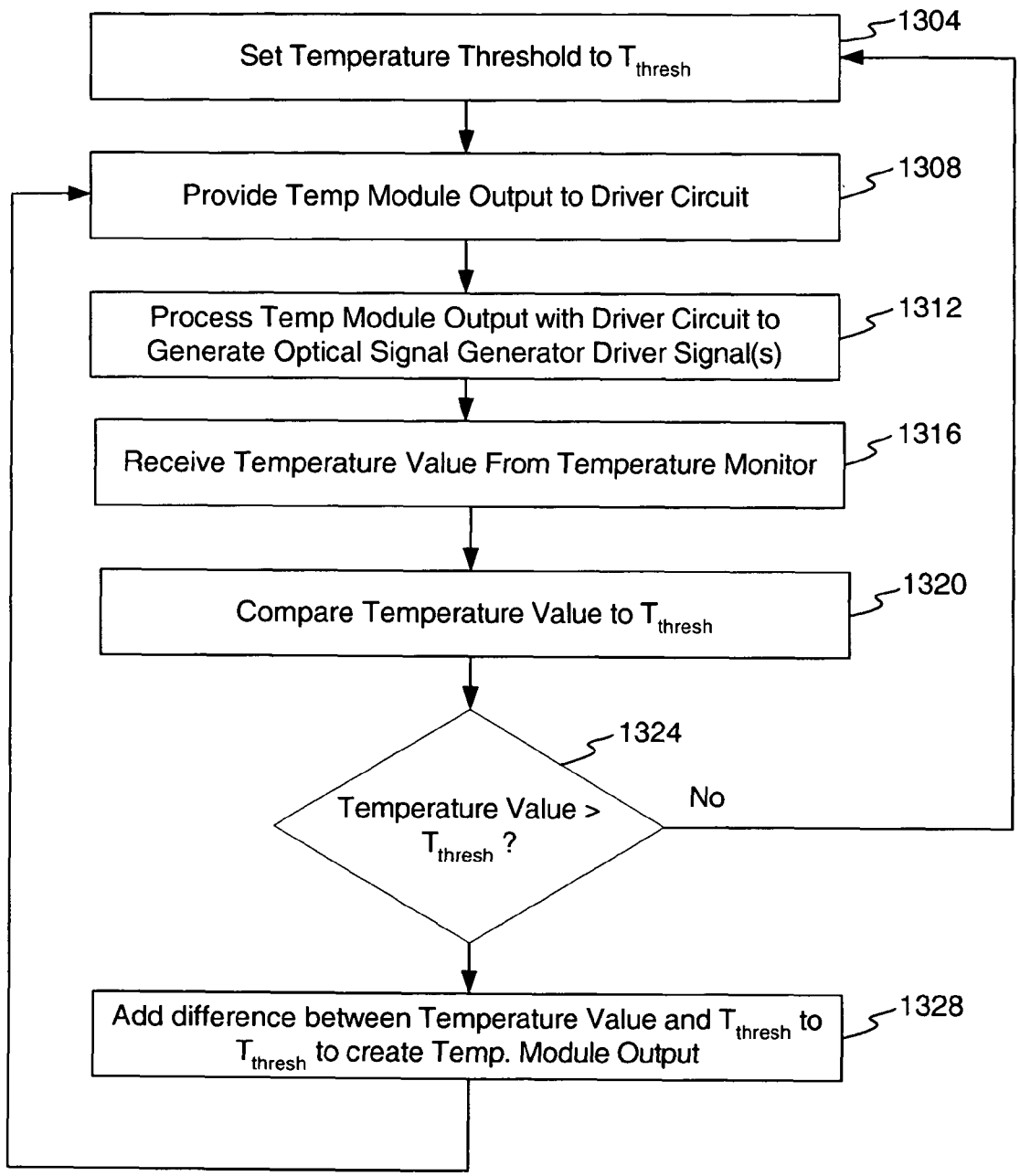
FIG. 13 illustrates an operational flow diagram of an example method of operation of a temperature controlled feedback system for optic signal power control.

FIG. 13 illustrates an operational flow diagram of an example method of operation of one example embodiment of the system shown in FIG. 12. As described above, other example methods of operation are possible in addition to the method described below. In addition, the structure of this method may be applied to methods, which monitor the optic signal power level, but which do not utilize a temperature monitor, such as, but not limited to, timer based systems or feedback based systems.

At a step 1304, the system sets the temperature module output to the temperature threshold value ($T_{thresh}$) as may be stored in memory. This may be considered as happening at startup or other specified times.

At a step 1308, the system provides the temperature module output to the driver circuit, such as to the junction 524 (FIG. 12). The output from the temperature module may comprise a compensation value. Thereafter, at a step 1312, the driver circuit may process and utilize the compensation value to generate an optical signal generator driver signal or a control signal that controls the driver. In this manner, the power of the optic signal is controlled.

Next, at a step 1316, the controller or processor receives the temperature value, representing the actual temperature, from the temperature monitor. At a step 1320, the operation compares the actual temperature value, from the monitor, to the threshold value. If at step 1324, the temperature value is less than or equal to the threshold value, then the operation returns to step 1304 and the threshold value is utilized as the output. Alternatively, instead of the threshold value being utilized, a zero value, or other value stored in memory may be utilized as the output from the temperature module or as a compensation value.

Alternatively, at a step 1324, the operation may determine that the temperature value is greater than the threshold value and, as such, the operation may advance to step 1328. In this embodiment, at step 1328, the system adds the difference between the temperature value and the threshold value to create the temperature module output. Alternatively, the difference value, or some other value, may be output as a compensation signal.

After step 1328, the operation will return to step 1308 and repeat as necessary during operation to compensate for changes in temperature and the effect these changes have on the optic signal generator or the driver.

Figure 14:
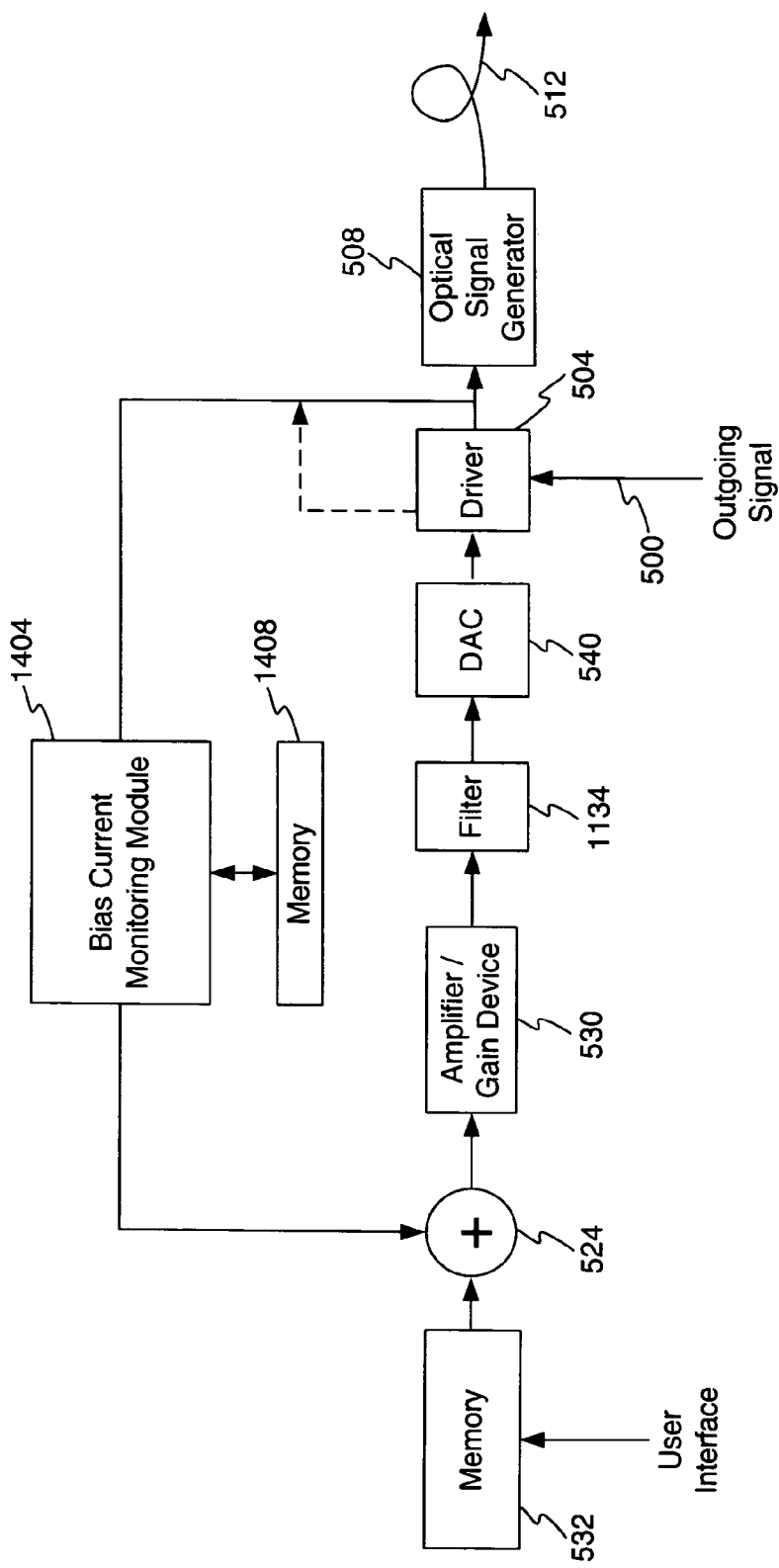
FIG. 14 illustrates a block diagram of an example embodiment of an optic signal modulation control system with a bias current feedback loop.

FIG. 14 illustrates a block diagram of an optic signal power control system utilizing bias current monitoring. This is but one possible example embodiment and, as such, it is contemplated that one of ordinary skill in the art may determine other embodiments or configuration that also monitor bias current, yet do not depart from the claims that follow. In general, any method of monitoring bias current may be utilized and the step or a system for detecting a current is generally understood, such as, through the use of peak detectors, comparators, A/D converters, trans-impedance amplifiers, current mirrors, as well as state machines used to control some or all of the aforementioned. As a result, the particular current detection system is not described in detail and the claims that follow are not limited to one particular type of current monitor.

In this embodiment, a bias current monitoring module 1404 connects to either the driver 504, one or more of the driver outputs as shown, or both. Via these connections, the bias current monitoring module 1404 receives the bias current value. Upon receipt of the bias current value, the bias current monitoring module 1404 is configured to process the bias current value to thereby generate a correction value, which may be output to the junction 524.

In one embodiment, the bias current monitoring module 1404 connects to a memory module 1408 or may communicate with memory 532. Either of the memories, or another memory, not shown, may store one or more threshold values to which the bias current value is compared. Based on this comparison, the correction value may be generated and provided to the junction 524. The comparison may occur using one or more comparators, control logics, or any HW/SW control module, and may occur in the analog or digital domain, any of which may be located in the module 1404. The difference between a threshold or optimum bias current value, that is stored in memory, and the actual bias current value may comprise the correction or compensation value, or may be used to retrieve a desired correction or compensation value that is stored in memory.

In one embodiment, the bias current monitoring module 1404 comprises processing capability configured to execute one or more equations. The equations may comprise any type equation selected to calculate a correction or compensation value based on the detected bias current value. In one embodiment, the equation comprises a polynomial configured compensate for optic signal power change and/or slope efficiency variations based on the detected bias current value.

As discussed above, monitoring and optional modification of the bias current and/or the modulation current may occur to account for changes to the circuit, such as may occur through use of varying parts, changes in temperature, changes over time or for any other reason. It is contemplated that simultaneous changes to both the bias current and the modulation current may be made. To aid in understanding, the bias level turns on the optic signal generator which is operated as an always on device. Differences between logic one and logic zero values are defined by differing intensity levels, not by turning the optic signal generator off. The modulation values control the intensity of the logic one and logic zero values, which are added to or superimposed on the bias level.

Figure 15:
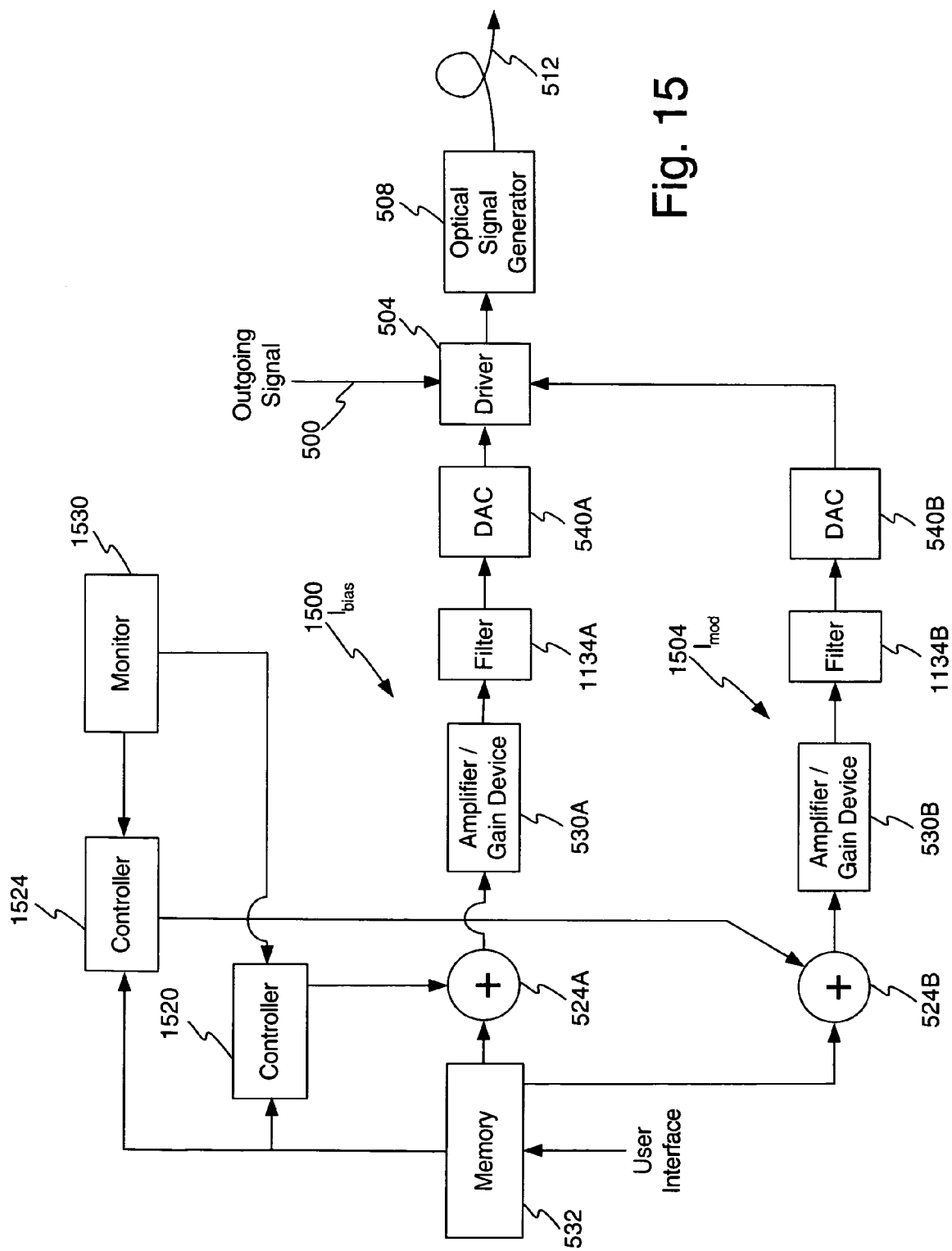
FIG. 15 illustrates a block diagram of an example embodiment of a dual mode control system.

FIG. 15 illustrates a block diagram of an example embodiment of a dual mode control system capable of adjusting, based on one or more monitored parameters, the bias current and the modulation current. As compared to FIG. 11, similar or identical elements are labeled with identical reference numbers. As shown, a first control path 1500 is configured to adjust the bias current ($I_{bias}$) while a second control path 1504 is configured to control the modulation current ($I_{mod}$).

The first control path 1500 comprises elements 524A, 530A, 1134A, 540A which have been described above in detail and hence are not described again. The second control path 1504 comprises elements 524B, 530B, 1134B, 540B which have been described above in detail and hence are not described again. The outputs of DACs 540A, 540B feed into the driver 504, which also receives the outgoing signal on path 500. The outgoing signal may comprise any signal to be transmitted over the channel 512. The driver 504 biases and modulates the outgoing signal to generate an electrical drive signal capable of and configured to drive the optic signal generator 508 thereby causing it to generate the optic signal, which is provided to the fiber 512. The optic signal may be monitored as shown and described above.

The input from DAC 540B to the driver 504 controls, modifies, or in some way may affect the modulation current or modulation level of the outgoing signal presented to the driver. Likewise, the input from DAC 540A to the driver 504 controls, modifies, or in some way may affect the bias current or bias level of the outgoing signal presented to the driver. Hence, the bias level control signal from path 1500 and the modulation level control signal from path 1504 control the biasing and modulation of the optic signal. These levels may be modified independently based on any desired parameter described herein and may be modified over time by a user via a user interface on memory 532.

To control or concurrently adjust the bias level, modulation level, or both, a control structure is provided and shown. In one example embodiment, a memory 532 stores default, or starting values for the biasing and/or modulation levels. The values stored in memory may comprise control values or the actual current (bias, modulation) values. These default values may define the levels at start-up and may be selected based on testing or monitoring after install. In one embodiment the desired values that the optic signal is modulated at or biased at may be referred to as target values. The target values may comprise the start-up values. These values may be changed or modified via the user interface as described above. The memory 532 may also be configured to store data or control information regarding the laser threshold, the laser slope efficiency, aging characteristics, compensation for rising or falling edge speeds, compensation for changes in crossing point between "0" and "1" levels as used in some long-distance links with optical amplification or other applications, compensation for offset and non-linearity of the received signal strength input or compensation for certain receiver characteristics used to compensate for the effects of pulse malformation after transmission through a long distance of medium, in most cases, but not all, fiber.

These values may be utilized to generate the targets for the bias and modulation current that are compared to the respective monitor values. They can further be utilized in either a look-up table, or formula with only a slope and intercept in the standard form of $y=mx+b$, or interpolation between two or more values on a line using averaging, linear interpolation or any other mathematical construct which may be employed to take voltage, time, and temperature into account to modify starting values loaded in memory, to keep laser optical output power to a level which meets the requirements of the chosen application. Values may compensate for laser threshold, the laser slope efficiency, aging characteristics, or any of the other characteristics described above.

In this embodiment, one or more memory outputs connect to bias junction 524A, modulation junction 524B, bias controller 1520, and modulation controller 1524. The controllers 1520, 1524 may comprise hardware, software, or a combination of both, configured to generate signals that adjust, modify, or supplement one or more of the bias current, bias current control signal, modulation current, and/or modulation current control signal. In one embodiment the controllers 1520, 1524 may comprise one or more of an ASIC, DSP, or control logic.

In one embodiment, it may be desired to maintain a constant power level(s) such as consistent biasing and modulation levels, regardless of temperature, time, or other factor. Any factor of the driver signal or optics signal may be modified or adjusted, by the controllers 1524, 1520 including, but not limited to, bias, modulation, frequency, non-linearities, laser characteristics, dispersion, rise time, fall time, fiber characteristics, or driver characteristics.

The memory 532 provides the default $I_{mod}$ and $I_{bias}$ values to the summing junctions 524A and 524B. These default values may serve as a starting point for the driver 504. The memory 532 may also output additional data to the controllers 1520, 1524. The additional data may comprise time or date values, or threshold values used for comparison purposes, by the controllers 1520, 1524, such as in comparison to data from a monitor 1530, which also connects to each controller. The additional data may also comprise supplemental driver control values to supplement $I_{bias}$ and $I_{mod}$. The additional data that is provided from the memory 532 to the controllers 1520, 1524 may also comprise formula with only a slope and intercept in the standard form of y=mx+b, or interpolation between two or more values on a line using averaging, linear interpolation or any other mathematical construct which may be employed to take temperature, time, voltage, or other characteristics into account to modify starting values loaded in memory, to keep laser optical output power and modulation to a level which meets the requirements of the chosen application.

The bias controller 1520 also receives an input from the monitor 1530. The bias controller 1520 processes the optional input from the memory 532 and the optional input from the monitor 1530 to generate an input to the junction 524A. This input from the controller 1520 to the junction 524A may change or modify the bias current in any manner, including but not limited to increasing or decreasing any aspect of $I_{bias}$, to thereby force the driver 504 to generate the desired driver signal to the optic signal generator 508.

The modulation controller 1524 also receives an input from the monitor 1530. The modulation controller 1524 processes the optional input from the memory 532 and the optional input from the monitor 1530 to generate an input to the junction 524B. This input from the controller 1524 to the junction 524B may change or modify the modulation current in any manner, including but not limited to increasing or decreasing any aspect of $I_{mod}$, peaking current, duty cycle, rise time or fall time to thereby force the driver 504 to generate the desired driver signal to the optic signal generator 508.

The monitor 1530 may comprise any type monitor capable of monitoring an aspect of the optic module, optic signal, an environmental aspect, or any other aspect that may provide information capable of processing by the controllers 1520, 1524. In one embodiment the monitor 1530 comprises a temperature monitor that outputs temperature information. The bias current and/or the modulation current may be adjusted based on temperature. The monitor may also comprise a timer or counter capable of monitoring or tracking some time variable of the optic module, such as time in service. The monitor may also comprise any device configured to measure parameters including, but not limited to average optical power, peak optical power, pre-emphasis (peaking), or duty cycle distortion. In one embodiment the monitor 1530, and one or more controllers 1524, 1520 may be configured to perform calculations that generate a control signal or modification to the junctions 524 to accounts for one or more factors, including, but not limited transmit power level (average and/or peak), time of operation for various transmit power levels, new or updated driver 504 or generator 508 behavior properties or patterns, temperature, wavelength, pre-emphasis (peaking), or duty cycle distortion. By performing algorithm directed processing based on multiple factors, an accurate control signal may be generated that allows a highly accurate optic signal to be generated.

Figure 16:
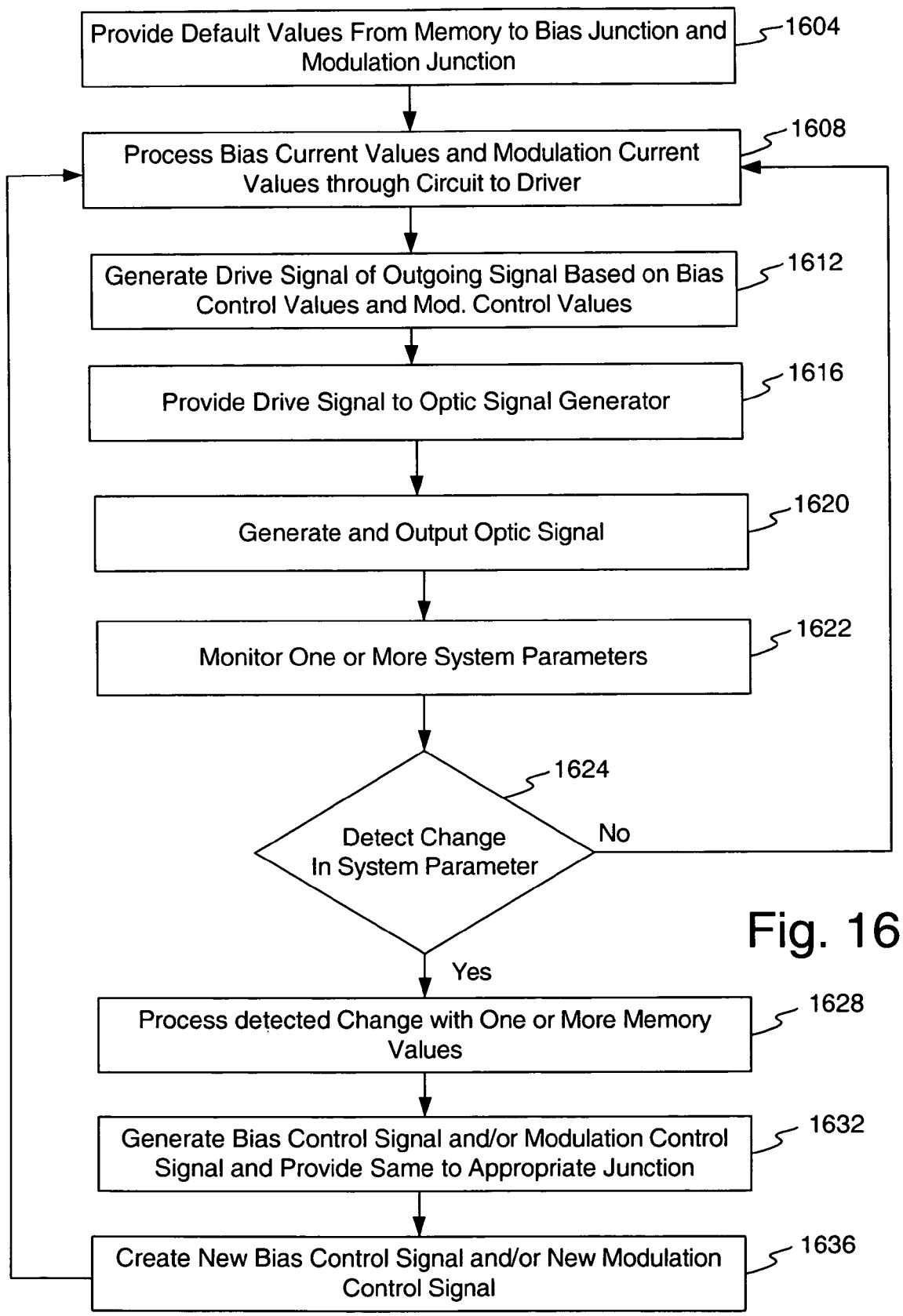
FIG. 16 illustrates an operational flow diagram of an example method of operation.

FIG. 16 illustrates an operational flow diagram of an example method of operation. In this example embodiment, the operation of the embodiment of FIG. 15 is discussed. In other embodiments the operation may change depending on the configuration of the system. In this example embodiment, at a step 1604 the memory or other element provides the default bias value and/or default modulation value to the bias junction and the modulation junction respectively. At this stage, such as for example start-up, there may not be a supplemental or control value from the controllers and hence the junction passes the default signal through to the subsequent circuit components. Thus, at a step 1608, the signals from the junctions, at this time the default bias current value and the default modulation current value, which may be stored in memory, are provided through the circuit to the driver.

At a step 1612, the driver generates a drive signal that represents the outgoing signal. The drive signal is based on or in some manner controlled by, at this stage, the default bias current value and the default modulation current value. Thereafter, at a step 1616, the operation provides the drive signal to the optic signal generator and at a step 1620 generates and outputs the optic signal. The optic signal has a bias level and modulation characteristic controlled by the output from the junctions (element 524, FIG. 15).

At a step 1622, the operation monitors one or more system parameters for a change, such as a change that may require adjustment to the modulation current or bias current. At a decision step 1624, the operation determines if one or more parameters have changed. The parameters may comprise any of the following, or any other parameter: temperature, time, detected signal power, peak values, detected bias level, detected modulation levels, wavelength, pre-emphasis (peaking), or duty cycle distortion.

If at decision step 1624 the operation determines that the parameters have not changed, then the operation returns to step 1608 as shown. Alternatively, if the decision step of 1624 determines that a parameter has changed then the operation advances to step 1628 and the system, such as a controller, processes the detected change with optional memory values to generated control values that adjust one or both of the default bias and modulation values that are stored in the memory.

At step 1632, the operation generates a bias control signal and/or a modulation control signal. This may be provided to the appropriate junction where they are combined with the default values stored in memory. It is contemplated that either or both of the bias level and modulation level may be adjusted thereby providing greater levels of control as compared to prior art systems that adjust just one aspect. In one embodiment both factors are concurrently or simultaneously adjusted. Thus, at step 1636, the operation creates the new bias control signal and/or new modulation control signal, and thereafter returns to step 1608 wherein the process may repeat.

The following equations may define the various current values within the optic module during AC coupling and DC coupling operation. In this set of equations, $i_0$ and $i_1$ define the current values which generates an optic signal logic value zero and an optic signal logic value one respectively, then for an AC coupled environment:

$$i_0 = i_{bias} - \frac{i_{mod}}{2}$$

and $$i_1 = i_{bias} + \frac{i_{mod}}{2}$$

For a DC coupled environment, where $i_0$ and $i_1$ define the current which generates a logic value zero and a logic value one respectively, the following equations hold true:

$$i_0 = i_{bias}$$

and $$i_1 = i_{bias} + i_{mod}$$

If $i_x$ represents either $i_0$ or $i_1$, as a result if $i_{th} < i_x$, where Ith is the laser threshold current, then $$P_x = \epsilon(i_x - i_{th})$$

such that $\epsilon(T)$ is a function of temperature and is expressed in mW/mA and $i_{th}(T)$ is a function of temperature and expressed in mA. If $i_{th} > i_x$ then $P_x \approx 0$.

Figure 17:
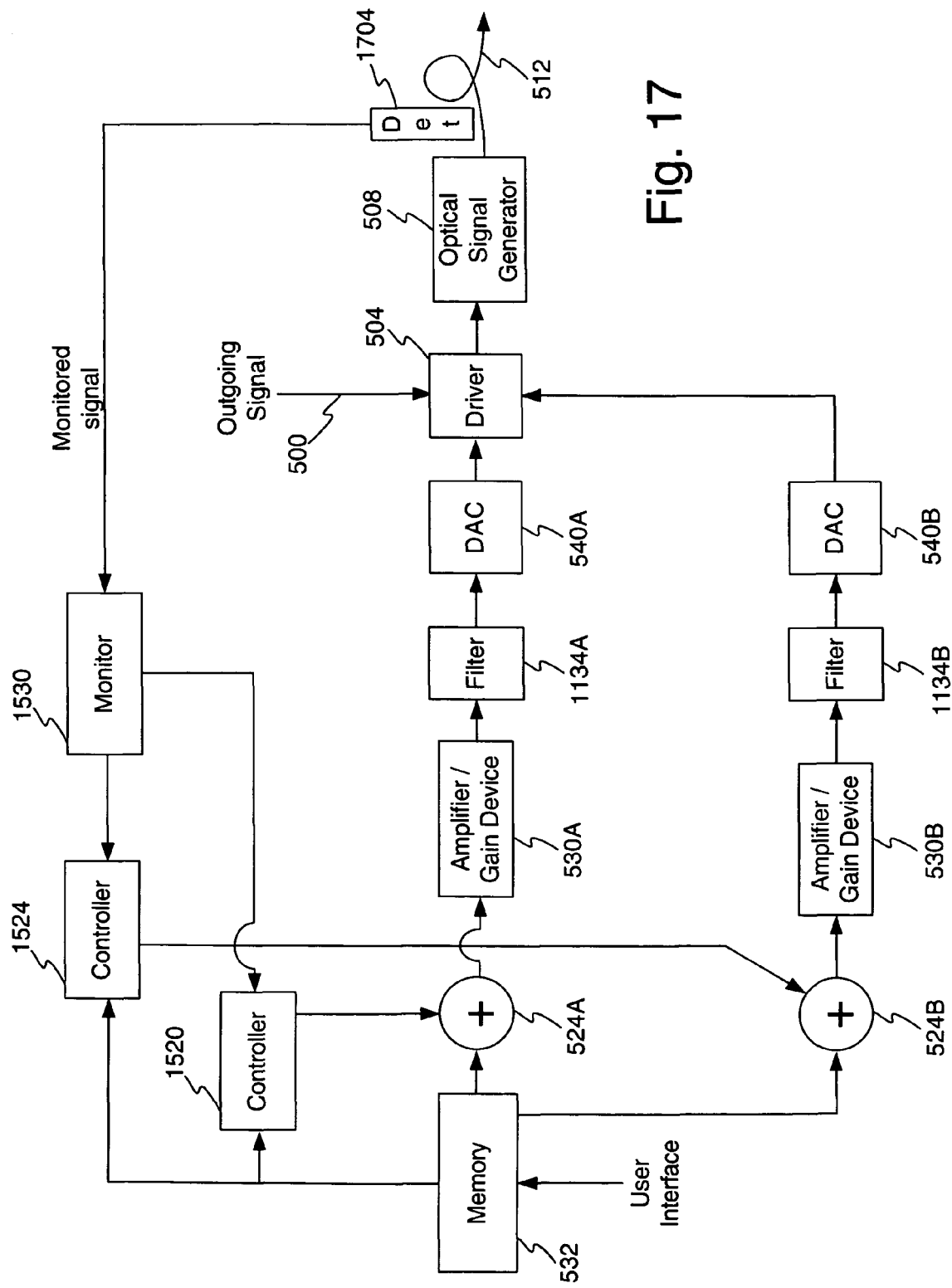
FIG. 17 illustrates a block diagram of an example embodiment of a dual current controller configured in a closed loop configuration.

FIG. 17 illustrates a block diagram of an example embodiment of a dual current controller configured in a closed loop configuration. This is but one possible example embodiment provided for purposes of discussion. As such, other embodiments may be created which do not depart from the claims that follow. As compared to FIG. 16, identical or similar elements are labeled with identical reference numbers and the focus of the discussion is on new aspects. In this example embodiment a detector 1704 detects the generated optic signal. In one embodiment the detector 1704 comprises a photodetector that converts the optic signal to an electrical feedback signal, which is in turn provided to the monitor 1530.

The monitor 1530 processes or forwards the feedback signal in a format suitable for use by the controller, or the feedback signal may be provided directly to one or more of the controllers. Both or either of the modulation current and the bias current may be adjusted based on the actual optic signal generated and detected. This embodiment real time monitoring of the signal may be used to generate a feedback signal that is processed to dynamically control one or more of the module and bias current.

While various embodiments of the invention have been described, it will be apparent to those of ordinary skill in the art that many more embodiments and implementations are possible that are within the scope of this invention. In addition the various components may be combined or enabled alone, or in any combination.

Furthermore, as is commonly understood, modern communication systems transmit data between remote locations to achieve information transfer. This process occurs in electronic devices other than communication systems to rapidly exchange or transfer data between systems. One such exemplary environment is within an optical communication system.

Figure 18:
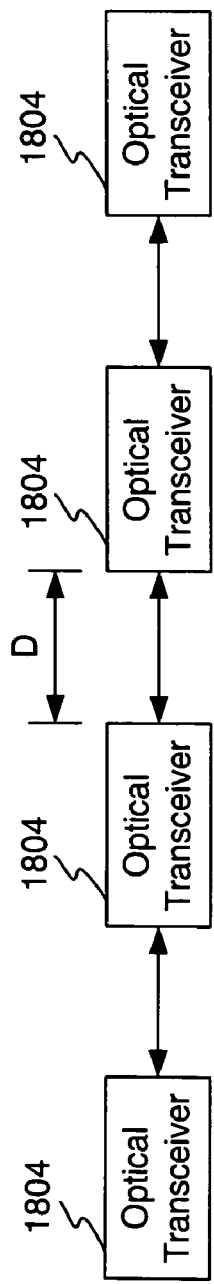
FIG. 18 illustrates a block diagram of a prior art optical communication system.

FIG. 18 illustrates an exemplary prior art optical communication system. As shown, an optical transceiver 1804 communicates with another transceiver. However, each transceiver 1804 communicates with one other transceiver, and thus, the distance between the transceivers is a single distance D. In addition, prior art communication systems are configured as always for constant transmit environments. Thus, bits of data are continually being transmitted from one transceiver to another. As a result, the power level of the signal is known and over time, the receiver associated with a transceiver may be trained to perform with a low bit rate (BER) for a given received signal power level.

Figure 19:
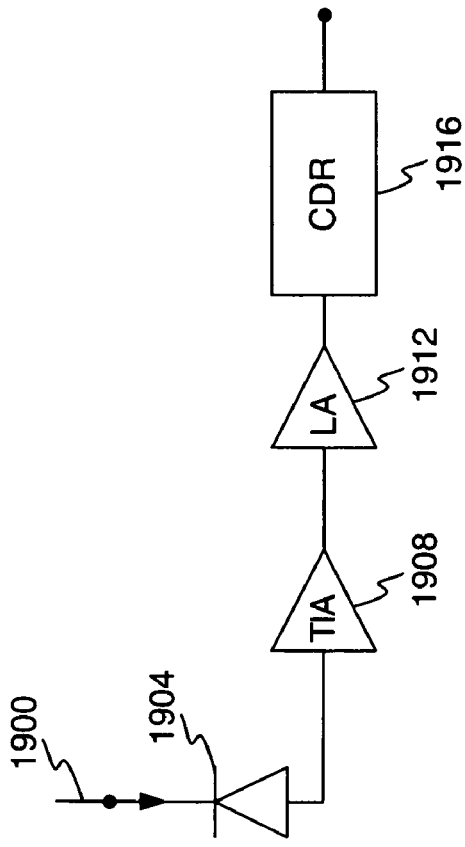
FIG. 19 illustrates a block diagram of an example embodiment of a prior art receiver for use in an optical communication system.

As a result, optical receiver structure shown in FIG. 19 may be utilized. As shown, an optical detector 1904, such as a photo diode, receives an optic signal from an optic fiber 1900. The optical detector 1904 converts the light energy to an electrical current representative of the optic signal.

The optical detector 1904 connects to a trans-impedance amplifier (TIA) 1908 which converts the current to a voltage and may optionally perform amplification of the signal. The output of the TIA 1908 feeds into a limiting amplifier 1912 which may perform precision amplification on the signal before providing the signal to a clock data recovery circuit (CDR) 1916 or other downstream processing. The limiting amplifier 1912 may also perform a decision operation.

While this circuitry is adequate for prior art application, such as the example environment shown in FIG. 18, it is unable to meet the specification when data acquisition must occur with a limited time period or a limited number of bits. In particular, certain signals received by the optical detector may not arrive at a consistent magnitude over time, or may arrive in bursts, or both. As a result, the prior art method for TIA construction and limiting amplifier construction is unable to rapidly adapt to changing signal magnitudes or burst mode signals. Such prior art designs utilize servo loops, or feedback loops, which have a time constant that settles at an undesirably slow rate. Consequently, prior art designs are unable to operate in environments that require rapid acquisition, which is to say rapid reduction in BER, of a signal that varies in magnitude and continuity.

The method and apparatus described below overcomes these drawbacks and provides additional advantages.

Figure 20:
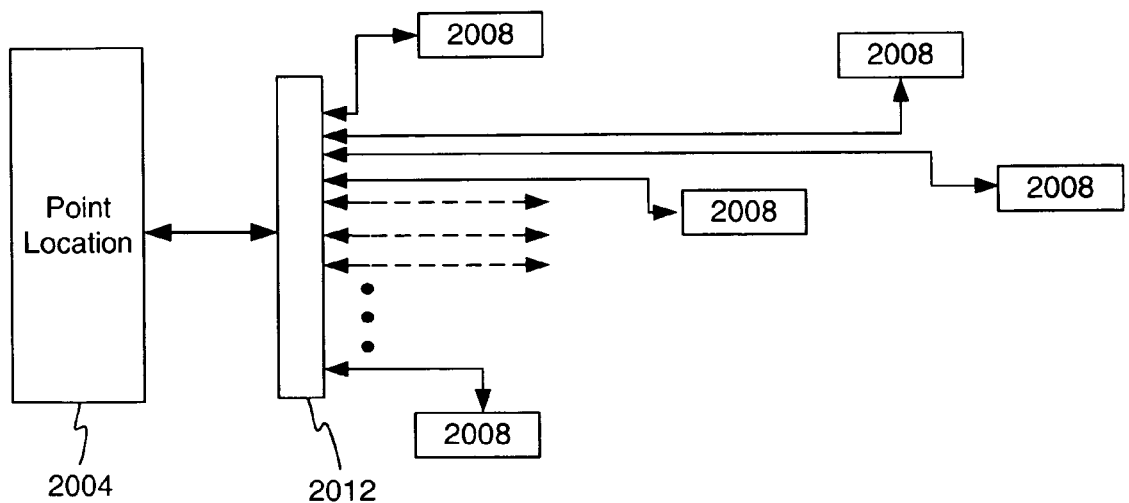
FIG. 20 illustrates a block diagram of an example environment of a passive optical network.

In contrast to prior art designs for limiting amplifiers and TIA devices, the limiting amplifiers and TIA devices disclosed herein are capable of rapid signal acquisition to achieve low bit rate processing in a short time period. As a result, such embodiments are useful in a variety of prior art environments and new applications. One such example environment is shown in FIG. 20. As shown in FIG. 20, a passive optical network is one such example environment. As compared to FIG. 18, the network configuration shown in FIG. 20 utilizes multi-point location 2004 that communicates with multiple remote locations 2008 over two or more optic communication channels that may optionally be combined into a single fiber at a splitter 2012, multiplexer, or other device configured to operate as shown. In this example environment, the multi-point location 2004 utilizes a receiver that multiplexes its resources with the two or more remote locations, which are located at various different distances from the point location.

Figure 21:
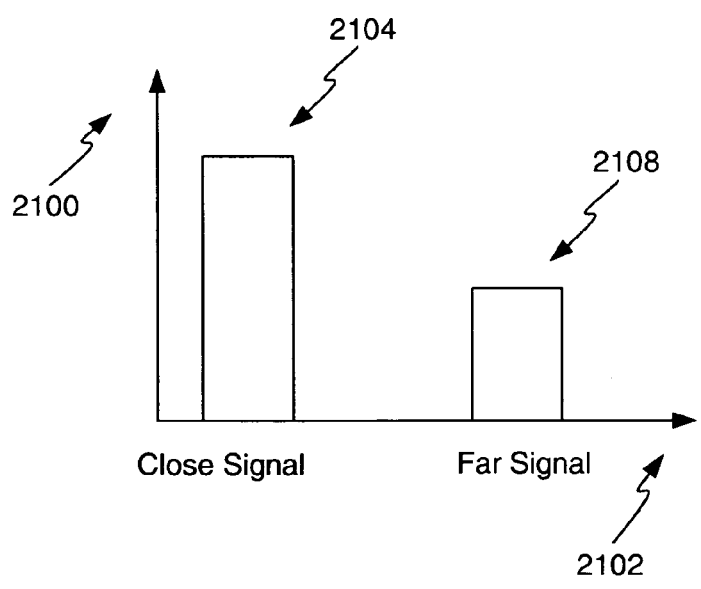
FIG. 21 illustrates a block plot of exemplary signal magnitudes which vary over time due to varying transmit distances.

In one embodiment, the receiver of the multi-point location 2004 utilizes time multiplexing such that each remote location 2008 is assigned a time slot during which it may transmit to the point location. Consequently, signals received by the multi-point location receiver are arriving at different magnitudes due to attenuation of the signal, which in turn is dependant on the distance of the remote location 2008 from the multi-point location 2004. FIG. 21 illustrates exemplary plots of exemplary signals received at the multi-point location 2004 of the communication system shown in FIG. 20. A horizontal axis 2102 represents time while a vertical axis 2100 represents signal magnitude. A first signal 2104 represents a signal received from a remote location transmitter located close to the multi-point location. As such, the magnitude of this signal is large, as compared to a signal received from a more distant remote location transmitter.

In contrast, signal plot 2108 represents a signal received from a distant remote location transmitter. As compared to plot 2104, the signal represented by plot 2108 is of lower magnitude when received at the multi-point location due to attenuation from the long transmission distance.

The varying magnitude of the signals received at different times, such as during the different time slots of time multiplexed operation, causes challenges for the receiver architecture of the point location because it may be necessary or desired to rapidly process the received signal at a low error rate. By way of example, specification for one exemplary passive optical network (PON) requires a bit error ratio (BER) of $10^{-10}$ within 10 bits. At the data transmit rate of the specified 2.5 Gbit/sec this equates to only 4 nanoseconds to settle to the desired BER. As described above in the background, the time constant and other characteristics of the prior art loops make achieving this specification impossible or require expensive and commercially unfeasible designs.

Figure 22A:
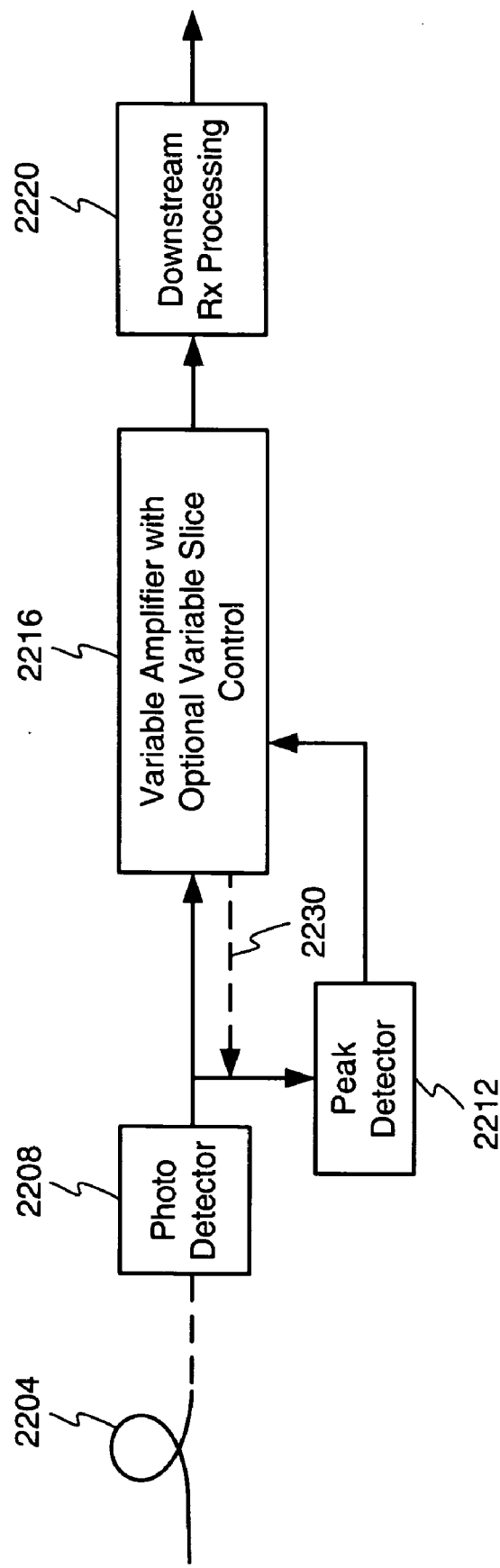
FIGS. 22A and 22B illustrate a block diagram of an example embodiment of a signal amplifier with an optional decision device configured for rapid acquisition.

FIG. 22A illustrates a block diagram of an example embodiment of a signal amplifier with an optional decision device configured for rapid acquisition. This is but one example embodiment and, as such, it is contemplated that other embodiments may be arrived at without departing from the scope of the claims that follow. In this example embodiment, an optic channel 2204 carries one or more signals, which are provided to a photo detector 2208. Although shown in an optical environment, the principle disclosed herein may be utilized in any environment and, as such, the channel may comprise any type channel including, but not limited to, metallic conductor, such as twisted pair, coaxial cable, and circuit board traces; or a free space channel such as for wireless communication.

The photo detector 2208 converts the received optic signal to a corresponding electrical signal, which in turn is provided to a peak detector 2212 and a variable amplifier with optional variable slice control 2216 (hereinafter variable amplifier module). The term peak detector is defined to mean any device that is capable of determining or measuring the peak value, common mode value, average value, or any other indicator or information regarding a signal power level or peak magnitude. The peak detector 2212 may optionally comprise control logic, processor interface, processor capability, or other control capability. In one embodiment, the peak detector 2212 is configured to detect the peak of the received signal. This peak value may be provided directly to the variable amplifier module 2216 or processed, such as by the control aspects of the peak detector to provide one or more signals that are tailored to control or activate the variable amplifier module 2216 as desired and described herein. The output of the variable amplifier module 2216 may be provided an apparatus to perform downstream receiver processing 2220 as would be understood by one of ordinary skill in the art.

In another embodiment the input to the peak detector 2212 is provided from the variable amplifier 2216 via input 2230 shown as a dashed line in FIG. 22A. It is contemplated that the variable amplifier 2216 may comprise one or more transimpedance amplifiers (TIA) which may have a low impedance and this impedance may change if the TIA employs automatic gain control. As a result, it may be desirable to detect the peak of the signal after one or more stages of the variable amplifier instead of before the variable amplifier. It is further contemplated that any of the embodiments shown or discussed herein may be configured with the input to the peak detectors arriving from the input to the amplifier stage or arriving after one or more stages of amplification. As such, the illustrations, discussions or claiming of a peak detector input should be interpreted as meaning the input to the peak detector may comprise the input to the amplifier stages or after one or more stages of amplification.

The variable amplifier module 2216 comprises one or more amplifier stages, one or more decision devices, or both. The variable amplifier module 2216 performs a desired level of amplification on the received signal based on the input from the peak detector 2212. The level of amplification may be dependant on the peak value of the received signal. The decision device operation, such as a slicer operation, may be dependant on the peak value of the received signal.

In one embodiment, the variable amplifier module 2216 comprises two or more amplifier stages, which are controlled by a signal from the peak detector. Responsive to the peak detector, the amplifiers 2216 apply a desired amount of gain to the received signal. As a result, slice decisions may occur upon a signal after the signal has undergone a desired amount of amplification. In addition, the peak detector may rapidly detect the peak, thereby allowing for rapid determination of the peak level and the amount of amplification to meet the needs of the particular application.

While the particular needs of a receiver system may vary between applications, in one embodiment, it is desired to perform a slice operation at the point of maximum amplification of the signal but before the signal is amplified into saturation. This allows for a widening of the eye, when the received signal is represented in terms of an eye diagram, and as such, more accurate slice decision may be made. This results in a reduced BER. By rapidly detecting the peak value of the signal, applying the desired level of amplification, and knowing when to perform a slice operation with a decision device, a received signal may be accurately and quickly sliced to yield a digital or otherwise quantized signal. This is true even when the magnitude of the received signal is unknown, such as in a passive optical network environment or any other application where the power level of a received signal is unknown and it is desired to rapidly and accurately acquire the received signal.

Figure 22B:
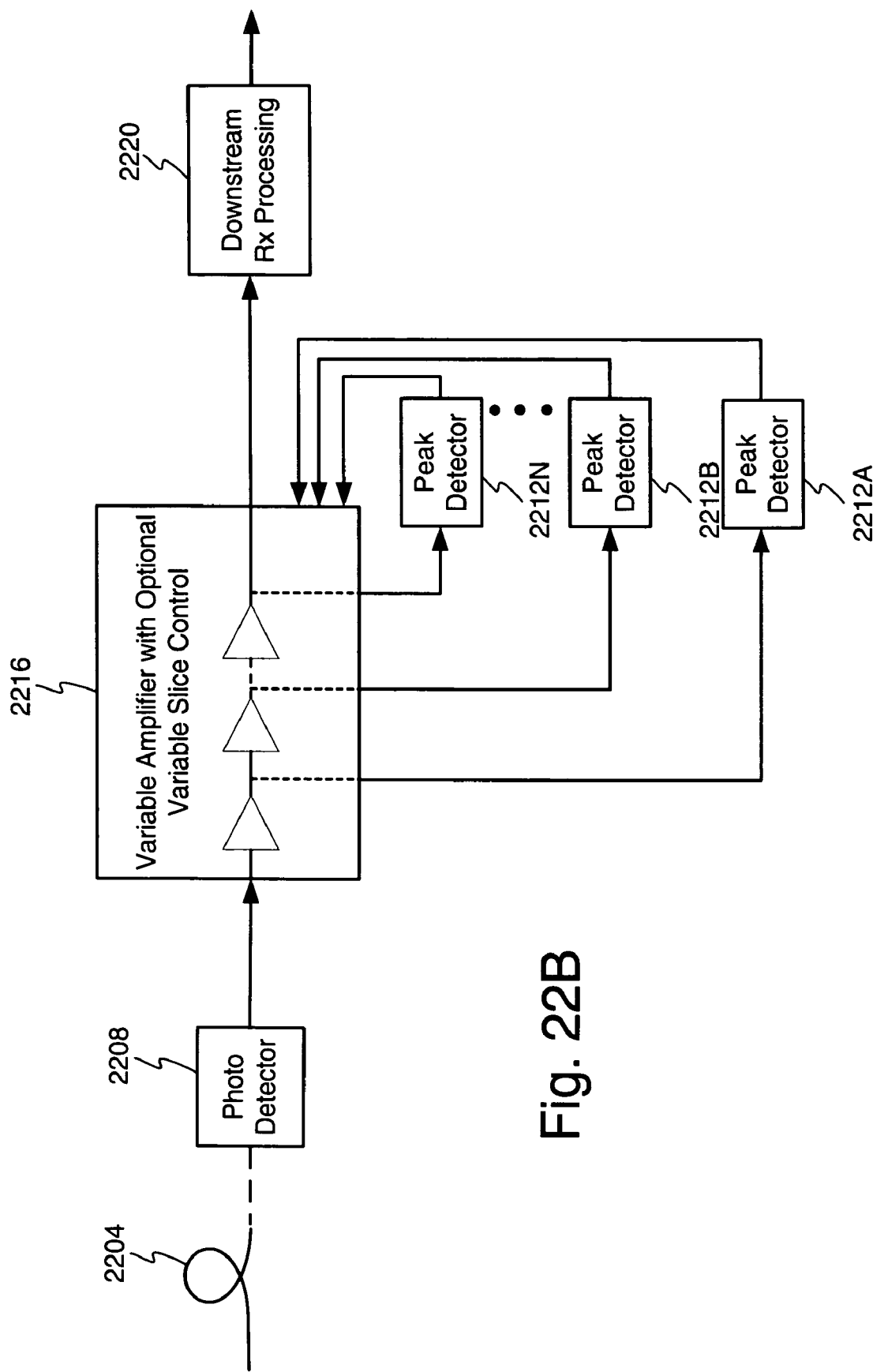

FIG. 22B illustrates a block diagram of an example embodiment of a signal amplifier configured for rapid acquisition with multiple peak detectors. As compared to FIG. 22A, identical elements are labeled with identical reference numerals. In contrast to the embodiment of FIG. 22A, this embodiment utilizes two or more peak detectors 2212A-2212N, where N may comprise any whole number. Use of two or more peak detectors 2212A-2212N may be well suited to process received signals that have a wide dynamic range. For such a signal, a single peak detector may lack the dynamic range necessary to correctly select the appropriate amplification slice point. It is further contemplated that any of the embodiments shown or discussed herein may be configured with multiple peak detectors and as such, the illustration, discussion or claiming of a peak detector should be interpreted as meaning one or more peak detectors.

Figure 23:
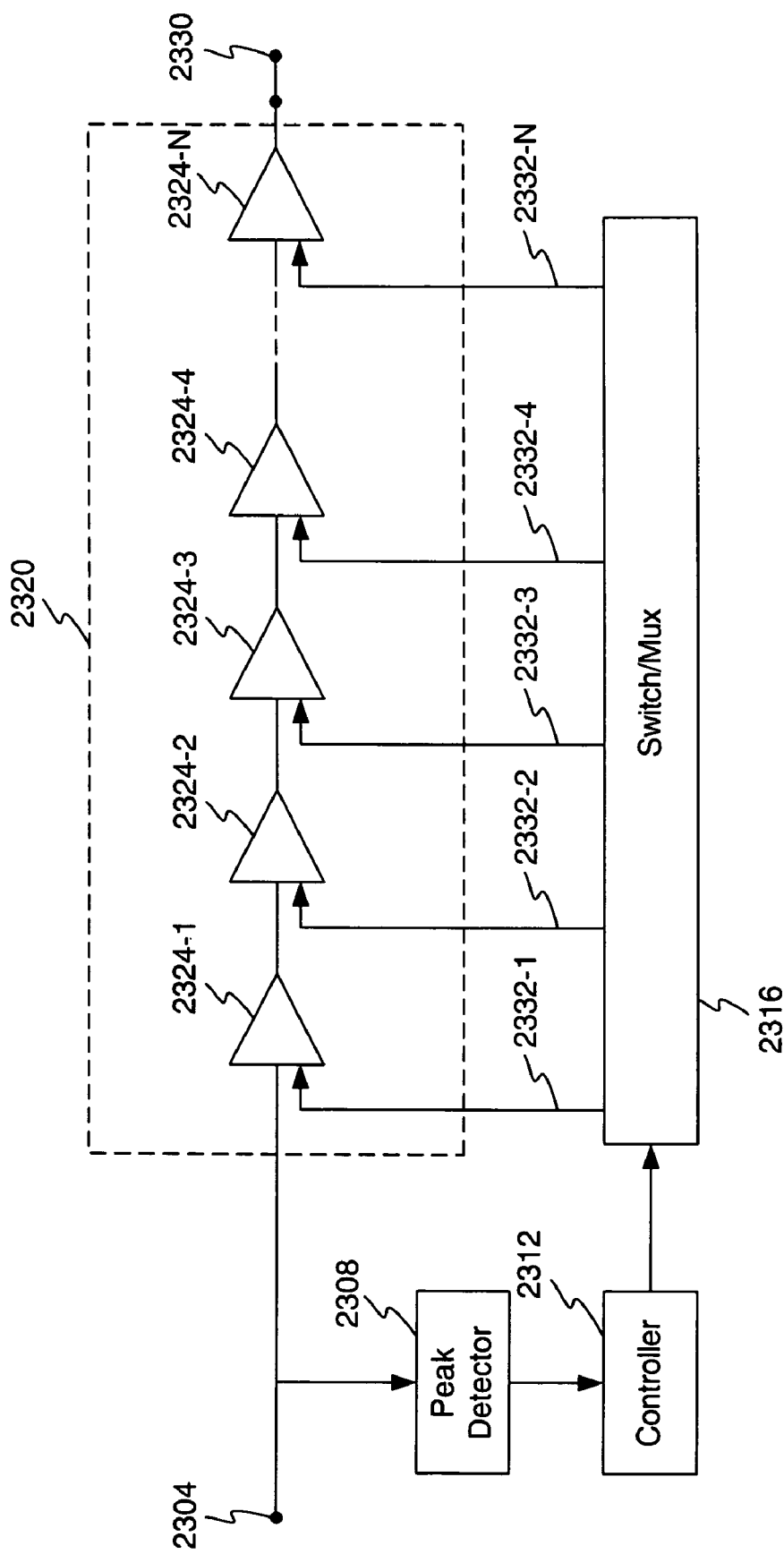
FIG. 23 illustrates an example embodiment of a multi-stage amplifier configured with a peak detection based control system.

FIG. 23 illustrates an example embodiment of a multi-stage amplifier configured with a peak detection control system. This is but one possible example embodiment and as such, other embodiments may be configured that do not depart from the claims that follow. As shown, an input 2304 receives one or more signals over time. The one or more signals may arrive at different power levels or magnitudes. The input 2304 connects to a peak detector 2308 and a multi-stage amplifier 2320, which is discussed below in more detail.

The peak detector 2308 connects to controller 2312, which in turn connects to a switch or multiplexer device 2316. The switch 2316 has one or more control lines that connect to the amplifier 2320. The peak detector 2308 is configured to rapidly detect the peak of a received signal. Peak detection may occur using any method or system as would be understood by one of ordinary skill in the art. As an advantage over prior systems, the peak detector 2308 detects the peak value quickly and thus, operation speed is not limited by loop bandwidth, time constants, feedback delays or other prior art limitations. In addition, peak detection is readily implemented on an integrated circuit and does not consume undesirably large percentages of space, power, or processing resources.

The controller 2312 may comprise any type apparatus configured to output a control signal to the switching structure 2316 responsive to the peak detector output. In one embodiment, the controller 2312 compares the input from the peak value to one or more thresholds and is dependant on the peak value, outputs a control signal to the switch 2316. In one embodiment, the control logic may comprise analog or digital logic, a processor, one or more comparators, and appropriate reference levels, which may be stored in memory or provide in some other manner.

Turning now to the amplifier 2320, in one embodiment, the amplifier 2320 comprises two or more amplifier stages 2324-1, 2324-2, 2324-3, . . . 2324-N, wherein N equals any whole number. As shown, each stage 2324 cascades into the subsequent stage, and as a received signal passes from one stage to the next, the signal is amplified. One or more aspects of one or more stages may be controlled by the control signals from the switch 2316. In one embodiment, one or more of the amplifier stages 2324 are equipped with or capable of performing a slice operation on the received signal. The control signals may thus be configured to activate a slice operation on the received signal, based upon the output of the amplification stage 2324, that will provide optimum amplification while still avoiding signal saturation.

During one exemplary method of operation, the system of FIG. 23 is configured to slice the signal after the signal is amplified, but before saturation. Upon receiving a signal, the signal is provided to the amplifier 2320 and a peak detector 2308. The peak detector 2308 processes the received signal to calculate the peak magnitude or other power or magnitude indicator for the received signal. The peak value or other signal related to the peak value is provided to the controller 2312 or directly to the switch 2316. If so configured, the controller 2312 may process the peak value, such as to compare the peak value to one or more threshold values. In so doing, the controller 2312 may generate an output to the switch 2316 that, based on the magnitude of the received signal, will control the switch to selectively provide one or more control signals to the amplifier 2320 to thereby control which stage 2324 will perform a slice operation on the signal.

By way of example, if a received signal has a large magnitude, then the signal, when progressing through the stages 2324 of the amplifier, may saturate at one of the early stages. To insure that the slice operation occurs before saturation of the signal, the peak detector detects the peak or other magnitude indicator and in connection with the controller 2312 and switch 2316 provides a control signal to the amplifier via control lines from the switch to perform the slice operation at the input of the second stage, in this embodiment stage 2324-2. It is contemplated that the magnitude of the received signal would saturate at the output of the second stage and this would compress the size of the eye. Thus, the second stage 2324-2 performs the slice operation.

In contrast, upon reception and peak detection of a signal having a low or small magnitude, the controller and switch 2316 force a later amplifier stage to serve as the decision device to perform a slice operation. As a result, the signal undergoes more amplification before the slice operation occurs. Thus, responsive to such a signal, stage 2324-4 may be controlled to perform the slice operation. In this manner, the slice operation will occur on a fully amplified signal that has not been amplified to the point of saturation.

Figure 24:
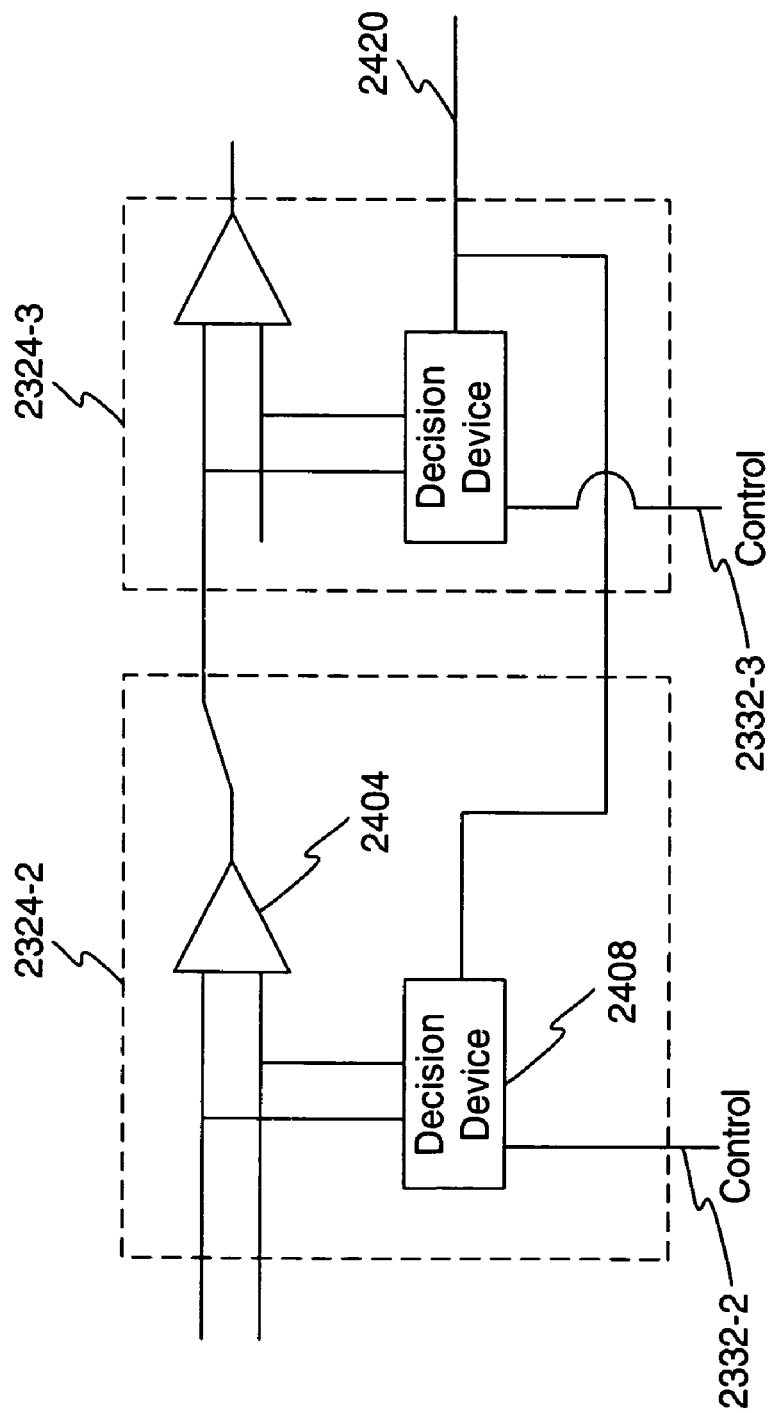
FIG. 24 illustrates an example embodiment of a pair of amplifier stages as shown in FIG. 23.

FIG. 24 illustrates an example embodiment of a pair of amplifier stages, shown as elements 2324 in FIG. 23. This is but one example embodiment and, as such, it is contemplated that one of ordinary skill in the art may generate other embodiments for amplification and slice operation. In this example embodiment, each stage is configured generally similarly and, as such, only stage 2324-2 is described in detail. As shown, an amplifier 2404 receives an incoming signal from the preceding stage or from a photo detector (not shown in this embodiment). The input ports of the amplifier 2404 also connect to a decision device 2408 thereby providing access to the signal for the decision device. The decision device 2408 also receives a control signal on control line 2332, in this embodiment from the switch shown in FIG. 23. Responsive to the control signal on the control line 2332-2, the decision device 2408 performs a slice operation on the received signal. The output of the decision device is output on a common decision device output line 2420.

Absent a control signal on control line 2332-2, the amplifier 2404 amplifies the signal and outputs the amplified signal to the subsequent stage 2324-3, which performs in a similar manner to that shown and described for stage 2324-2. In this fashion, the magnitude of a received signal is detected, and responsive to this peak value, amplified through one or more stages to create a signal of desired amplitude which has not yet entered saturation or the level of saturation does not interfere with decision device operation.

Figure 25:
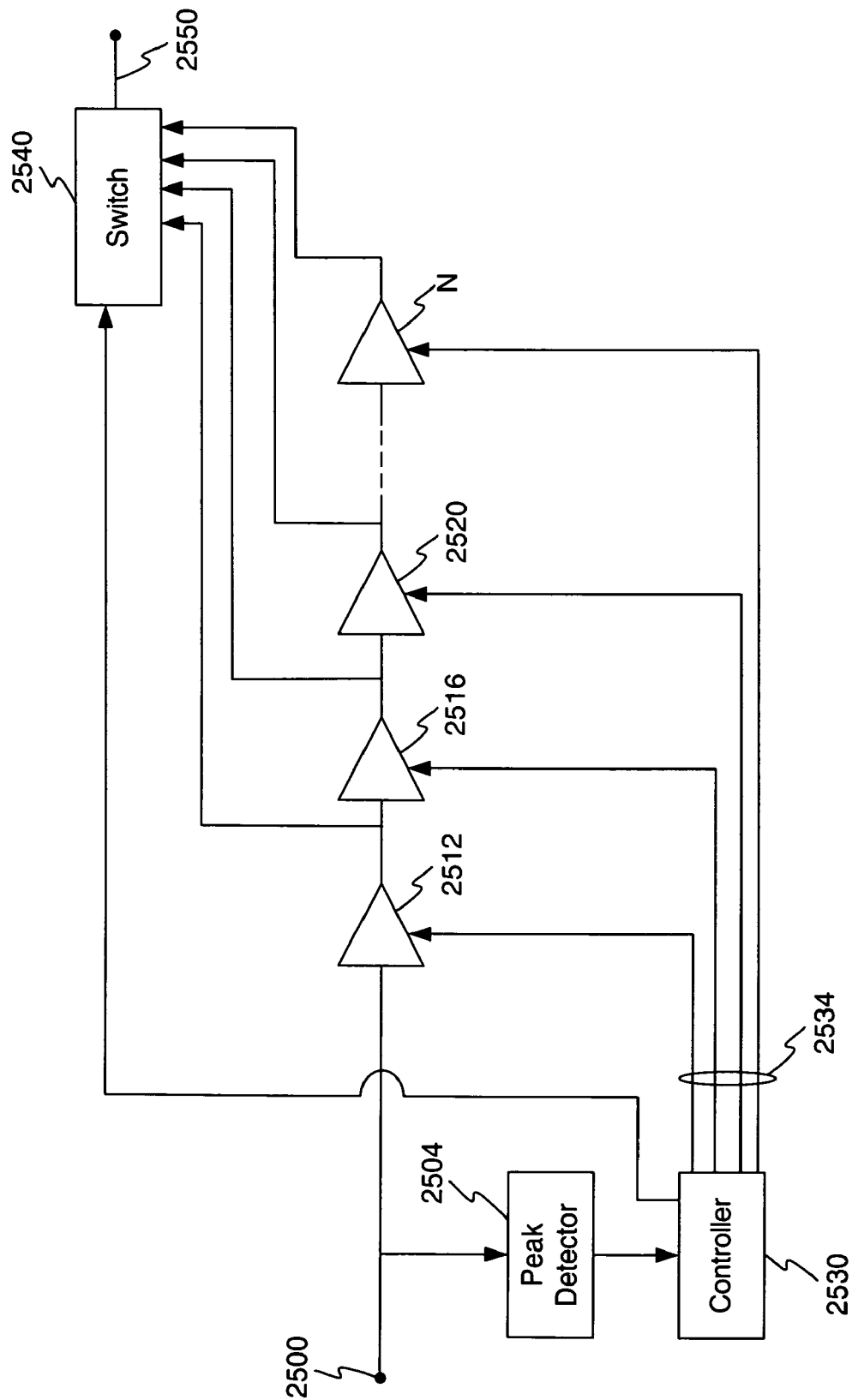
FIG. 25 illustrates a block diagram of a peak detector controlled amplifier.

FIG. 25 illustrates a block diagram of a peak detector controlled amplifier. In this embodiment, the decision device is omitted. In one example environment, this embodiment may serve as a TIA type amplifier. As shown, an input 2500 connects to a peak detector 2504 and a first amplifier 2512. The first amplifier output 2512 feeds into a second amplifier 2516, which in turn has an output that feeds into a third amplifier 2520. The amplifiers are cascaded up to an Nth amplifier N. The output of each amplifier may be connected to a switch 2540 while the peak detector 2504 feeds into a controller 2530. The controller 2530 has an output connected to at least one of the amplifiers 2512, 2516, 2520, N, and a control output to the switch 2540. The switch is configured with an output 2550. The switch 2540 has one or more inputs connected to the output of the amplifiers 2512, 2516, 2520 . . . N as shown. Via these connections, the output from one or more amplifier stages 2512, 2516, 2520 . . . N may be provided to the switch 2540.

One exemplary method of operation may be generally described as detecting the magnitude of a received signal, where the magnitude of the incoming signal may be unknown or varying over time, and amplifying the signal. It may be desired to avoid saturation or non-linear output. In particular, in one example method of operation, a signal received at input 2500 is provided with the first amplifier 2512 and the peak detector 2504. The peak detector 2504 rapidly calculates the peak value of the signal, or some other indicator of signal magnitude, and provides this information to the controller 2530.

In response to this information, the controller processes this information to generate one or more control signals that are provided to the one or more amplifiers 2512, 2516, 2520 . . . N, to the switch 2540, or both. The one or more control signals provided to the one or more amplifiers 2512, 2516, 2520 . . . N may be configured to control amplifier amplification level, bias level, operation, gain, offset or any other factor.

Based on the magnitude or common mode value of the received signal as detected by the peak detector, a control signal from the controller 2530 may be provided to the switch 2540. This control signal may control which input to the switch 2540 is provided as the switch output. In this manner, the control signal from the controller 2530 to the switch 2540 may determine which amplifier stage output is output from the switch and, as a result, based on the peak value or other signal characteristic, a variable amount of gain may be applied to the received signal.

This embodiment has numerous advantages over amplification systems of the prior art. One such advantage is that the system of FIG. 25 does not suffer from undesirably long lag or settling time caused by loop time constants or other factors. The peak detector and switch control operation may be made to occur very rapidly, such as for example within 10 bits or less, while prior art designs may take 100 or even 1000 bits to settle to a BER that meets specification.

Another advantage is that the solution proposed herein provides a low cost, accurate, and space and power efficient solution to address variable amplification to process signals that vary in magnitude over time. As compared to prior art solutions capable of performing at equivalent performance specification, the solution disclosed herein is less complex and, as a result, less expensive. For example, using the various implementation disclosed herein eliminates the need for the adjustable gain control (AGC) systems of the prior art. Thus, the method and apparatus disclosed and claimed herein increases the functionality by reducing settling time to a desired BER, yet eliminates components as compared to the prior art system.

Figure 26:
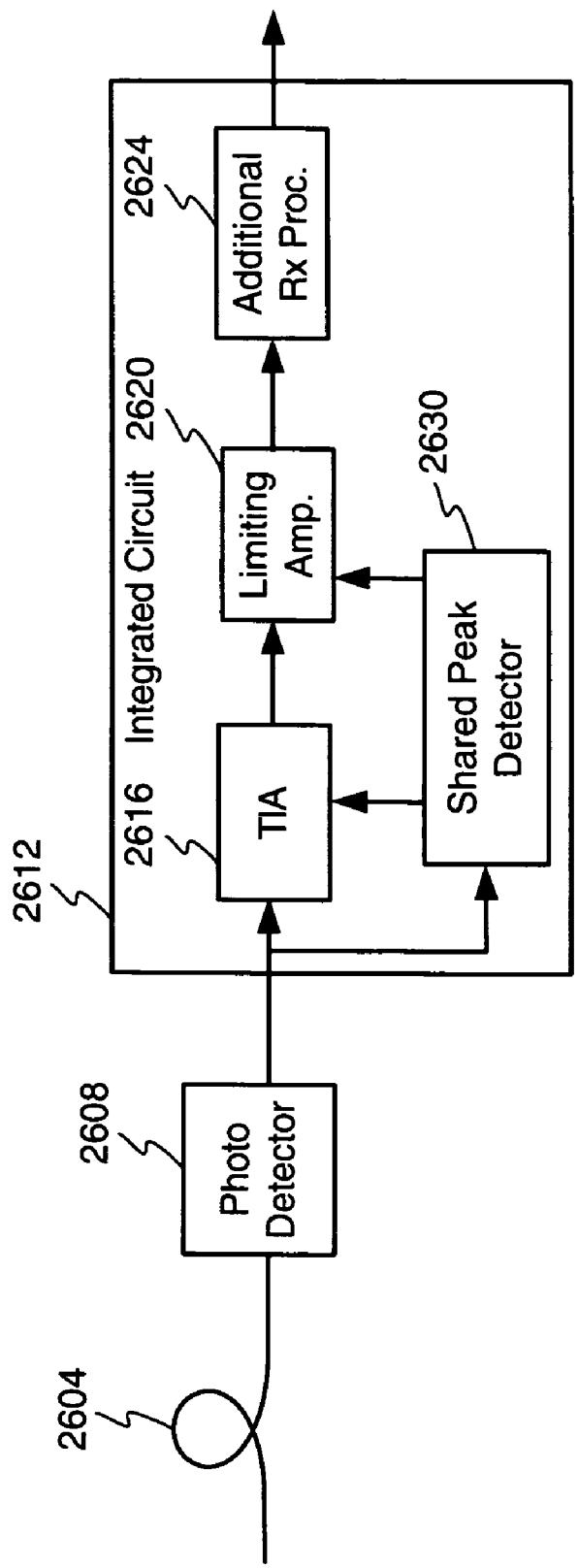
FIG. 26 illustrates a block diagram of an example embodiment of an amplifier system as disclosed herein assembled within a single integrated circuit.

FIG. 26 illustrates a block diagram of an example embodiment of an amplifier system as disclosed herein assembled within a single integrated circuit. It is contemplated that TIA and the limiting amplifier may be configured as separate elements and each may utilize a dedicated peak detector. It is further contemplated that the TIA and the limiting amplifier may be combined into a single integrated circuit 2612, as shown in FIG. 26. In such an embodiment, a channel, such as an optic fiber 2604, connects to a photo detector 2608, which in turn connects to an integrated circuit 2612.

In this embodiment the integrated circuit comprises a TIA 2616, the output of which feeds into a limiting amplifier 2620. Both the TIA 2616 and the limiting amplifier 2620 are configured to share a common peak detector 2630 as shown. The output of the limiting amplifier 2620 may be subject to additional processing in element 2624 or output from the integrated circuit 2612. A slice operation may occur within the integrated circuit 2612. Operation may occur as described above.

Figure 27:
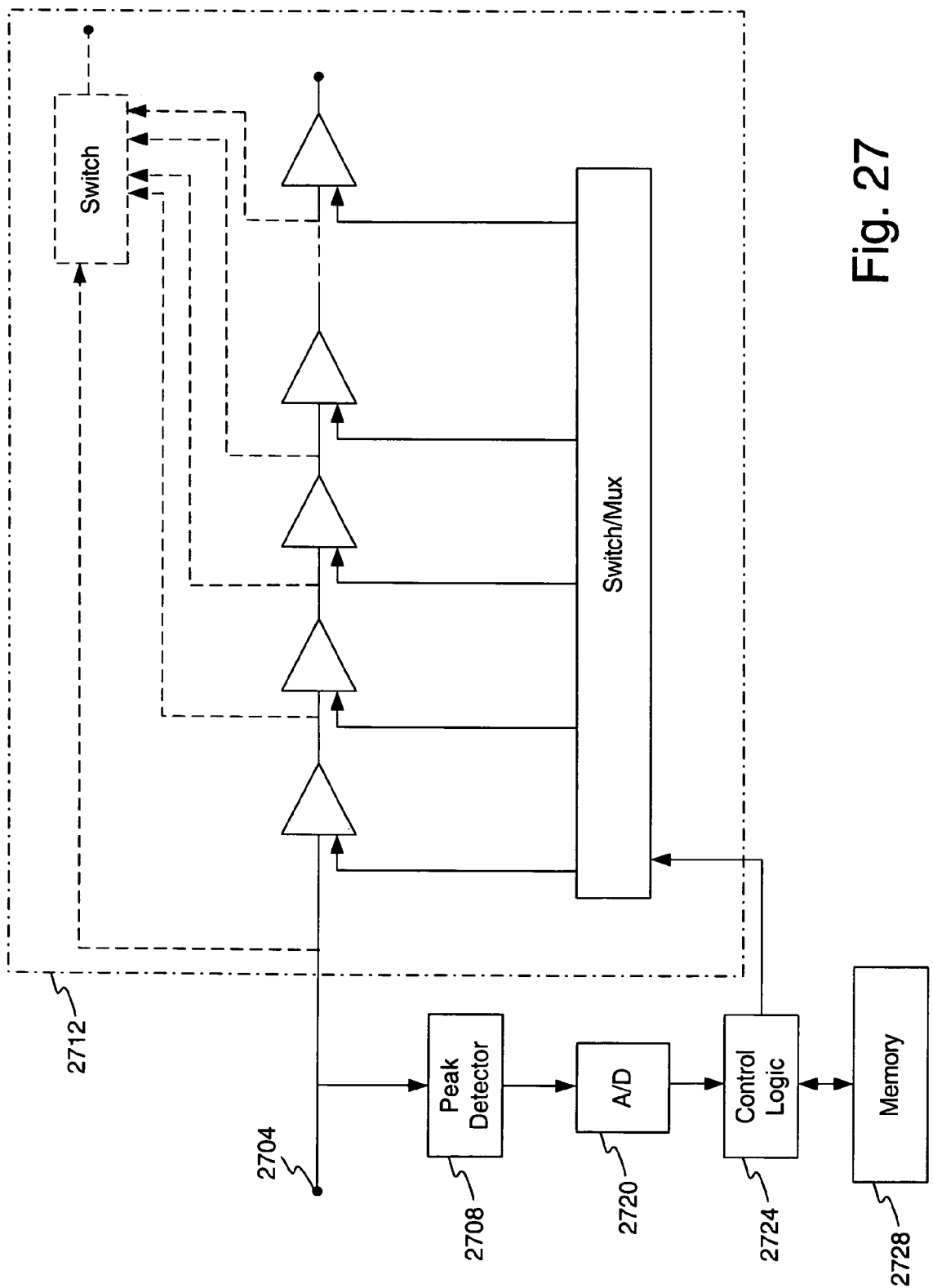
FIG. 27 illustrates a block diagram of an example embodiment of a digital implementation.

It is further contemplated that the method and apparatus disclosed herein may be implemented in either an analog or digital environment. FIG. 27 illustrates a block diagram of an example embodiment of a digital implementation. As compared to prior figures, only the aspects that differ are described in detail herein. It is contemplated that a digital implementation may be configured for operation as a limiting amplifier or a TIA.

As shown, an input 2704 connects to an amplifier module 2712 and a peak detector 2708. The output of the peak detector 2708 connects to an analog to digital (A/D) converter 2720 which is configured to convert the peak value to a digital value. Alternatively, the A/D conversion may be performed prior to the peak detection. The peak value or the digitized received signal, either of which may now be in a digital format, is provided to digital control logic 2724 that may be configured to perform a comparison to the digital value to one or more stored values or thresholds. The control may comprise a processor. Accordingly, a memory 2728 connects to the control logic 2724 and may be configured to store one or more control values or optimal slice point or amplification level data. The control logic 2724 may retrieve this information from memory and utilize this information to control the amplifier 2712. In this embodiment, the amplifier 2712 may comprise either a TIA type amplifier, as shown by the solid lined portion of the amplifier block 2712, or a limiting amplifier, as shown by the dashed line portion of the amplifier block 2712, or both.

In one embodiment, the control logic 2724 performs a look-up operation based on the detected peak value. In one embodiment, this may occur at high speed, such as with a content address memory (CAM) look-up table. In contrast to the analog embodiment which may still settle, albeit rapidly, to an optimum value, the digital implementation has the advantage of rapid, high rate acquisition of optimum settings. In particular, in one embodiment, upon detection of the power level of a received signal, the power level may be converted to a digital value and a memory look-up performed to determine the optimum settings for that particular power level. It is assumed that the optimum settings may be stored in memory. As with the other embodiments, because a feedback loop is not utilized, speed is not compromised.

Also disclosed herein is a bias circuit for burst-mode/TDM systems laser driver with power-save during burst-off and improved burst-off current control The problem addressed by this invention is saving power in the bias circuit for a laser (defined herein to mean any optic signal generator) during burst-off when the laser is basically shut-off and not transmitting. Usually burst-off time is much longer than burst-on time, so it is a very important feature that power is saved during burst-off. Reducing power dissipation is a key feature of laser drivers used in Optical Networking Units (ONU) as the ONU is located in an environment requiring extended temperature operation above that of normal telecom applications (85 deg C. maximum). As such power dissipation is a key to reducing the operating temperature and extending the life of the ONU. In addition, reduced power dissipation will help extend the battery life of an ONU when the ONU is operating from battery back-up.

The difficulty of power saving arises from the fact that it slows down the burst-on phenomenon. Another problem addressed by the invention is reducing the burst-off current coming from the modulation circuit. In addition, the number of chip pins required by the bias circuit can also be reduced from two to one by the method and apparatus discussed below thereby simplifying laser driver integration with the limiting amplifier and board design.

Various different solutions have been proposed, but do not adequately address the problem. One proposed solution is to power down the bias circuit. If the bias circuit is powered down during burst-off, a large amount power is saved. The main drawback of this solution is that it slows down the burst-on process and, as a result, makes it unsuitable for fast burst-mode applications like for example PON and time division multiplexed systems.

In some cases, bias circuit contains a loop which causes big glitches on the bias current during the time it comes out of the power down/burst-off phase. This is unacceptable for laser driver applications because can damage the laser and moreover creates significant noise on the supply which might impair the functionality of other blocks in the system.

Another proposed solution is to reduce the burst-off current from modulation circuit. During burst-off it is desirable to have a very small or zero current flowing through the laser. Modulation circuits use leakage currents or off-currents in order to improve duty-cycle distortion such that the higher the off current the better for duty cycle distortion. This current goes to the laser during burst-off which is not ideal for burst-mode applications as optical power could leak into the fiber and degrade receiver sensitivity. This problem may be referred to a contributing unwanted light pollution. This problem can be particularly acute with PON systems as there are many transmitters, and the leakage of all add up to enough power to blind the receiver in the Optical Line Terminal (OLT) to communications from a distant low power ONU.

Another proposed solution is a differential bias circuit requiring two pins. Usually the burst-mode solutions use a differential pair for bias circuit that requires two pins in order to steer all the current from the bias pin to the other pin during burst-off. It is not a convenient solution if the number of pins on a chip is limited.

All of these proposed solutions may not fully solve the problem or may create other unwanted issues.

Figure 28:
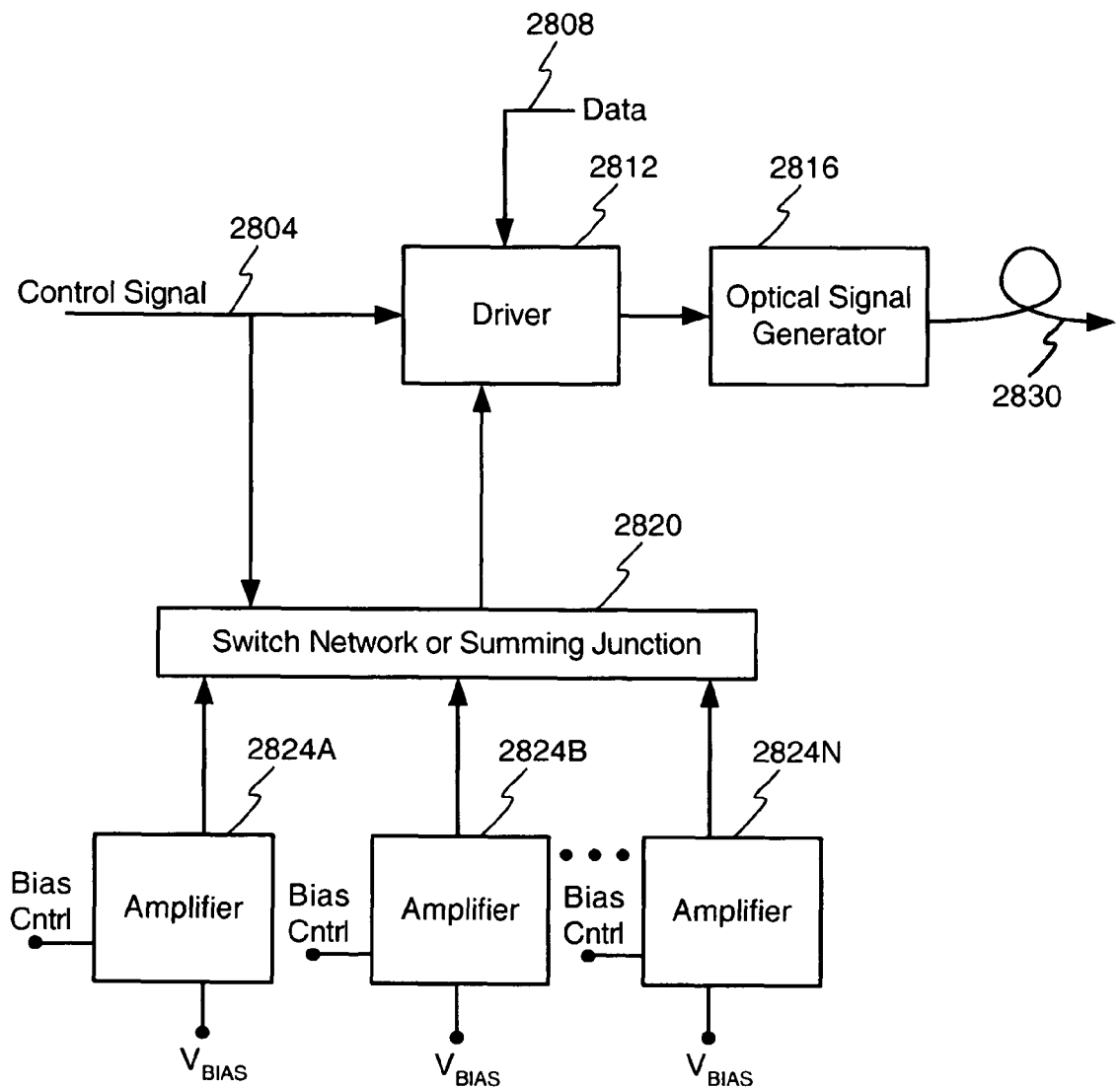
FIG. 28 illustrates a generalized block diagram of one example embodiment of a bias circuit with a power save feature.

A generalized block diagram as shown in FIG. 28 illustrates on example embodiment of one example configuration. As shown, an optic signal generator 2816 is configured to output an optic signal to a fiber 2830 or other medium configured to carry an optic signal. A driver 2812 generates a drive signal, which is input to the optic signal generator 2816 as shown. Inputs to the driver 2812 comprise a data signal on input 2808, a control signal on input 2804, and a bias signal from a switch network or summing junction 2820. As is generally understood, the data signal contains the information which is to be sent over the optic channel to a remote terminal, such as a central office.

The control signal comprises an optic signal on-off signal configured to activate the driver 2812 and the signal generator 2816 during periods when the system of FIG. 28 is authorized to transmit, such as during transmit windows. In one example environment of use, the system of FIG. 28 is enabled for use in a system that shares the fiber 2830 with multiple other transmitters. In such a configuration, each system is time multiplexed and thereby assigned a time slot during which to transmit. During other time slots, the system is silent. One such example environment comprises a passive optical network where the fiber may be shared by 12 or more transmitters. In other embodiment, any other number of transmitters may share the channel, i.e. fiber 2830.

As a result of shared channel, the driver 2812 and generator 2816 are only active for a percentage of the time. In a twelve transmitter system, the system shown in FIG. 28 would only be active for $\frac{1}{12}$ of the time. Likewise, in a 32 transmitter system, the system of FIG. 28 would only be active for $\frac{1}{32}$ of the time. Thus, the control signal 2804 is provided to enable the driver 2812 during designated transmit periods. The time periods in which the generator 2816 is transmitting may be referred to herein as transmit windows. The time periods when the optic signal generator is not transmitting may be referred to herein as the wait window. In many example environments the wait window is longer than transmit window.

In this example embodiment, the control signal is also provided to the switch network 2820 and one or more amplifiers 2842A, 2824B ... 2824N, where N is any whole number greater than or equal to one. The amplifiers 2824 are configured to generate a bias signal for the driver 2812. The bias signal may be selectively provided to the driver 2812 via the switch network 2820, or the switch network may be configured as a summing junction.

Inputs to the amplifiers 2824 also comprise a bias control signal, which may comprise the same or different signal as the control signal on input 2804, and a $V_{BIAS}$ which supplies the supply voltage to the amplifier circuit. In one embodiment the bias control input to the amplifier(s) determine whether the amplifier is enabled, and/or to what extent the amplifier is enabled. It is contemplated that certain of the amplifiers may be selectively disabled to reduce power consumption during periods when the generator 2816 is not transmitting and then selectively enabled to provide the appropriate bias level for driver 2812 and generator 2816 operation.

During operation of the example embodiment shown in FIG. 28, the control signal and bias control signals are synchronized such that during transmit windows the driver 2812 and optic signal generator 2816 are enabled for operation. Likewise, to insure proper biasing of the driver, one or more amplifiers may be enabled via the bias control input. It is contemplated that during times other than the transmit window, one or more amplifiers 2824 may be powered down or switched out of operation to reduce current consumption. Then, during the transmit window, additional amplifiers 2824 may be powered up to provide additional bias voltage or current to the driver 2812. The element 2820 may comprise a switch network which is configured to selectively switch the bias signal to the driver 2812. Element 2820 may comprises summing junction which with combines the bias signals from the amplifiers 2824, and the combined bias signal is then provided to the driver 2812.

As a result of this mode of operation, the power consumptions may be reduced during times other than the transmit window by reducing the current draw from the biasing function, namely from the driver 2812 biased by the amplifier(s) 2824. However, by leaving one or more amplifiers active during times other than the transmit window, the time to restore full biasing power is reduced and glitching or surging is minimized.

In various embodiments, the driver 2812 may comprise any type driver circuit including, but not limited to, any circuit described herein. Likewise, the optic signal generator 2816 may comprises any device described herein, a diode, laser, or any optic signal generator. The control signal and bias control signal may be generated from an upper level software process, a controller, ASIC, DSP, processor, or any other source. As discussed above, the element 2820 may comprise a switch network configured to selectively combine the amplifier outputs to the driver. The element 2820 may also comprise a summing junction. It is contemplated that element 2820 may comprise, but is not limited to any device capable of performing in the manner described herein. Finally, the amplifiers

2824 may comprise any type amplifiers including PFET or NFET type devices, bipolar junction devices (PNP or NPN), or any other type semiconductor device, and may be configured as one or more current mirrors or any other amplifier configuration.

Figure 29:
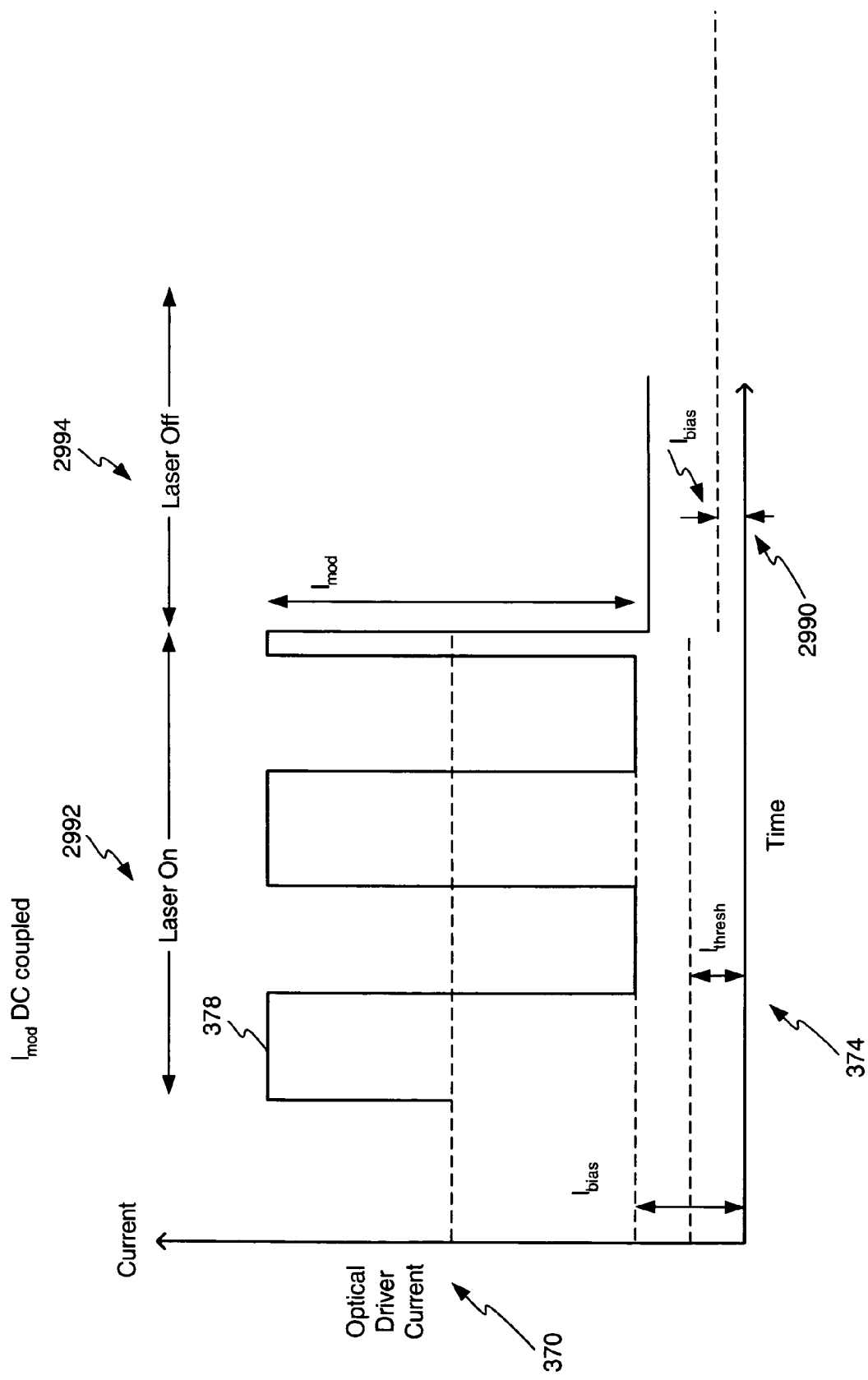
FIG. 29 illustrates an example plot of optic signal and bias current as referenced to optic driver current during laser on/off periods.

FIG. 29 illustrates an example plot of an optic signal, referenced to optic driver current shown on the horizontal axis 370. Time is shown on the horizontal axis. As compared to FIG. 3C, numerous elements are identical and as such, only the aspects that differ from FIG. 3C are discussed below. As can been seen during the transmit window 2992, during the laser on period the optical driver current 370 is generating an optic signal that is modulated to match the outgoing data, which may be coded. During this transmit window 2992, the $I_{bias}$ is set to the level as shown.

After the transmit window, at a time 2994, the laser is off and as shown, the optic signal drops to a low level, logic zero level, although the laser may not be entirely off. During this period 2994, the $I_{bias}$ value is reduced due to the method and apparatus described herein and shown in FIGS. 28 and 30. By reducing the current draw from the system during times other than the transmit window, the current draw of the circuit is reduced.

As an added benefit, because the bias level of the driver and signal generator is reduced, the light output from the laser, although at a logic level zero, during the wait window is also reduced. This provides the benefit of reducing light pollution from each transmitter connected to or providing input to the fiber, when such transmitter is off. FIG. 20, and variations to the system of FIG. 20, may be helpful in understanding this concept. If each of the devices 308 which are in a wait window contributes light pollution to the fiber, then the combined light pollution contributed to the shared fiber from the numerous wait window devices can be significant. In fact, the combined light pollution may hinder correct decision device option and decoding of the signal at a receiver when such signal is sent by a transmitter during its transmit window. By reducing the bias signal to non-transmitting device during their wait windows, the over light pollution contributed to the fiber can be significantly reduced.

In various example environments of use which care the fiber, the wait window may be several multiples of time longer than the transmit window. Thus, in a 32 device system where 32 elements share the fiber, each transmitter station transmits for 1/32 of the time and waits for the other 31 stations to transmit during the remaining time. Hence, the wait window is 31 time periods and the transmit window is 1 time period. Because of the disparity between the transmit window and the wait window, power saving and light pollution reductions achieve during the wait window are substantial and highly beneficial.

Figure 30:
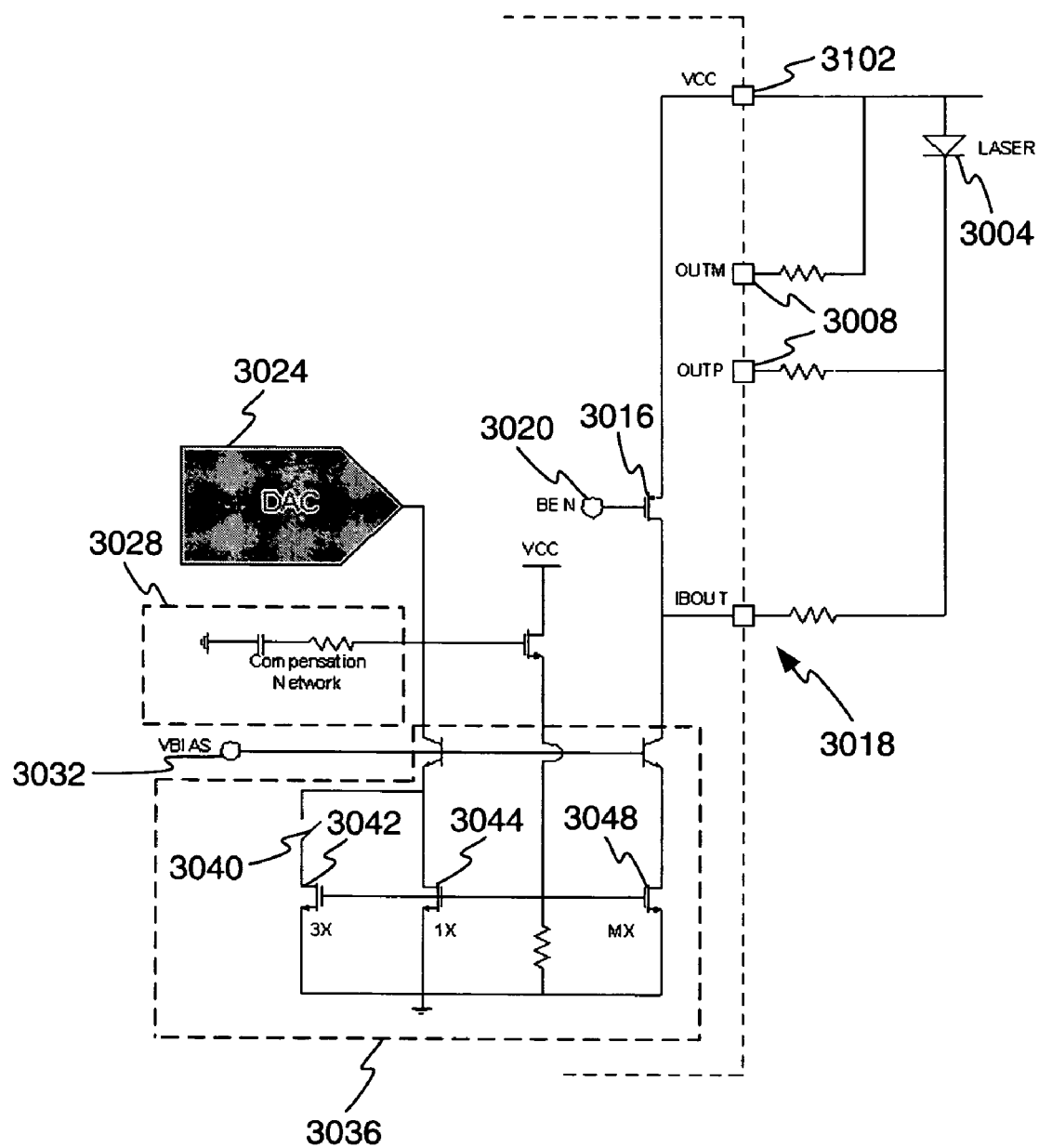
FIG. 30 illustrates an example embodiment of a bias circuit with reduced power consumption during laser off conditions.

FIG. 30 illustrates an example embodiment of a bias circuit with reduced power consumption during laser off conditions. Although this embodiment is shown in a more detailed circuit diagram, it is contemplated that the principles disclosed herein for this embodiment may be adapted to numerous other configurations and embodiment. This particular solution consists of a current mirror and PFET switch controlled by the burst-enable signal. The current mirror may be simple current mirror, cascoded, active cascaded or in any other type configuration. Other configurations are possible and hence this disclosure is not limited to this particular implementation.

The following shows one specific solution for common-anode configuration of laser. The embodiment of FIG. 30 includes a laser 3004 configured to be biased through $IB_{out}$. A differential mode input 3008 carries a data signal for transmission to an optic signal. An optic medium (not shown) is position to receive the output of the laser. A Vcc node 3012 provides a supply voltage as shown.

Bias current $IB_{out}$ is selectively controlled based on a control input signal BEN which may be referred to as a burst/transmit enable signal 3020, which is supplied to a PFET device 3016. The PFET device 3016 may be considered a control device as it controls, based on its burst/transmit enable signal, whether the laser is in transmit mode. In this embodiment the FET device 3016 acts as a switch. When the signal is active, the switch 3016 enters an open state, thereby supplying bias current $IB_{out}$ to the laser 3004. This, in turn, enables the laser 3004, such as would be desired during a transmit window. Alternatively, if a BEN signal is not active, then the switch 3016 will be closed thereby shunting bias current to Vcc.

Also shown in FIG. 30 is a bias circuit 3036 and a bias supply voltage source 3032 configured to supply $V_{bias}$. A DAC (digital to analog converter) 3024 sets or establishes the bias current level while a compensation network 3028 reduces glitching and dropouts during dynamic transitions between transmit windows and wait windows. The compensation network increases or maintains the stability of the current mirror loop. The absence or small magnitude of a glitch is basically intrinsic to this switching architecture as gates of current mirror transistors (3044 and 3048) create a capacitance and the transient response becomes slow. However, the compensation network reduces or eliminates the glitch.

As shown, the bias circuit connects to the $IB_{out}$ at node 3018 which, dependant on the state of device 3016, may bias the laser 3004 and enable optic signal generation. The bias current is established by a bias level signal from the DAC 3024. The DAC 3024 may receive a digital signal reflecting the biasing level, which in turn is converted to an analog signal for use by the bias circuit 3036. In this example embodiment, the compensation network 3028 comprises a resistor in series with a capacitor and its operation would be understood by one or ordinary skill in the art.

DAC 3024 can be any current source generator without limiting the scope and purpose of the invention. This example embodiment the bias circuit 3036 comprises a current mirror configuration shown with a reference device MX 3048 in a reference leg and two or more opposing devices, namely fixed device 1X 3044 and switch device 3X 3042. A switch 3040 is also configured in series with switched device 3x 3042 as shown. The switched device 3042 and the fixed device 3044 are configured in parallel. Operation of a current mirror is generally understood by one of ordinary skill in the art and is not described herein in detail.

As configured herein, the current mirror is ratioed based on the ratio of MX device 3048 and the devices 3042 and 3044. When the switch 3040 is closed, the ratio between devices 3048 and 3044, 3042 is (3X+1X):MX. When the switch 3040 is open, then the ratio is 1X:MX. The value M may comprise any whole number. As can be appreciated, the switch position determines the ratio of the current mirror, which in turn determines the current draw of the current mirror and the biasing current provided to node 3018. The switch is controlled by a switch control signal which may be the same as or related to the burst/transmit enable signal BEN 3020. Vcc supplies the supply voltage to the bias circuit 3036 as shown. During transmit windows, the switch is open. During wait windows, when the laser is not transmitting, the switch is closed.

As discussed herein, one benefit of the method and apparatus disclosed herein is that instead of requiring multiple output pins from the integrated circuit as found prior art system, this method and apparatus requires only a single pin to bias the laser 3004. In reference to FIG. 30, prior art embodiments required an integrated circuit pin for supply voltage or power supply and an integrated circuit pin for bias current $IB_{out}$. In contrast, in at least one embodiment of this invention, the supply voltage is provided to the bias circuit through device 3016, which steers the current to the biasing circuit. Thus power is supplied internally, as opposed to prior art designs which were externally powered via an additional pin. This design eliminates the need for a separate and dedicated power supply pin. In this particular embodiment shown in FIG. 30, the dashed line passing though nodes 3102, 3008, and node 3018 defines the boundary between the biasing and modulation block (integrated circuit and the laser 3004. As can be seen, bias current $IB_{out}$ at node 3018 is thus the only required pin. In space limited environments where integrated circuit pins are already at a premium for input/output functions, embodiments which reduce required pin counts provide an advantage over the prior art.

In various other embodiments the bias circuit may comprise other configurations than a current mirror. If configured is a current mirror, the switch 3040 may be located at any position in the mirror which will selectively modify the ratio of the mirror. Any number of switches 3040 may be utilized. In addition, any number of different parallel connected legs to the current mirror, such as device 3042, may be connected and selectively switched into and out of the circuit to selectively modify the ratio or current draw.

The architecture can also be applied for common-cathode configuration of the laser. The FETs and BJTs in the bias circuit 3036 are interchangeable, i.e., so we can have all BJT or all FET solution, or any combination thereof. Other type semiconductor devices may be utilized in various different embodiments. Other circuit topologies can be used for the bias generator (simple mirror, cascoded, active cascaded or any other configuration) in various different embodiments.

In this embodiment the high-impedance single-ended output of the current mirror in the bias circuit 3036 goes to laser 3004 as the bias current output. The PFET switch 3016 is turned off during normal operation (burst-on). During burst-off the PFET switch 3016 is on, so it steers all the output current to the VCC. At the same time it also steers away any off or leakage current coming out of the modulation block from modulation output pin (also connected to the laser) thereby making sure that laser is off. The modulation block generates data current for the laser through outm and outp pins. In FIG. 28, element 2812 is the modulation block. In FIG. 30, the burst enable signal, in connection with bias current via node 3018 and the inputs on nodes 3008 force the laser one and modulating the outgoing data into an optic signal.

During burst on mode, i.e. during the transmit window, the burst/transmit enable signal (BEN) 3020 is active at PFET switch 3016 which cause the PFET switch to open thereby routing the bias signal to node 3018. Likewise, during burst/transmit enable, i.e. during the transmit window, the switch 3040 is open thereby setting the bias current to a higher level, namely ratioed at a MX:1X.

During burst off mode, i.e. during the wait window, the burst/transmit enable signal 3020 is not active at PFET switch 3016 which causes the PFET switch to close thereby routing the bias signal to Vcc. Likewise, during burst off mode, i.e. during the wait window, the switch 3040 is closed thereby setting the bias current to a lower level, namely ratioed at a MX:4X which saves power.

Stated another way, during burst-on the gain of the current mirror 3036 is M:1. During burst-off it is possible to reduce the gain to M:(3+1) or M:4. With input current to the mirror 3036 from DAC 3024 remaining the same, it means that power consumption during burst-off is now approximately ¼ of that of burst-on case. In other embodiments, other ratios and resulting power saving may be enabled. On the other hand, the burst-on and off times remain fast enough for the different system specifications because of the way that the mirroring ratio is chosen. The architecture can be used for more/less power saving with different burst-on/off times for different applications. Any ratio between on and off current can be used and should be selected in such a way to satisfy the burst-on requirements of the system. The laser 3004 may optionally be a low power laser. The laser 3004 may be used in a burst mode PON system. PON may comprise passive optical network.

This solution has the following advantages. First, this solution realizes power savings during burst-off with fast burst-on/off times. This is significant because in certain applications the duration of the burst off period (wait window) is many times greater than the burst transmit period (transmit window).

Another advantage is that the burst-on and off processes do not produce any glitch on the bias output current. Glitching is reduced or eliminated by the compensation network 3028. Glitching is also reduced or eliminated by leaving the biasing circuit 3036 active and enabled during burst off periods, although at a lower power rating.

Yet another advantage as discussed above is that the method and apparatus disclosed herein reduces and/or eliminates modulation off-current flowing through laser during burst-off. This provides the advantage of reducing light pollution contributed by lasers during burst off periods (wait windows).

In addition, this method and apparatus provides single-ended operation for bias circuit which requires one less pin than the existing burst-mode/TDM (time division multiplexed) solutions. In crowded circuit and board layouts this provides benefits that are substantial.

While various embodiments of the invention have been described, it will be apparent to those of ordinary skill in the art that many more embodiments and implementations are possible that are within the scope of this invention. Any of the features described herein may be combined in any combination or may be configured alone.

The invention claimed is:

1. An optic signal generator driver comprising:
   a driver configured to receive an outgoing signal and a bias signal, and responsive to a burst/transmit enable signal, generate an drive signal representing the outgoing signal;
   a bias circuit configured to generate the bias signal comprising:
     a current mirror with two or more current mirror legs, at least one of which is configured to be selectively switched into or out of operation and at least one of which not switched out of operation responsive to the burst/transmit enable signal and is therefore continually providing bias current to the driver;
     a current mirror switch responsive to a switch control signal configured to selectively switch one or more current mirror legs into or out of operation, wherein the switch control signal is related to the burst/transmit enable signal.

2. The driver of claim 1, wherein the switch control signal opens the current mirror switch when the burst/transmit enable signal is present.

3. The driver of claim 1, wherein the current mirror comprises a reference leg, a fixed leg, and a switch leg.

4. The driver of claim 1, further comprising a compensation network to reduce glitching.

5. The driver of claim 1, further comprising a burst/transmit enable switch responsive to the burst/transmit enable signal.

6. The driver of claim 1, wherein the outgoing signal comprises a differential mode signal.

7. The driver of claim 1, wherein switching one or more current mirror legs out of operation reduces power consumption during wait windows.

8. The driver of claim 1, further comprising an internal connection to a supply voltage for the bias circuit, wherein the supply voltage is obtained internally and is not supplied from an external source via a dedicated bias circuit supply voltage input integrated circuit pin.

9. A optic signal transmitter comprising:
- an optic signal generator configured to receive a bias signal and an outgoing signal and convert the outgoing signal to an optic signal;
- a control device, responsive to a burst/transmit enable signal, configured to enable and disable generation of the optic signal;
- a biasing circuit configured as a current mirror to generate the bias signal comprising:
  - a reference leg having a reference device;
  - a first leg having a first device, wherein the first device is configured to generate and provide a first bias current to the optic signal generator regardless of the status of the burst/transmit enable signal to thereby continually maintain bias current to the optic signal generator;
  - a second leg having second device and a current mirror switch, the second device configured to generate a second bias current, wherein the current mirror switch is responsive to a burst/transmit enable signal, or a signal related thereto, to selectively enable and disable generation of the second bias current.

10. The transmitter of claim 9, wherein the control device comprises a burst/transmit enable switch.

11. The transmitter of claim 10, wherein the burst/transmit enable switch comprises a PFET.

12. The transmitter of claim 9, wherein when the current mirror switch is open a current draw ratio of the first device and the second device to the reference device is 1:M and when the current mirror switch is closed the current draw ratio of the first device and the second device to the reference device is 4:M, where the value M is related to the referenced device.

13. The transmitter of claim 9, wherein the bias circuit further comprises a compensation network configured to provide compensation during low voltage or low current situations.

14. The transmitter of claim 9, wherein the transmitter further comprises a bias node connected to the bias circuit and the control device, such that a current supplied to the bias node is less when the current mirror switch is closed than when the current mirror switch is open.

15. An optic signal generator driver comprising:
- a modulation block configured to receive an outgoing signal and a bias signal, and responsive to a burst/transmit enable signal, force an optic signal generator to generate an outgoing optic signal;
- a bias circuit powered from an internal power supply via a burst enable switch, and utilizing a single pin to output a bias current to an optic signal generator, the bias circuit comprising:
  - a current mirror with two or more current mirror legs, at least one of which is a switched current mirror leg configured to be selectively switched into or out of operation and at least one of which is a non-switched current mirror leg and constantly operates to provide bias current;
  - a current mirror switch responsive to a switch control signal configured to selectively switch at least one of the two or more current mirror legs into or out of operation, wherein the switch control signal is related to the burst/transmit enable signal.

16. The driver of claim 15, wherein the switch control signal opens the current mirror switch when the burst/transmit enable signal is present.

17. The driver of claim 15, further comprising a compensation network to reduce glitching.

18. The driver of claim 15, wherein switching at least one of the two or more current mirror legs out of operation reduces power consumption during wait windows.

* * * * *